(12) United States Patent
George et al.

(10) Patent No.: US 11,922,274 B1
(45) Date of Patent: Mar. 5, 2024

(54) QUANTUM DOT DEVICES WITH SIDE AND CENTER SCREENING GATES

(71) Applicant: Intel Corporation, Santa Clara, CA (US)

(72) Inventors: Hubert C. George, Portland, OR (US); James S. Clarke, Portland, OR (US); Ravi Pillarisetty, Portland, OR (US); Brennen Karl Mueller, Portland, OR (US); Stephanie A. Bojarski, Beaverton, OR (US); Eric M. Henry, Forest Grove, OR (US); Roza Kotlyar, Portland, OR (US); Thomas Francis Watson, Portland, OR (US); Lester Lampert, Portland, OR (US); Samuel Frederick Neyens, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 17/323,487

(22) Filed: May 18, 2021

(51) Int. Cl.
*G06N 10/00* (2022.01)
*H01L 29/775* (2006.01)
(Continued)

(52) U.S. Cl.
CPC ........... *G06N 10/00* (2019.01); *H01L 27/088* (2013.01); *H01L 29/122* (2013.01); *H01L 29/775* (2013.01)

(58) Field of Classification Search
CPC ..... G06N 10/00; H01L 27/088; H01L 29/122; H01L 29/775; H01L 29/7782;
(Continued)

(56) References Cited

U.S. PATENT DOCUMENTS

| 6,333,516 B1 | 12/2001 | Katoh et al. |
| 2012/0074386 A1 | 3/2012 | Rachmady et al. |

(Continued)

FOREIGN PATENT DOCUMENTS

WO  2018143986 A1  8/2018

OTHER PUBLICATIONS

U.S. Appl. No. 16/328,615, filed Feb. 26, 2019, Quantum Dot Array Devices With Shared Gates.
(Continued)

*Primary Examiner* — Mohammad A Rahman
(74) *Attorney, Agent, or Firm* — Akona IP PC

(57) ABSTRACT

Quantum dot devices with three of more accumulation gates provided over a single row of a quantum dot formation region are disclosed. Each accumulation gate is electrically coupled to a respective doped region. In this manner, multiple single electron transistors (SETs) are provided along the row. Side and/or center screening gates may be used to apply microwave pulses for qubit control and to control electrostatics so that source and drain regions of the multiple SETs with quantum dots formed along the single row of a quantum dot formation region are sufficiently isolated from one another. Such quantum dot devices provide strong spatial localization of the quantum dots, good control over quantum dot interactions and manipulation, good scalability in the number of quantum dots included in the device, and/or design flexibility in making electrical connections to the quantum dot devices to integrate the quantum dot devices in larger computing devices.

20 Claims, 29 Drawing Sheets

(51) Int. Cl.
    *H01L 29/12* (2006.01)
    *H01L 27/088* (2006.01)
(58) Field of Classification Search
    CPC ......... H01L 21/3212; H01L 21/823468; H01L
        29/165; H01L 29/6656; H01L 29/7613;
        H01L 29/82; H01L 29/401; H01L 29/423;
        H01L 29/42376; H01L 29/66439; H01L
        29/66977; H01L 29/127; H01L 29/0673;
        H01L 29/778; H01L 31/035209; H01L
        31/035218; H01L 31/035227; H01L
        31/035236; H01L 29/125; H01L 33/06;
        H01L 51/502; H01L 33/504; H01L
        2933/0041; H01L 2933/005; H01L
        2933/0025; H01L 21/02603; H01L
        29/42392; H01L 29/0665; H01L 29/0669;
        H01L 49/006; B82Y 10/00; B82Y 40/00
    See application file for complete search history.

(56) References Cited

U.S. PATENT DOCUMENTS

| | | | |
|---|---|---|---|
| 2013/0264617 A1 | 10/2013 | Joshi et al. | |
| 2019/0043950 A1 | 2/2019 | George et al. | |
| 2020/0144400 A1* | 5/2020 | George | H01L 29/66439 |

OTHER PUBLICATIONS

U.S. Appl. No. 16/320,153, filed Jan. 24, 2019, Independent Double-Gate Quantum Dot Qubits.
U.S. Appl. No. 16/328,670, filed Feb. 26, 2019, Qubit-Detector Die Assemblies.
U.S. Appl. No. 16/329,706, filed Feb. 28, 2019, Single Electron Transistors (SETs) and Set-Based Qubit-Detector Arrangements.
"A Nanodamascene Process for Advanced Single-Electron Transistor Fabrication," Dubuc et al., IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Fast sensing of double-dot charge arrangement and spin state with an rf sensor quantum dot," Barthel et al., Materials Department, University of California, Santa Barbara, Jan. 16, 2014, 4 pages.
"Undoped accumulation-mode Si/SiGe quantum dots," Borselli et al., HRL Laboratories, LLC., Jul. 15, 2014, 4 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al., IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al., Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Published Nov. 5, 2010, 3 pages.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Embracing the quantum limit in silicon computing," Morton et al., Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Defect reduction of selective Ge epitaxy in trenches on Si(001) substrates using aspect ratio trapping," Park et al., Applied Physics Letter 90, 052113 (2007), pp. 052113-1 through 052113-3.
"Photon- and phonon-assisted tunneling in the three-dimensional charge stability diagram of a triple quantum dot array," Braakman et al., Applied Physics Letters 102, 112110 (2013), pp. 112110-1 through 112110-4 (5 pages with cover sheet).
"Radio frequency measurements of tunnel couplings and singlet-triplet spin states in Si:P quantum dots," House et al., Nature Communications, 6:884, DOI: 10.1038/ncomms 9848, Nov. 9, 2015, pp. 1-6.
"Detecting bit-flip errors in a logical qubit using stabilizer measurements," Riste et al., Nature Communications, 6:6983, DOI: 10.1038/ncomms7983, Apr. 29, 2015, pp. 1-6.
"Scalable gate architecture for densely packed semiconductor spin qubits," Zajac et al., Department of Physics, Princeton University; Sandia National Laboratories, retrieved [cond-mat.mes-hall] Jul. 24, 2016, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 113104-3.
"Single-shot read-out of an individual electron spin in a quantum dot," Elzerman et al., Nature, vol. 430, Jul. 22, 2004, pp. 431-435.
"An addressable quantum dot qubit with fault-tolerant control-fidelity," Veldhorst et al., Nature Nanotechnology vol. 9, Dec. 2014, pp. 981-985.

* cited by examiner

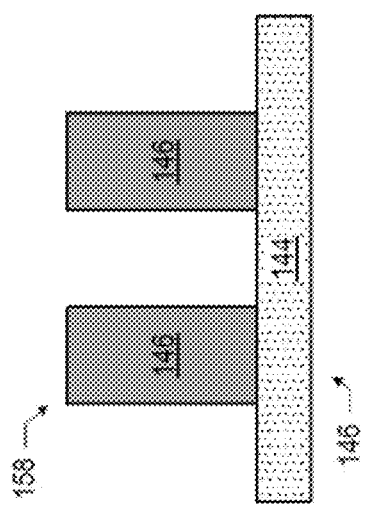
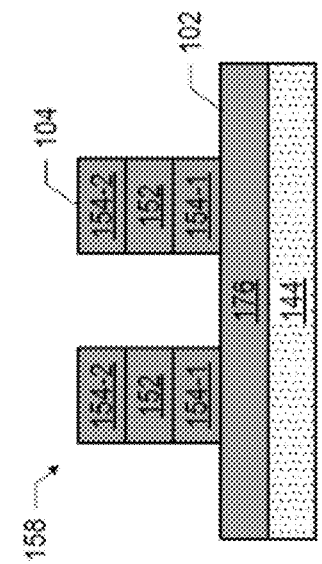
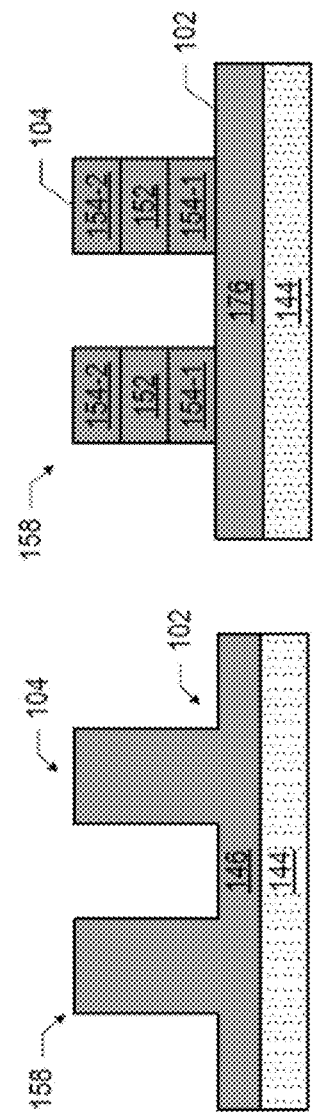

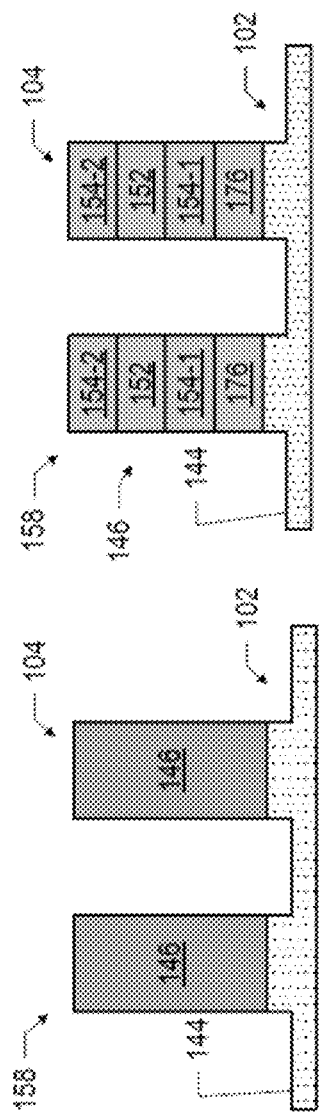
FIG. 16
FIG. 17
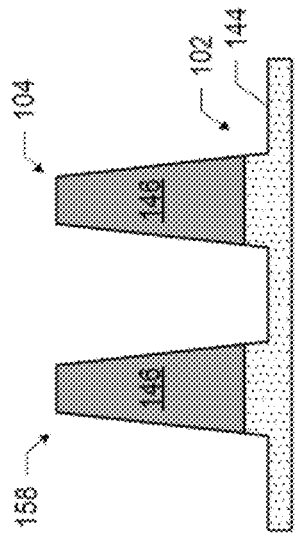
FIG. 18
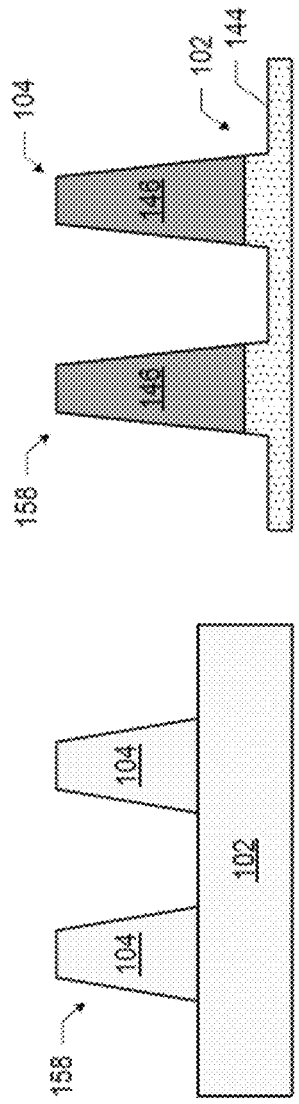
FIG. 19

QUANTUM DOT DEVICES WITH SIDE AND CENTER SCREENING GATES

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 13-19 illustrate example base/fin arrangements that may be used in a quantum dot device with fins, in accordance with various embodiments.

DETAILED DESCRIPTION

Overview

Figure 1:
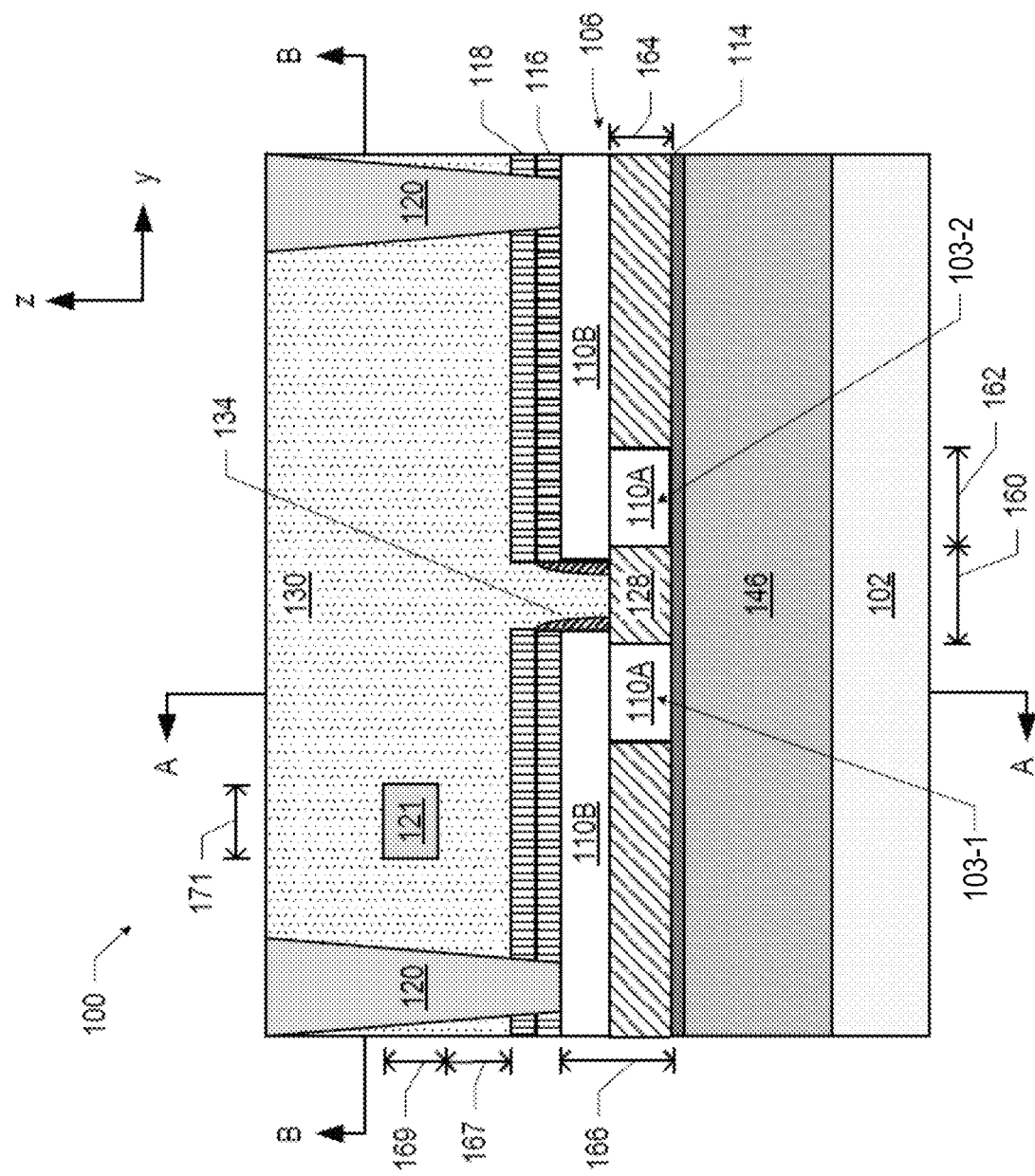
FIGS. 1-4 are cross-sectional views of an example quantum dot device with trenches, in accordance with various embodiments.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating quantum dot devices with additional read accumulation gates and with side and center screening gates, proposed herein, it might be useful to first understand phenomena that may come into play in quantum computing systems. The following foundational information may be viewed as a basis from which the present disclosure may be properly explained. Such information is offered for purposes of explanation only and, accordingly, should not be construed in any way to limit the broad scope of the present disclosure and its potential applications.

As briefly described above, quantum computing, or quantum information processing, refers to the field of research related to computation systems that use quantum-mechanical phenomena to store and manipulate data. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. The principle of quantum superposition asserts that any two or more quantum states can be added together, i.e., superposed, to produce another valid quantum state, and that any quantum state can be represented as a sum of two or more other distinct states. Quantum entanglement is another example of a unique quantum-mechanical phenomenon. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits are represented by a superposition of $2^N$ quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e., by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e., computers that use phenomena of classical physics).

Another challenge that is unique to quantum computers and does not arise in classical computers resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence.

The foregoing illustrates that the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include, e.g., semiconducting qubits including those that rely on formation of quantum dots (e.g., spin qubits and charge qubits), superconducting qubits (e.g., flux qubits or transmon qubits, the latter sometimes simply referred to as "transmons"), photon polarization qubits, single trapped ion qubits, etc. Devices implementing quantum dot qubits (referred to herein as "quantum dot devices") are particularly promising for large-scale qubit implementation.

In general, quantum dot devices enable formation of quantum dots to serve as quantum bits (i.e., as qubits) in a quantum computing device, as well as the control of these quantum dots to perform quantum logic operations. To that end, quantum dot devices implement multiple terminals, such as gate terminals of various types of gates (e.g., barrier gates, plunger gates, and accumulation gates) as well as terminals for making electrical contact with doped regions of a semiconductor material (which may be referred to as "source terminals" and "drain terminals"). DC bias control signals and alternating current (AC) pulses applied to various terminals may be used to control formation of quantum dots in such devices. Single electron transistor (SET) detectors, provided proximate to quantum dot qubits, may then be used to detect states of various qubits. Typically, quantum dot devices include a first row of a quantum dot formation region (i.e., a row in which quantum dots may be formed) for forming quantum dots of various qubits, and a second row of a quantum dot formation region for forming quantum dots that are a part of a SET detector corresponding to the qubits of the first row. In conventional quantum dot devices, a single SET based on quantum dots formed along the second row is used to detect states of the quantum dots of multiple qubits of the first row. In such an arrangement, a first and a second accumulation gates are provided over the opposite ends of the second row, adjacent and electrically coupled to, respectively, a first and a second doped regions. One of the first and second doped regions serves as a source region of the SET and the other one serves as a drain region of the SET. In contrast to such conventional implementations, quantum dot devices disclosed herein include one or more additional accumulation gates (thus, a total of three or more accumulation gates provided over a single row of a quantum dot formation region), each accumulation gate being adjacent and electrically coupled to a respective (i.e., different) doped region, thus forming multiple SETs based on the quantum dots formed along the second row. In such devices, side and/or center screening gates (i.e., one or more side screening gates or one or more central screening gates, or both one or more side screening gates and one or more central screening gates) may be coupled to respective signal sources (e.g., voltage sources) and may be used to apply microwave pulses for qubit control and/or to control electrostatics so that source and drain regions of multiple SETs with quantum dots formed along the single row of a quantum dot formation region are sufficiently isolated from one another. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. In particular, by implementing side and/or center screening gates and additional read accumulation gates in a manner that allows independent control of these gates, great flexibility over qubit control and readout may be achieved.

In various embodiments, quantum dot devices with additional read accumulation gates and with side and center screening gates as described herein may be implemented as components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g., quantum processors, quantum amplifiers, quantum sensors, etc., depending on the components associated with the IC. The IC may be employed as part of a chipset for executing one or more related functions in a quantum system.

In order to provide substantially lossless connectivity to, from, and between the qubits, some or all of the electrically conductive portions of quantum circuit assemblies described herein, in particular various gates and conductive vias described herein, as well as other components of quantum circuits, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, such as e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide. The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Furthermore, as used herein, terms indicating what may be considered an idealized behavior, such as e.g., "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious two-level systems (TLSs) may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation.

Operations described may be performed in a different order from the described embodiment. Various additional operations may be performed, and/or described operations may be omitted in additional embodiments.

Quantum Dot Formation Regions of Quantum Dot Devices

Quantum dot devices enable formation of quantum dots to serve as quantum bits (i.e., as qubits) in a quantum computing device, as well as formation of quantum dots to serve as a part of one or more SETs for reading/detecting states of said qubits. In particular, quantum dot devices described herein include rows of quantum dot formation regions—at least one row being a row of a quantum dot formation region where quantum dots for serving as qubits are formed, and at least one other row being a row of a quantum dot formation region where quantum dots for serving as a part of one or more SETs are formed.

In various embodiments, rows of quantum dot formation regions may be formed in different manners. In a first embodiment (where a quantum dot device may be referred to as a trench-based device), a row of a quantum dot formation region may be defined by an insulating material provided over a continuous quantum well stack, the insulating material including a trench corresponding to the row (i.e., multiple trenches if there are multiple rows of quantum dot formation regions), the trench extending toward the continuous quantum well stack, and portions of gate metals of different gates being at least partially in the trench. In such an embodiment, even though the quantum well stack is continuous along a portion of a plane, i.e., continuous in a two-dimensional plane, confinement of the quantum dot formation region to a row (i.e., confinement of the quantum dots formed in a region that is a row), i.e., confinement to substantially one direction, is achieved by the confinement to substantially one direction of the trench in the insulating material, the trench at least partially filled with one or more gate metals. Such embodiments are described below with reference to FIGS. 1-4. In a second embodiment (where a quantum dot device may be referred to as a fin-based device), a row of a quantum dot formation region may be defined by at least a portion of a quantum well stack being formed as a fin corresponding to the row (i.e., multiple fins if there are multiple rows of quantum dot formation regions), and portions of gate metals of different gates being over the fin. In such an embodiment, confinement of the quantum dot formation region to a row is achieved by the confining the quantum well stack to the fin. Thus, in contrast to the second embodiment, at least portions of the quantum well stack may not be horizontally continuous across different fins. Such embodiments are described below with reference to FIGS. 10-12. In various embodiments, the quantum dot devices disclosed herein may provide two-dimensional arrays of quantum dots (e.g., quantum dots 142) during operation, with the quantum dots constrained in "rows" by the quantum dot formation regions (e.g., quantum dot formation regions 111) and "columns" by the gates (e.g., gates 106/108), as discussed below. In some embodiments, individual ones of the gates (e.g., of the gates 106/108) may be shared between multiple quantum dot formation regions. Quantum dot devices that include three or more accumulation gates provided over a single row of a quantum dot formation region, and that include side and center screening gates as described herein may be implemented with said row of quantum dot formation regions defined by either one of these two embodiments.

Example Quantum Dot Devices with Trenches

One type of quantum dot devices includes devices having a base, a continuous quantum well layer extending over the base, an insulating material over the quantum well layer, one or more trenches in the insulating material, and one or more gates with gate metals at least partially disposed in the trenches. In such devices, the quantum well layer is not etched into fins, as in fin-based devices. A quantum dot formed in such a device may be constrained in the x-direction by the one or more gates, in the y-direction by the trench, and in the z-direction by the quantum well layer, as discussed in detail herein. Unlike previous approaches to quantum dot formation and manipulation, quantum dot devices with trenches provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this type of a quantum dot device is described as a first example quantum dot device in which side and center screening gates as described herein may be implemented.

Figure 2:
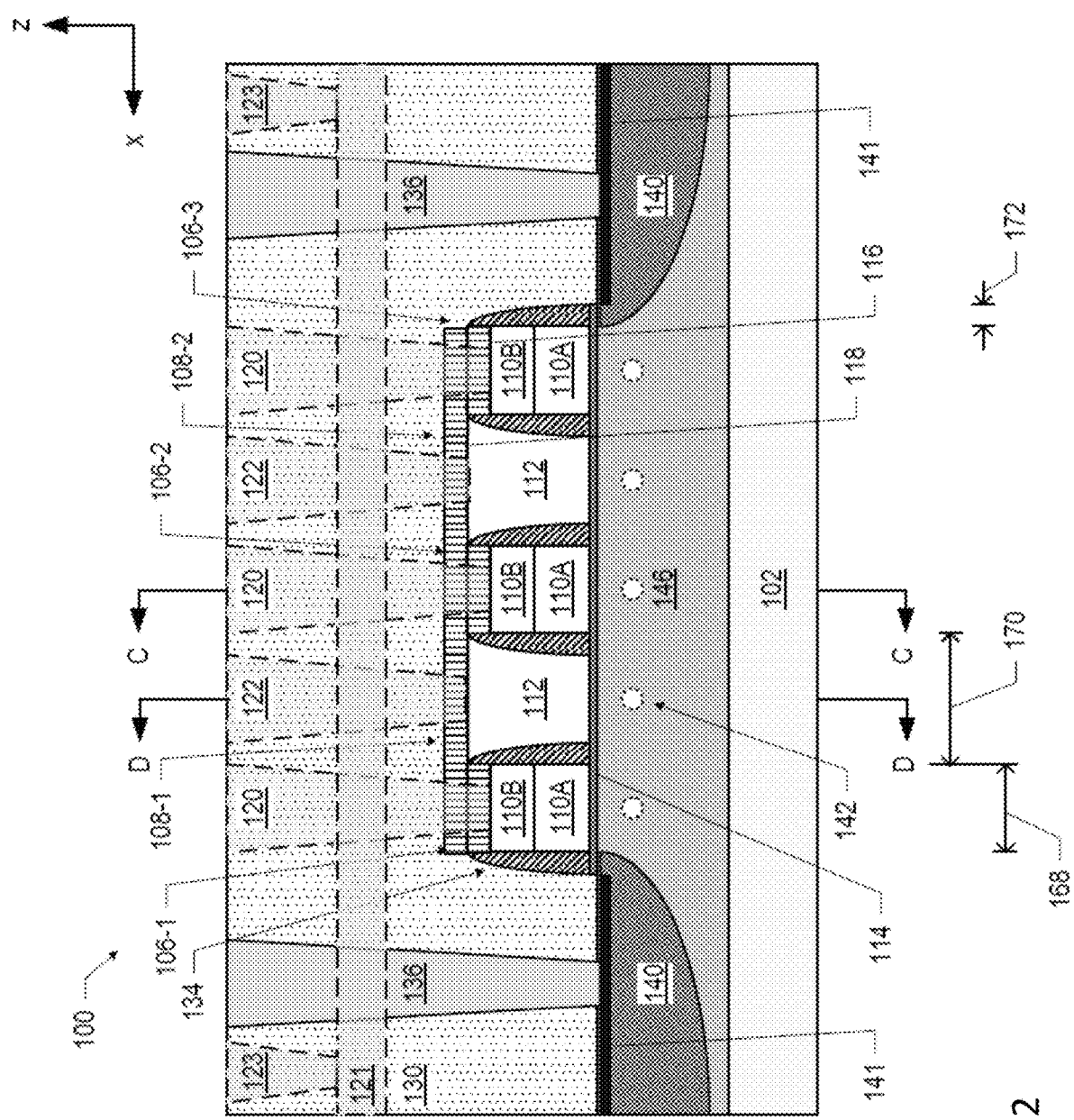
Figure 3:
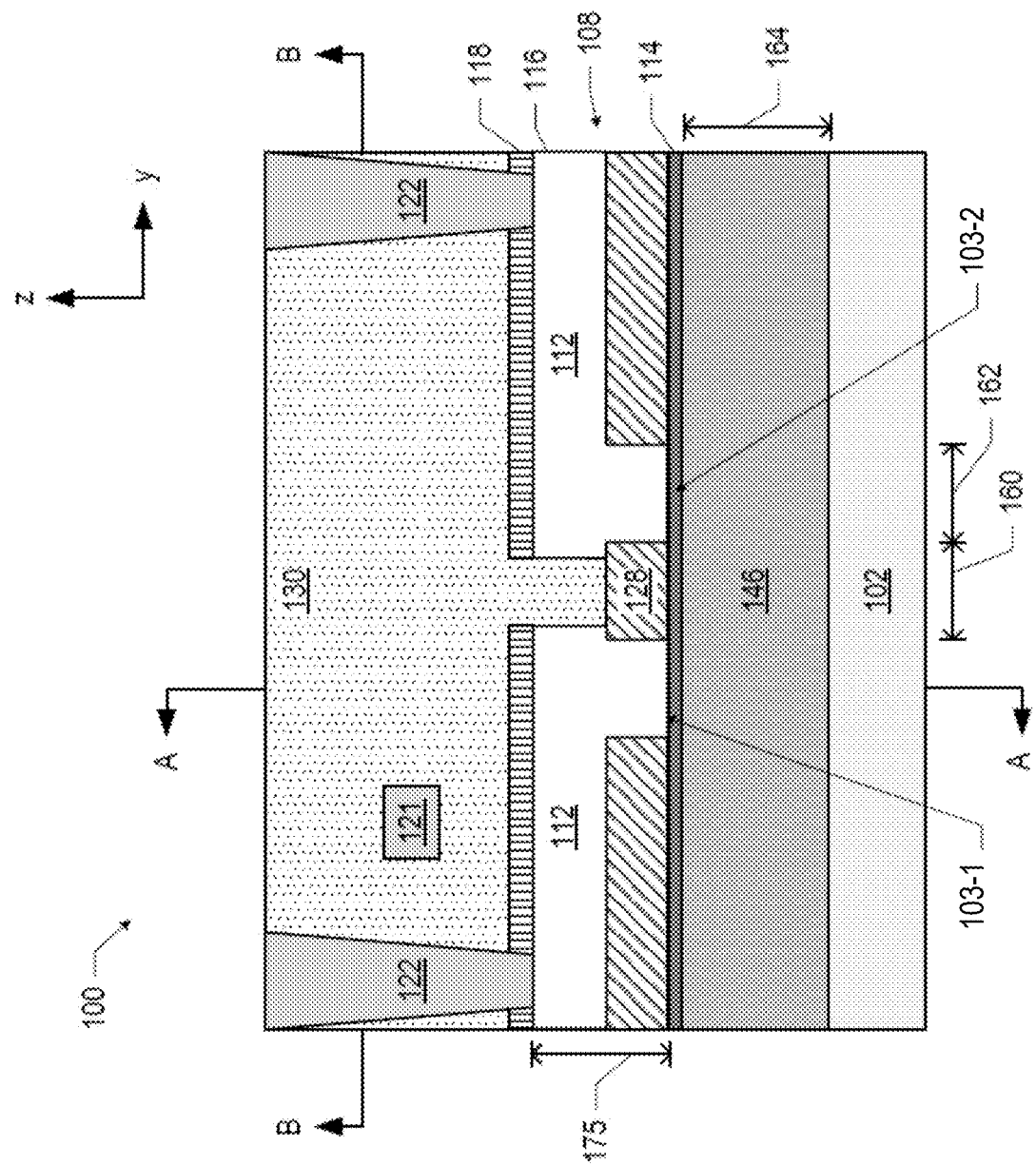
Figure 4:
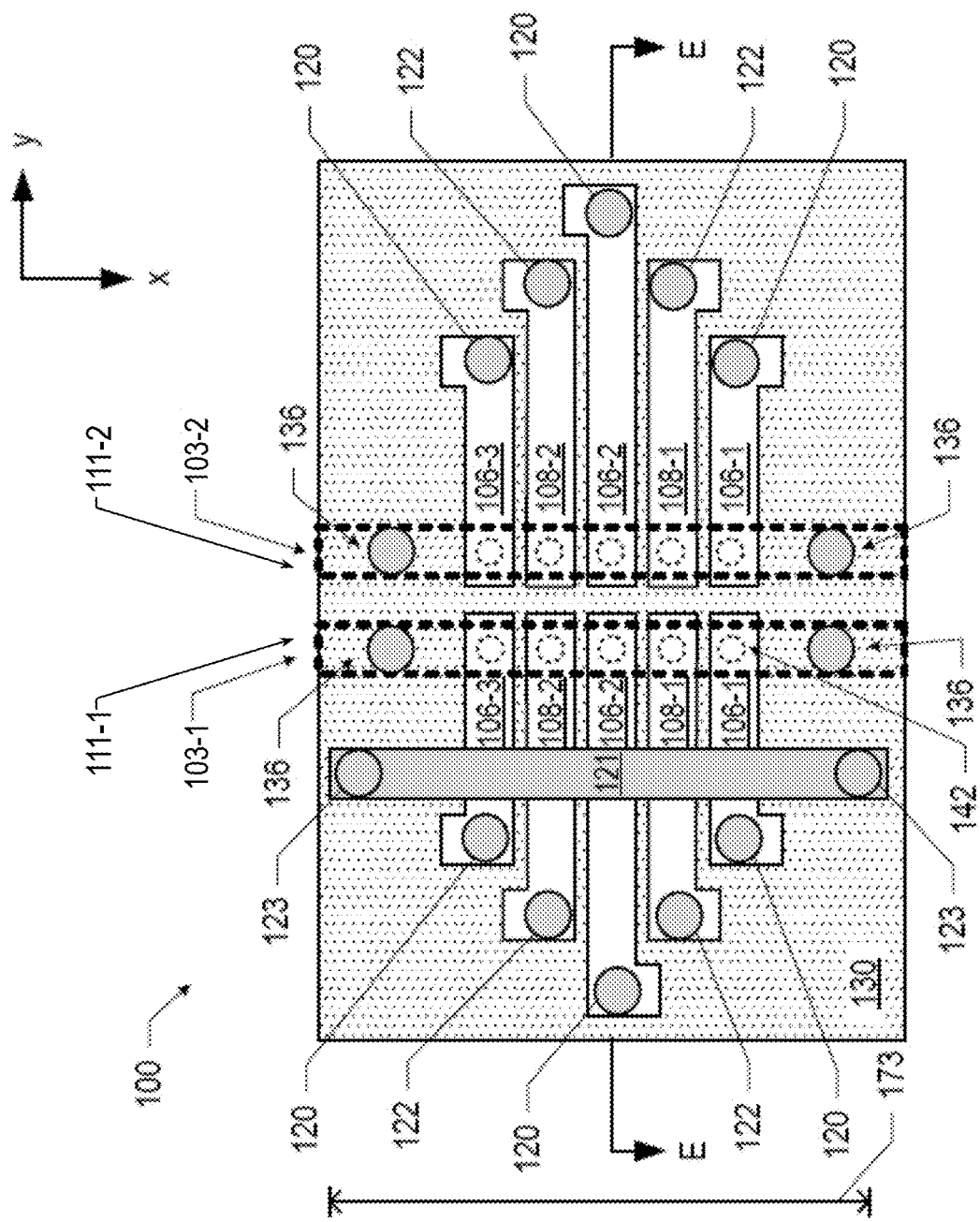

FIGS. 1-4 are cross-sectional views of a quantum dot device 100, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), FIG. 3 illustrates the quantum dot device 100 taken along the section D-D of FIG. 2 (while FIG. 2 illustrates the quantum dot device 100 taken along the section A-A of FIG. 3), and FIG. 4 illustrates the quantum dot device 100 taken along the section B-B of FIG. 1 with a number of components not shown to more readily illustrate how the gates 106/108 and the magnet line 121 may be patterned (while FIG. 1 illustrates a quantum dot device 100 taken along the section E-E of FIG. 4). Although FIG. 1 indicates that the cross-section illustrated in FIG. 2 is taken through the trench 103-1, an analogous cross-section taken through the trench 103-2 may be identical, and thus the discussion of FIG. 2 refers generally to the "trench 103."

The quantum dot device 100 may include a quantum well stack 146 disposed on a base 102. An insulating material 128 may be disposed above the quantum well stack 146, and multiple trenches 103 in the insulating material 128 may extend toward the quantum well stack 146. In the embodiment illustrated in FIGS. 1-4, a gate dielectric 114 may be disposed between the quantum well stack 146 and the insulating material 128 so as to provide the "bottom" of the trenches 103. A number of examples of quantum well stacks 146 are discussed below with reference to FIGS. 5-7.

Although only two trenches, 103-1 and 103-2, are shown in FIGS. 1-4, this is simply for ease of illustration, and more than two trenches 103 may be included in the quantum dot device 100. In some embodiments, the total number of trenches 103 included in the quantum dot device 100 is an even number, with the trenches 103 organized into pairs including one active trench 103 and one read trench 103, as discussed in detail below. When the quantum dot device 100 includes more than two trenches 103, the trenches 103 may be arranged in pairs in a line (e.g., 2N trenches total may be arranged in a 1×2N line, or a 2×N line) or in pairs in a larger array (e.g., 2N trenches total may be arranged as a 4×N/2 array, a 6×N/3 array, etc.). As illustrated in FIGS. 1, 3, and 4, in some embodiments, multiple trenches 103 may be oriented substantially in parallel. The discussion herein will largely focus on a single pair of trenches 103 for ease of illustration, but all the teachings of the present disclosure apply to quantum dot devices 100 with more trenches 103. Further, the use of the term "trench" should not be interpreted to require that the insulating material 128 is deposited first and then a portion of that insulating material 128 is excavated to form the trench 103 prior to depositing material in the trench 103; in various embodiments, the insulating material 128 may be deposited before or after deposition of the material that will ultimately be disposed in the trench 103.

The quantum dot device 100 of FIGS. 1-4 may include multiple quantum dot formation regions 111 (labeled in FIG. 4), defined by the parallel trenches 103 in the insulating material 128 disposed on top of the quantum well stack 146. These quantum dot formation regions 111 may be portions of the quantum well stack 146 in which quantum dots 142 may form during operation. The quantum dot formation regions 111 may be arranged as multiple parallel rows defined by the trenches 103, and the gates 106/108 may each extend over multiple ones of the quantum dot formation regions 111.

The quantum well stack 146 may include a quantum well layer (not shown in FIGS. 1-4 but discussed below with reference to the quantum well layer 152 of FIGS. 5-7). The quantum well layer included in the quantum well stack 146 may be arranged normal to the z-direction, and may provide a layer in which a two-dimensional electron gas (2DEG) may form to enable the generation of one or more quantum dots during operation of the quantum dot device 100, as discussed in further detail below. The quantum well layer itself may provide a geometric constraint on the z-location of quantum dots in the quantum well stack 146. To control the x- and y-location of quantum dots in the quantum well stack 146, voltages may be applied to gates disposed at least partially in the trenches 103 above the quantum well stack 146 to adjust the energy profile along the trenches 103 in the x- and y-direction and thereby constrain the x- and y-location of quantum dots within quantum wells (discussed in detail below with reference to the gates 106/108). The dimensions of the trenches 103 may take any suitable values. For example, in some embodiments, the trenches 103 may each have a width 162 between about 5 nanometers and 50 nanometers. In some embodiments, the trenches 103 may each have a depth 164 between about 40 nanometers and 400 nanometers (e.g., between about 50 nanometers and 350 nanometers, or equal to about 100 nanometers). The insulating material 128 may be a dielectric material (e.g., an interlayer dielectric), such as silicon oxide. In some embodiments, the insulating material 128 may be a chemical vapor deposition (CVD) or flowable CVD oxide. In some embodiments, the trenches 103 may be spaced apart by a distance 160 between about 30 nanometers and 300 nanometers.

Multiple gates may be disposed at least partially in each of the trenches 103. In the embodiment illustrated in FIG. 2, three gates 106 and two gates 108 are shown as distributed at least partially in a single trench 103. This particular number of gates is simply illustrative, and any suitable number of gates may be used (in fact, each of FIGS. 20 and 23, showing various embodiments of quantum dot devices with additional read accumulation gates and with side and center screening gates illustrates more than a total of five gates). Additionally, in some embodiments, multiple groups of gates (like the gates illustrated in FIG. 2) may be disposed at least partially in the trench 103.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114; in the embodiment illustrated in FIG. 2, the gate dielectric 114 for all of the gates 106/108 is provided by a common layer of gate dielectric material disposed between the quantum well stack 146 and the insulating material 128. In other embodiments, the gate dielectric 114 for each of the gates 106/108 may be provided by separate portions of gate dielectric 114 (i.e., the gate dielectric 114 may not be continuous across multiple ones of the gates 106/108). In some embodiments, the gate dielectric 114 may be a multilayer gate dielectric (e.g., with multiple materials used to improve the interface between the trench 103 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 (including multiple layers of gate metal) and a hardmask 116. In particular, a first gate metal layer 110A may be disposed in the trench 103, and a second gate metal layer 110B may be disposed above the gate metal 110-1 and above the insulating material 128, as shown. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the quantum well stack 146. As shown in FIG. 1, in some embodiments, the gate metal 110 of a gate 106 may extend over the insulating material 128 and into a trench 103 in the insulating material 128. Only one portion of the hardmask 116 is labeled in FIG. 2 for ease of illustration.

In some embodiments, the gate metal 110 may be a superconductor, such as aluminum, titanium nitride, or niobium titanium nitride; any of these materials may be included in the first gate metal layer 110A and/or the second gate metal layer 110B. In some embodiments, the first gate metal layer 110A may have a different material composition than the second gate metal layer 110B. For example, the first gate metal layer 110A may be titanium nitride, while the second gate metal layer 110B may be a material different from titanium nitride, or vice versa. In some embodiments, the first gate metal layer 110A and the second gate metal layer 110B may have the same material composition but a different microstructure. These different microstructures may arise, for example, by different deposition and/or patterning techniques used to form the first gate metal layer 110A and the second gate metal layer 110B. For example, in some embodiments, the first gate metal layer 110A may have a microstructure including columnar grains (e.g., when the first gate metal layer 110A is initially blanket-deposited and then etched as part of a subtractive patterning process), while the second gate metal layer 110B may not exhibit a columnar grain structure. In some embodiments, a seam delineating the interface between the top surface of the first gate metal layer 110A and the bottom surface of the second gate metal layer 110B may be present in the quantum dot device 100.

In some embodiments, the hardmask 116 may not be present in the quantum dot device 100 (e.g., a hardmask like the hardmask 116 may be removed during processing). The sides of the gate metal 110 may be substantially parallel, as shown in FIG. 2, and insulating spacers 134 may be disposed on the sides of the gate metal 110 and the hardmask 116 along the longitudinal axis of the trench 103. As illustrated in FIG. 2, the spacers 134 may be thicker closer to the quantum well stack 146 and thinner farther away from the quantum well stack 146. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). As illustrated in FIG. 1, no spacer material may be disposed between the gate metal 110 and the sidewalls of the trench 103 in the y-direction.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the quantum well stack 146. As shown in FIG. 3, in some embodiments, the gate metal 112 of a gate 108 may extend over the insulating material 128 and into a trench 103 in the insulating material 128. In the embodiment illustrated in FIG. 2, the hardmask 118 may extend over the hardmask 116 (and over the gate metal 110 of the gates 106), while in other embodiments, the hardmask 118 may not extend over the gate metal 110. In the embodiment of FIGS. 1-3, the gate metal 112 of the gates 108 may be provided by a single continuous layer of material (and may not, for example, include multiple different layers of gate metal, as was discussed above with reference to the gate metal 110 of the gates 106). In other embodiments, however, the gate metal 112 of the gates 108 may include multiple layers of gate metal, e.g., multiple layers similar to the first gate metal layer 110A and the second gate metal layer 110B. In some embodiments, the gate metal 112 may be a different metal from the first gate metal layer 110A and/or the second gate metal layer 110B; in other embodiments, the gate metal 112 and the first gate metal layer 110A and/or the second gate metal layer 110B may have the same material composition. In some embodiments, the gate metal 112 may be a superconductor, such as aluminum, titanium nitride, or niobium titanium nitride. In some embodiments, the hardmask 118 may not be present in the quantum dot device 100 (e.g., a hardmask like the hardmask 118 may be removed during processing).

The gate 108-1 may extend between the proximate spacers 134 on the sides of the gate 106-1 and the gate 106-2 along the longitudinal axis of the trench 103, as shown in FIG. 2. In some embodiments, the gate metal 112 of the gate 108-1 may extend between the spacers 134 on the sides of the gate 106-1 and the gate 106-2 along the longitudinal axis of the trench 103. Thus, the gate metal 112 of the gate 108-1 may have a shape that is substantially complementary to the shape of the spacers 134, as shown in FIG. 2. Similarly, the gate 108-2 may extend between the proximate spacers 134 on the sides of the gate 106-2 and the gate 106-3 along the longitudinal axis of the trench 103. In some embodiments in which the gate dielectric 114 is not a layer shared commonly between the gates 108 and 106, but instead is separately deposited in the trench 103 between the spacers 134, the gate dielectric 114 may extend at least partially up the sides of the spacers 134 (and up the proximate sidewalls of the trench 103), and the gate metal 112 may extend between the portions of gate dielectric 114 on the spacers 134 (and the proximate sidewalls of the trench 103). As illustrated in FIG. 3, in some embodiments, no spacer material may be disposed between the gate metal 112 and the sidewalls of the trench 103 in the y-direction; in other embodiments (not shown in the present drawings), spacers 134 may also be disposed between the gate metal 112 and the sidewalls of the trench 103 in the y-direction.

The dimensions of the gates 106/108 may take any suitable values. For example, in some embodiments, the z-height 166 of the gate metal 110 in the trench 103 may be between about 100 nanometers and 400 nanometers (e.g., approximately about 200 nanometers); the z-height 175 of the gate metal 112 may be in about the same range. This z-height 166 of the gate metal 110 in the trench 103 may represent the sum of the z-height of the first gate metal layer 110A (e.g., between about 40 nanometers and 300 nanometers) and the thickness of the second gate metal layer 110B (e.g., between about 25 nanometers and 100 nanometers, or approximately 50 nanometers). In embodiments like the ones illustrated in FIGS. 1-3, the z-height 175 of the gate metal 112 may be greater than the z-height 166 of the gate metal 110 (as can be seen in, e.g., FIG. 2). In some embodiments, the length 168 of the gate metal 110 (i.e., in the x-direction) may be between about 20 nanometers and 50 nanometers (e.g., about 30 nanometers). Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 2) may have a greater length 168 than the "inner" gates 106 (e.g., the gate 106-2 in the embodiment illustrated in FIG. 2). Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140.

In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between about 40 nanometers and 100 nanometers (e.g., about 50 nanometers). In some embodiments, the thickness 172 of the spacers 134 may be between about 1 nanometer and 10 nanometers (e.g., between about 3 nanometers and 5 nanometers, between about 4 nanometers and 6 nanometers, or between about 4 nanometers and 7 nanometers). The length of the gate metal 112 (i.e., in the x-direction) may depend on the dimensions of the gates 106 and the spacers 134, as illustrated in FIG. 2. As indicated in FIGS. 1 and 3, the gates 106/108 in one trench 103 may extend over the insulating material 128 between that trench 103 and an adjacent trench 103, but may be isolated from their counterpart gates by the intervening insulating material 130 and spacers 134.

As shown in FIG. 2, the gates 106 and 108 may be alternatingly arranged in the x-direction. During operation of the quantum dot device 100, voltages may be applied to the gates 106/108 to adjust the potential energy in the quantum well stack 146 to create quantum wells of varying depths in which quantum dots 142 may form. Only one quantum dot 142 is labeled with a reference numeral in FIGS. 2 and 4 for ease of illustration, but five are indicated as dotted circles below each trench 103. The location of the quantum dots 142 in FIGS. 2 and 4 is not intended to indicate a particular geometric positioning of the quantum dots 142. The spacers 134 (and the insulating material 128) may themselves provide "passive" barriers between quantum dots under the gates 106/108 in the quantum well stack 146, and the voltages applied to different ones of the gates 106/108 may adjust the potential energy under the gates 106/108 in the quantum well stack 146; decreasing the potential energy under a gate 106/108 may enable the formation of a quantum dot under that gate 106/108, while increasing the potential energy under a gate 106/108 may form a quantum barrier under that gate 106/108.

The quantum well stack 146 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide. In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarity of the voltages applied to the gates 106/108 to form quantum wells/barriers depends on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well stack 146 under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under an adjacent gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-4, the gates 106 may extend both "vertically" and "horizontally" away from the quantum well stack 146, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may similarly extend away from the quantum well stack 146, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 140 (e.g., via the conductive vias 136 and the interface material 141) to cause current to flow through the doped regions 140 and through a quantum well layer of the quantum well stack 146 (discussed in further detail below with reference to FIGS. 5-7). When the doped regions 140 are doped with an n-type material, this voltage may be positive; when the doped regions 140 are doped with a p-type material, this voltage may be negative. The magnitude of this bias voltage may take any suitable value (e.g., between about 0.25 volts and 2 volts).

In some embodiments, the quantum dot device 100 may include one or more magnet lines 121. For example, a single magnet line 121 is illustrated in FIGS. 1-4, proximate to the trench 103-1. The magnet line 121 may be formed of a conductive material and may be used to conduct current pulses that generate magnetic fields to influence the spin states of one or more of the quantum dots 142 that may form in the quantum well stack 146. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnetic field to which the spin of a qubit may couple. The magnet line 121 may provide any suitable combination of these embodiments, or any other appropriate functionality.

In some embodiments, the magnet line 121 may be formed of copper. In some embodiments, the magnet line 121 may be formed of a superconductor, such as aluminum. The magnet line 121 illustrated in FIGS. 1-4 is non-coplanar with the trenches 103, and is also non-coplanar with the gates 106/108. In some embodiments, the magnet line 121 may be spaced apart from the gates 106/108, in the direction of the z-axis of the example coordinate system shown, by a distance 167. The distance 167 may take any suitable value (e.g., based on the desired strength of magnetic field interaction with particular quantum dots 142); in some embodiments, the distance 167 may be between about 25 nanometers and 1 micron (e.g., between about 50 nanometers and 200 nanometers).

In some embodiments, the magnet line 121 may be formed of a magnetic material. For example, a magnetic material (such as cobalt) may be deposited in a trench in the insulating material 130 to provide a permanent magnetic field in the quantum dot device 100.

The magnet line 121 may have any suitable dimensions. For example, the magnet line 121 may have a thickness 169 between about 25 nanometers and 100 nanometers. The magnet line 121 may have a width 171 between about 25 nanometers and 100 nanometers. In some embodiments, the width 171 and thickness 169 of a magnet line 121 may be substantially equal to, respectively, the width and thickness of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIGS. 1-4 is substantially linear, but this need not be the case; in general, the magnet lines 121 of the quantum dot devices 100 may take any suitable shape. In other embodiments, micro-magnets may be used instead or in addition to the magnet line 121. Conductive vias 123 may contact the magnet line 121.

The conductive vias 120, 122, 136, and 123 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of IC manufacturing, conductive vias and lines may be formed in an iterative process in which layers of structures are formed on top of each other. In some embodiments, the conductive vias 120/122/136/123 may have a width that is about 20 nanometers or greater at their widest point (e.g., about 30 nanometers), and a pitch of about 80 nanometers or greater (e.g., about 100 nanometers). In some embodiments, conductive lines (not shown) included in the quantum dot device 100 may have a width that is about 100 nanometers or greater, and a pitch of about 100 nanometers or greater. The particular arrangement of conductive vias shown in FIGS. 1-4 is simply illustrative, and any electrical routing arrangement may be implemented.

As discussed above, the structure of the trench 103-1 may be the same as the structure of the trench 103-2; similarly, the construction of gates 106/108 in and around the trench 103-1 may be the same as the construction of gates 106/108 in and around the trench 103-2. The gates 106/108 associated with the trench 103-1 may be mirrored by corresponding gates 106/108 associated with the parallel trench 103-2, and the insulating material 130 may separate the gates 106/108 associated with the different trenches 103-1 and 103-2. In particular, quantum dots 142 formed in the quantum well stack 146 under the trench 103-1 (under the gates 106/108) may have counterpart quantum dots 142 in the quantum well stack 146 under the trench 103-2 (under the corresponding gates 106/108). In some embodiments, the quantum dots 142 under the trench 103-1 may be used as "active" quantum dots in the sense that these quantum dots 142 act as qubits and are controlled (e.g., by voltages applied to the gates 106/108 associated with the trench 103-1) to perform quantum computations. The quantum dots 142 associated with the trench 103-2 may be used as "read" quantum dots in the sense that these quantum dots 142 may sense the quantum state of the quantum dots 142 under the trench 103-1 by detecting the electric field generated by the charge in the quantum dots 142 under the trench 103-1, and may convert the quantum state of the quantum dots 142 under the trench 103-1 into electrical signals that may be detected by the gates 106/108 associated with the trench 103-2. Each quantum dot 142 under the trench 103-1 may be read by its corresponding quantum dot 142 under the trench 103-2. Thus, the quantum dot device 100 enables both quantum computation and the ability to read the results of a quantum computation.

As discussed above, the quantum well stack 146 may include a quantum well layer in which a 2DEG may form during operation of the quantum dot device 100. The quantum well stack 146 may take any of a number of forms, several of which are illustrated in FIGS. 5-7. The various layers in the quantum well stacks 146 discussed below may be grown on the base 102 (e.g., using epitaxial processes).

Although the singular term "layer" may be used to refer to various components of the quantum well stacks 146 of FIGS. 5-7, any of the layers discussed below may include multiple materials arranged in any suitable manner. In embodiments in which a quantum well stack 146 includes layers other than a quantum well layer 152, layers other than the quantum well layer 152 in a quantum well stack 146 may have higher threshold voltages for conduction than the quantum well layer 152 so that when the quantum well layer 152 is biased at its threshold voltages, the quantum well layer 152 conducts and the other layers of the quantum well stack 146 do not. This may avoid parallel conduction in both the quantum well layer 152 and the other layers, and thus avoid compromising the strong mobility of the quantum well layer 152 with conduction in layers having inferior mobility. In some embodiments, silicon used in a quantum well stack 146 (e.g., in a quantum well layer 152) may be grown from precursors enriched with the 28Si isotope. In some embodiments, germanium used in a quantum well stack 146 (e.g., in a quantum well layer 152) may be grown from precursors enriched with the 70Ge, 72Ge, or 74Ge isotope.

Figure 5:
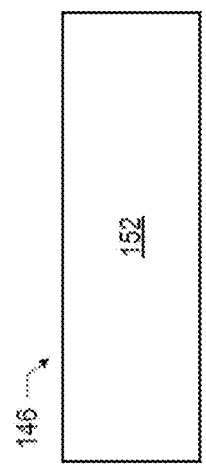
FIGS. 5-7 are cross-sectional views of various examples of quantum well stacks that may be used in a quantum dot device with either trenches or fins, in accordance with various embodiments.

FIG. 5 is a cross-sectional view of a quantum well stack 146 including only a quantum well layer 152. The quantum well layer 152 may be disposed on the base 102, and may be formed of a material such that, during operation of the quantum dot device 100, a 2DEG may form in the quantum well layer 152 proximate to the upper surface of the quantum well layer 152. The gate dielectric 114 of the gates 106/108 may be disposed on the upper surface of the quantum well layer 152. In some embodiments, the quantum well layer 152 of FIG. 5 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 5 is formed of intrinsic silicon may be particularly advantageous for electron-type quantum dot devices 100. In some embodiments, the quantum well layer 152 of FIG. 5 may be formed of intrinsic germanium, and the gate dielectric 114 may be formed of germanium oxide; in such an arrangement, during use of the quantum dot device 100, a two-dimensional hole gas (2DHG) may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 5 may take any suitable values. For example, in some embodiments, the thickness of the quantum well layer 152 (e.g., intrinsic silicon or germanium) may be between about 0.8 microns and 1.2 microns.

Figure 6:
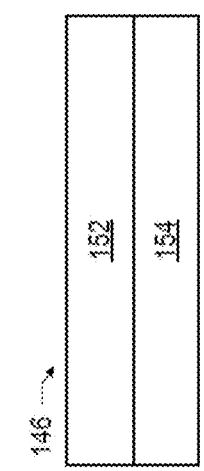

FIG. 6 is a cross-sectional view of a quantum well stack 146 including a quantum well layer 152 and a barrier layer 154. The quantum well stack 146 may be disposed on the base 102 (e.g., as discussed above with reference to FIG. 6) such that the barrier layer 154 is disposed between the quantum well layer 152 and the base 102. The barrier layer 154 may provide a potential barrier between the quantum well layer 152 and the base 102. As discussed above with reference to FIG. 5, the quantum well layer 152 of FIG. 6 may be formed of a material such that, during operation of the quantum dot device 100, a 2DEG may form in the quantum well layer 152 proximate to the upper surface of the quantum well layer 152. For example, in some embodiments in which the base 102 is formed of silicon, the quantum well layer 152 of FIG. 6 may be formed of silicon, and the barrier layer 154 may be formed of silicon germanium. The germanium content of this silicon germanium may be about 20-80% (e.g., about 30%). In some embodiments in which the quantum well layer 152 is formed of germanium, the barrier layer 154 may be formed of silicon germanium, e.g., with a germanium content of about 20-80% (e.g., about 70%). The thicknesses (i.e., z-heights) of the layers in the quantum well stack 146 of FIG. 6 may take any suitable values. For example, in some embodiments, the thickness of the barrier layer 154 (e.g., silicon germanium) may be between about 0 nanometers and 400 nanometers. In some embodiments, the thickness of the quantum well layer 152 (e.g., silicon or germanium) may be between about 5 nanometers and 30 nanometers.

Figure 7:
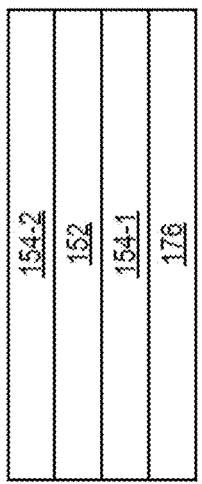

FIG. 7 is a cross-sectional view of a quantum well stack 146 including a quantum well layer 152 and a barrier layer 154-1, as well as a buffer layer 176 and an additional barrier layer 154-2. The quantum well stack 146 may be disposed on the base 102 such that the buffer layer 176 is disposed between the barrier layer 154-1 and the base 102. The buffer layer 176 may be formed of the same material as the barrier layer 154, and may be present to trap defects that form in this material as it is grown on the base 102. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., about 30%) at the barrier layer 154-1. The thicknesses (i.e., z-heights) of the layers in the quantum well stack 146 of FIG. 7 may take any suitable values. For example, in some embodiments, the thickness of the buffer layer 176 (e.g., silicon germanium) may be between about 0.3 microns and 4 microns (e.g., between about 0.3 microns and 2 microns, or about 0.5 microns). In some embodiments, the thickness of the barrier layer 154-1 (e.g., silicon germanium) may be between about 0 nanometers and 400 nanometers. In some embodiments, the thickness of the quantum well layer 152 (e.g., silicon or germanium) may be between about 5 nanometers and 30 nanometers (e.g., about 10 nanometers). The barrier layer 154-2, like the barrier layer 154-1, may provide a potential energy barrier around the quantum well layer 152, and may take the form of any of the embodiments of the barrier layer 154-1. In some embodiments, the thickness of the barrier layer 154-2 (e.g., silicon germanium) may be between about 25 nanometers and 75 nanometers (e.g., about 32 nanometers).

As discussed above with reference to FIG. 6, the quantum well layer 152 of FIG. 7 may be formed of a material such that, during operation of the quantum dot device 100, a 2DEG may form in the quantum well layer 152 proximate to the upper surface of the quantum well layer 152. For example, in some embodiments in which the base 102 is formed of silicon, the quantum well layer 152 of FIG. 7 may be formed of silicon, and the barrier layer 154-1 and the buffer layer 176 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., about 30%) at the barrier layer 154-1. In other embodiments, the buffer layer 176 may have a germanium content about equal to the germanium content of the barrier layer 154-1 but may be thicker than the barrier layer 154-1 so as to absorb the defects that arise during growth.

In some embodiments, the quantum well layer 152 of FIG. 7 may be formed of germanium, and the buffer layer 176 and the barrier layer 154-1 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the base 102 to a nonzero percent (e.g., about 70%) at the barrier layer 154-1. The barrier layer 154-1 may in turn have a germanium content equal to the nonzero percent. In other embodiments, the buffer layer 176 may have a germanium content about equal to the germanium content of the barrier layer 154-1 but may be thicker than the barrier layer 154-1 so as to absorb the defects that arise during growth. In some embodiments of the quantum well stack 146 of FIG. 7, the buffer layer 176 and/or the barrier layer 154-2 may be omitted.

Figure 8:
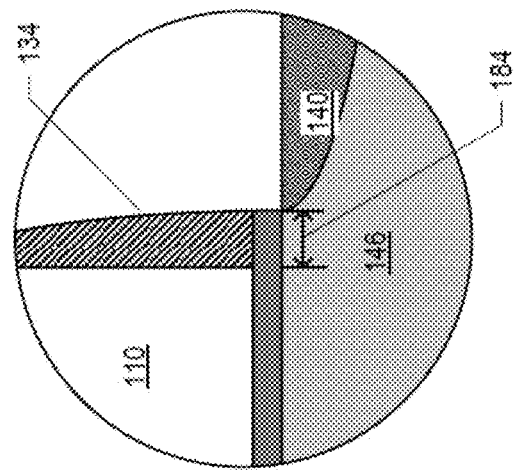
FIGS. 8-9 illustrate detail views of various embodiments of a doped region in a quantum dot device with either trenches or fins, in accordance with various embodiments.
Figure 9:
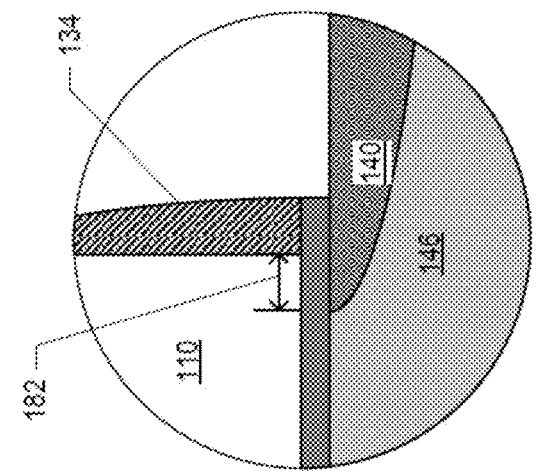

The outer spacers 134 on the outer gates 106, shown, e.g., in FIG. 2, may provide a doping boundary, limiting diffusion of the dopant from the doped regions 140 into the area under the gates 106/108. In some embodiments, the doped regions 140 may extend past the outer spacers 134 and under the outer gates 106. For example, as illustrated in FIG. 8, the doped region 140 may extend past the outer spacers 134 and under the outer gates 106 by a distance 182 between about 0 nanometers and 10 nanometers. In some embodiments, the doped regions 140 may not extend past the outer spacers 134 toward the outer gates 106, but may instead "terminate" under the outer spacers 134. For example, as illustrated in FIG. 9, the doped regions 140 may be spaced away from the interface between the outer spacers 134 and the outer gates 106 by a distance 184 between about 0 nanometers and 10 nanometers. The interface material 141 is omitted from FIGS. 8 and 9 for ease of illustration.

Example Quantum Dot Devices with Fins

Another type of quantum dot devices includes devices having a base, a fin extending away from the base, where the fin includes a quantum well layer, and one or more gates disposed on the fin. A quantum dot formed in such a device may be constrained in the x-direction by the one or more gates, in the y-direction by the fin, and in the z-direction by the quantum well layer, as discussed in detail herein. Similar to the quantum dot devices with trenches, described above, and unlike previous approaches to quantum dot formation and manipulation, quantum dot devices with fins provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this type of a quantum dot device is described as another example quantum dot device in which side and center screening gates as described herein may be implemented.

Figure 10:
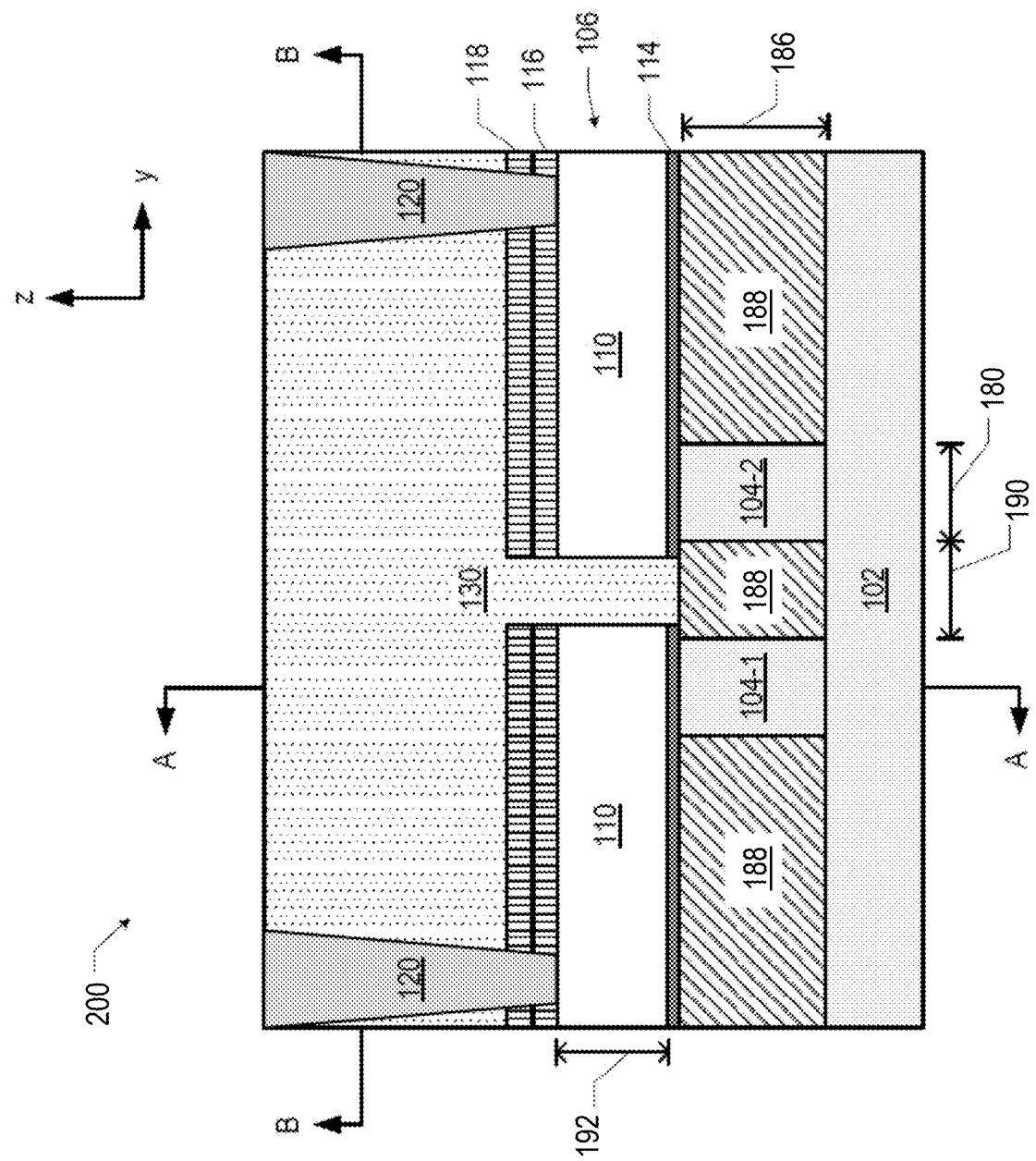
FIGS. 10-12 are cross-sectional and top-down views of an example quantum dot device with fins, according to some embodiments of the present disclosure.
Figure 11:
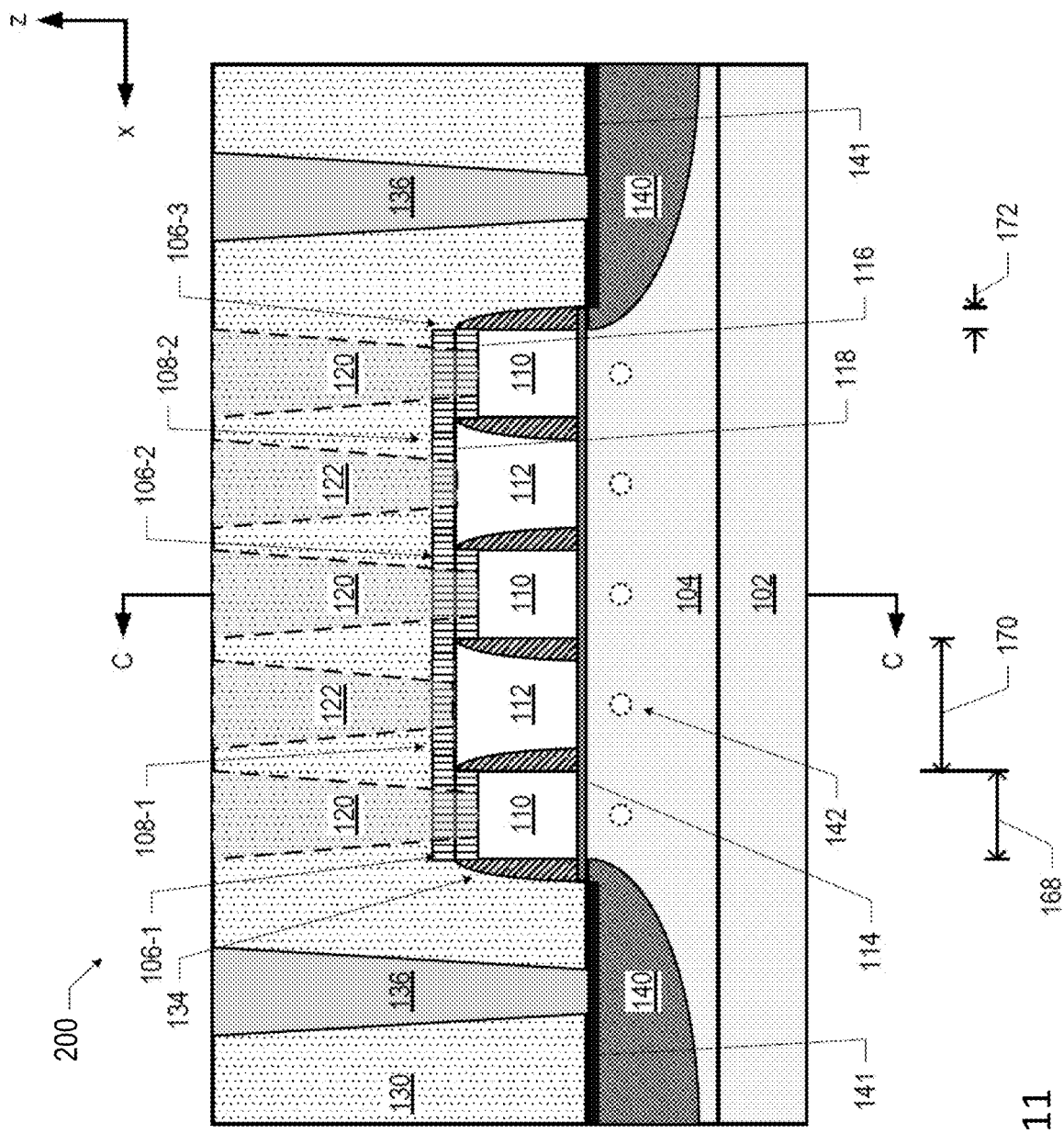
Figure 12:
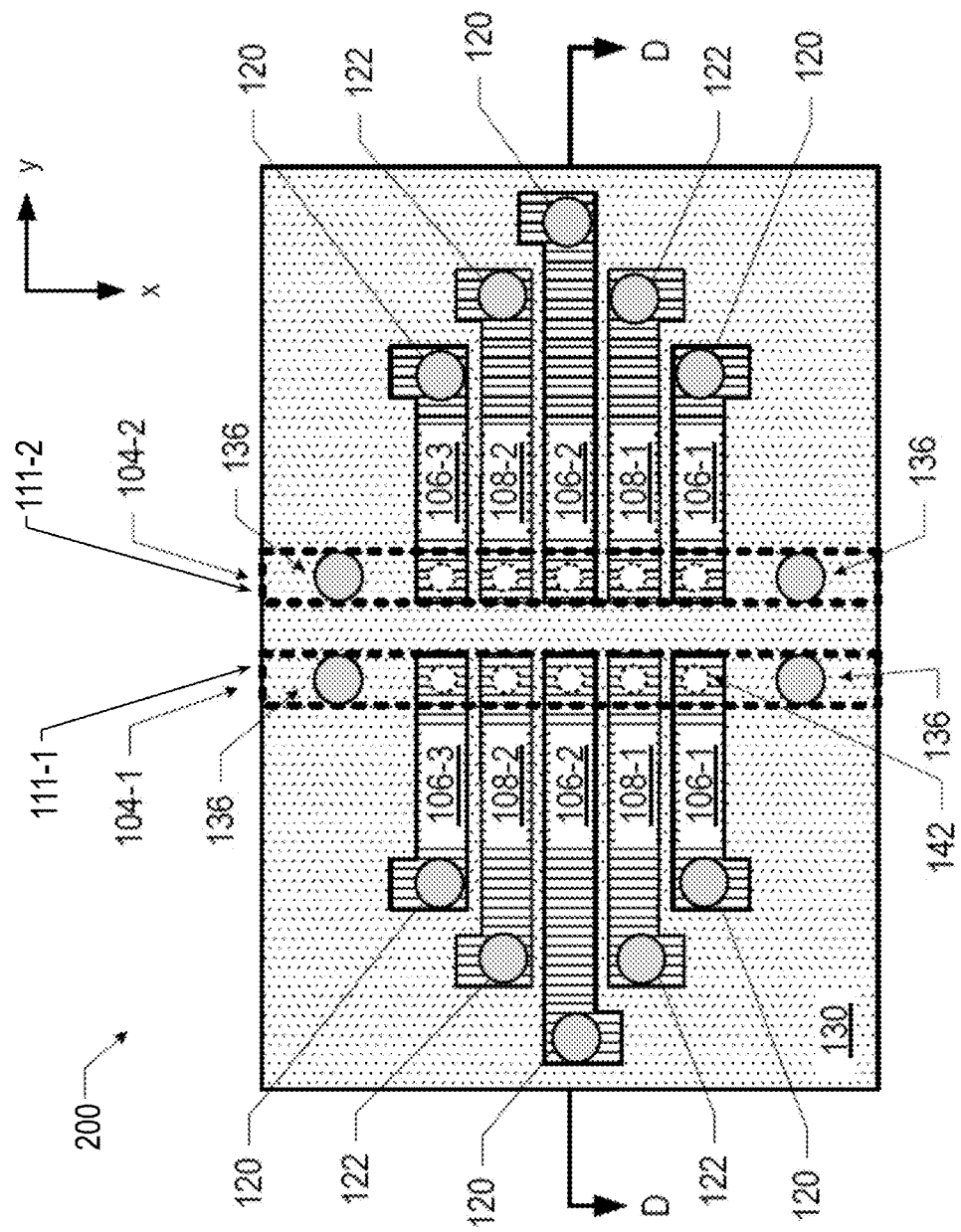

FIGS. 10-12 are cross-sectional views of an example quantum dot device 200 implementing quantum dot qubits, in accordance with various embodiments. In particular, FIG. 11 illustrates the quantum dot device 200 taken along the section A-A of FIG. 10 (while FIG. 10 illustrates the quantum dot device 200 taken along the section C-C of FIG. 11), and FIG. 12 illustrates the quantum dot device 200 taken along the section B-B of FIG. 10 (while FIG. 10 illustrates a quantum dot device 200 taken along the section D-D of FIG. 12). Although FIG. 10 indicates that the cross-section illustrated in FIG. 11 is taken through the fin 104-1, an analogous cross-section taken through the fin 104-2 may be identical, and thus the discussion of FIGS. 10-12 refers generally to the "fin 104."

As shown in FIGS. 10-12, the quantum dot device 200 may include a base 102, similar to the base 102 of the quantum dot device 200 shown in FIGS. 1-4, and multiple fins 104 extending away from the base 102. The base 102 and the fins 104 may include a semiconductor substrate and a quantum well stack (not shown in FIGS. 10-12 but discussed below with reference to the semiconductor substrate 144 and the quantum well stack 146), distributed in any of a number of ways between the base 102 and the fins 104. The base 102 may include at least some of the semiconductor substrate, and the fins 104 may each include a quantum well layer, e.g., a quantum well layer as discussed above with reference to the quantum well layer 152 of FIGS. 5-7. Examples of base/fin arrangements are discussed below with reference to the base fin arrangements 158 of FIGS. 13-19.

Although only two fins, 104-1 and 104-2, are shown in FIGS. 10-12, this is simply for ease of illustration, and more than two fins 104 may be included in the quantum dot device 200. In some embodiments, the total number of fins 104 included in the quantum dot device 200 is an even number, with the fins 104 organized into pairs including one active fin 104 and one read fin 104, as discussed in detail below. When the quantum dot device 200 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). As illustrated in FIGS. 10 and 12, in some embodiments, multiple fins 104 may be oriented substantially in parallel. The discussion herein will largely focus on a single pair of fins 104 for ease of illustration, but all the teachings of the present disclosure apply to quantum dot devices 200 with more fins 104.

The quantum dot device 200 of FIGS. 10-12 may include multiple quantum dot formation regions 111 (labeled in FIG. 12), defined by the fins 104. These quantum dot formation regions 111 may be portions of the quantum well stack 146 in which quantum dots 142 may form during operation. The quantum dot formation regions 111 may be arranged as multiple parallel rows defined by the insulating material 188, and the gates 106/108 may each extend over multiple ones of the quantum dot formation regions 111. In the embodiments discussed with reference to FIGS. 10-12, the quantum dot formation regions 111 may be defined by fins 104 separated by portions of insulating material 188; these fins 104 may provide parallel rows of portions of quantum well layers 152 in which quantum dots 142 may form. Thus, the quantum dot formation regions 111 of the quantum dot device 200 of FIGS. 10-12 and of the quantum dot device 100 of FIGS. 1-4 illustrate two different ways of defining the quantum dot formation regions 111.

As noted above, each of the fins 104 may include a quantum well layer (not shown in FIGS. 10-12 but discussed above with reference to the quantum well layer 152). The quantum well layer included in the fins 104 may be arranged normal to the z-direction, and may provide a layer in which a 2DEG may form to enable the generation of a quantum dot during operation of the quantum dot device 200, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 180 between about 5 and 80 nanometers. In some embodiments, the fins 104 may each have a height 186 between about 100 and 400 nanometers (e.g., between about 150 and 350 nanometers, or equal to about 300 nanometers).

The fins 104 may be arranged in parallel, as illustrated in FIGS. 10 and 12, and may be spaced apart by an insulating material 188, which may be disposed on opposite faces of the fins 104. The insulating material 188 of the quantum dot device 200 may be a dielectric material, such as silicon oxide, similar to the insulating material 128 of the quantum dot device 100. For example, in some embodiments, the fins 104 may be spaced apart by a distance 190 between about 100 and 250 microns.

Multiple gates may be disposed on each of the fins 104. In the embodiment illustrated in FIG. 11, three gates 106 and two gates 108 are shown as distributed on the top of the fin 104. This particular number of gates is simply illustrative, and any suitable number of gates may be used. Additionally, multiple groups of gates like the gates illustrated in FIG. 11 may be disposed on the fin 104.

Similar to the quantum dot device 100, in the quantum dot device 200, as shown in FIG. 11, the gate 108-1 may be disposed between the gates 106-1 and 106-2, and the gate 108-2 may be disposed between the gates 106-2 and 106-3, and each of the gates 106/108 may include a gate dielectric 114. In the embodiment illustrated in FIG. 11, the gate dielectric 114 for all of the gates 106/108 is provided by a common layer of gate dielectric material. In other embodiments, the gate dielectric 114 for each of the gates 106/108 of the quantum dot device 200 may be provided by separate portions of gate dielectric 114. Descriptions provided with respect to materials of the gate dielectric 114 of the quantum dot device 100 are applicable to the gate dielectric 114 of the quantum dot device 200 and, therefore, are not repeated.

In the quantum dot device 200, each of the gates 106 may include a gate metal 110 and a hardmask 116, similar to those of the quantum dot device 100. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 11 for ease of illustration. In some embodiments, the hardmask 116 may not be present in the quantum dot device 200 (e.g., a hardmask like the hardmask 116 may be removed during processing). In the quantum dot device 200, the sides of the gate metal 110 may be substantially parallel, as shown in FIG. 11, and insulating spacers 134 may be disposed on the sides of the gate metal 110 and the hardmask 116, similar to the insulating spacers 134 of the quantum dot device 100. As illustrated in FIG. 11, the spacers 134 may be thicker closer to the fin 104 and thinner farther away from the fin 104. In some embodiments, the spacers 134 may have a convex shape. Descriptions provided with respect to materials of the gate metal 110, the hardmask 116, and the spacers 134 of the quantum dot device 100 are applicable to those of the quantum dot device 200 and, therefore, are not repeated.

In the quantum dot device 200, each of the gates 108 may include a gate metal 112 and a hardmask 118, similar to those of the quantum dot device 100. The gate metal 112 may be disposed between the hardmask 118 and the gate dielectric 114, and the gate dielectric 114 may be disposed between the gate metal 112 and the fin 104. In the embodiment illustrated in FIG. 11, the hardmask 118 may extend over the hardmask 116 (and over the gate metal 110 of the gates 106), while in other embodiments, the hardmask 118 may not extend over the gate metal 110. In some embodiments, the gate metal 112 may be a different metal from the gate metal 110; in other embodiments, the gate metal 112 and the gate metal 110 may have the same material composition. In some embodiments, the hardmask 118 may not be present in the quantum dot device 200 (e.g., a hardmask like the hardmask 118 may be removed during processing). Descriptions provided with respect to materials of the gate metal 112 and the hardmask 118 of the quantum dot device 100 are applicable to those of the quantum dot device 200 and, therefore, are not repeated.

The gate 108-1 may extend between the proximate spacers 134 on the sides of the gate 106-1 and the gate 106-2 along the longitudinal axis of the fin 104, as shown in FIG. 11. In some embodiments, the gate metal 112 of the gate 108-1 may extend between the spacers 134 on the sides of the gate 106-1 and the gate 106-2 along the longitudinal axis of the fin 104. Thus, the gate metal 112 may have a shape that is substantially complementary to the shape of the spacers 134, as shown in FIG. 11. Similarly, the gate 108-2 may extend between the proximate spacers 134 on the sides of the gate 106-2 and the gate 106-3 along the longitudinal axis of the fin 104. In some embodiments in which the gate dielectric 114 is not a layer shared commonly between the gates 108 and 106, but instead is separately deposited on the fin 104 between the spacers 134, the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 in the quantum dot device 200 may take any suitable values. For example, in some embodiments, the z-height 192 of the gate metal 110 may be between about 40 and 75 nanometers (e.g., approximately about 50 nanometers); the z-height of the gate metal 112 may be in the same range. In embodiments like the ones illustrated in FIG. 11, the z-height of the gate metal 112 may be greater than the z-height of the gate metal 110. In some embodiments, the length 168 of the gate metal 110 (i.e., in the x-direction) in the quantum dot device 200 may be substantially the same as in the quantum dot device 100, e.g., between about 20 and 40 nanometers (e.g., about 30 nanometers). In some embodiments, the distance 170 and/or the thickness 172 shown for the quantum dot device 200 of FIG. 11 may be substantially the same as those shown for the quantum dot device 100 of FIG. 2. The length of the gate metal 112 (i.e., in the x-direction) may depend on the dimensions of the gates 106 and the spacers 134, as illustrated in FIG. 11. As indicated in FIG. 10, the gates 106/108 on one fin 104 may extend over the insulating material 188 beyond their respective fins 104 and towards the other fin 104, but may be isolated from their counterpart gates by the intervening insulating material 130.

In the embodiment of the quantum dot device 200 illustrated in FIG. 11, the z-height of the gate metal 112 of the gates 108 may be approximately equal to the sum of the z-height of the gate metal 110 and the z-height of the hardmask 116, as shown. Also, in the embodiment of FIG. 11, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction.

As shown in FIG. 11, the gates 106 and 108 may be alternatingly arranged along the fin 104 in the x-direction. During operation of the quantum dot device 200, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 11 and 12 for ease of illustration, but five are indicated as dotted circles in each fin 104, forming what may be referred to as a "quantum dot array." The location of the quantum dots 142 in FIG. 11 is not intended to indicate a particular geometric positioning of the quantum dots 142. Similar to the quantum dot device 100, in the quantum dot device 200, the spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 200. Descriptions of the n-type doped region 140, the p-type doped region 140, the interface material 141, how the voltages may be applied to the gates 106/108 to form quantum wells/barriers, how the gates 108 may be used as plunger gates while the gates 106 may be used as barrier gates, and of conductive vias and lines that may make contact with the gates 106/108 and with the doped regions 140, provided with respect to the quantum dot device 100 are applicable to the quantum dot device 200 and, therefore, are not repeated. As shown in FIGS. 10-12, the gates 106 may extend away from the fins 104, and conductive vias 120 may contact the gates 106 (and are drawn in dashed lines in FIG. 11 to indicate their location behind the plane of the drawing). The gates 108 may similarly extend away from the fins 104, and conductive vias 122 may contact the gates 108 (also drawn in dashed lines in FIG. 11 to indicate their location behind the plane of the drawing). The quantum dot device 200 may include further conductive vias and/or lines (not shown) to make electrical contact to the gates 106/108 and/or the doped regions 140, as desired. Descriptions of the bias voltage that may be applied to the doped regions 140 and of the conductive vias 120, 122, and 136, provided with respect to the quantum dot device 100 are applicable to the quantum dot device 200 and, therefore, are not repeated. Furthermore, although not shown in FIGS. 10-12, in some embodiments, the quantum dot device 200 may include one or more magnet lines such as the magnet line 121 described with reference to the quantum dot device 100.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 200 enables both quantum computation and the ability to read the results of a quantum computation.

As discussed above, the base 102 and the fin 104 of a quantum dot device 200 may be formed from a semiconductor substrate 144 and a quantum well stack 146 disposed on the semiconductor substrate 144. The quantum well stack 146 may include a quantum well layer in which a 2DEG may form during operation of the quantum dot device 200. The quantum well stack 146 may take any of a number of forms, several of which were illustrated in FIGS. 5-7 and were discussed above, which descriptions are, therefore, not repeated here.

The semiconductor substrate 144 and the quantum well stack 146 may be distributed between the base 102 and the fins 104 of the quantum dot device 200, as discussed above. This distribution may occur in any of a number of ways. For example, FIGS. 13-19 illustrate example base/fin arrangements 158 that may be used in a quantum dot device 200, in accordance with various embodiments.

In the base/fin arrangement 158 of FIG. 13, the quantum well stack 146 may be included in the fins 104, but not in the base 102. The semiconductor substrate 144 may be included in the base 102, but not in the fins 104. Manufacturing of the base/fin arrangement 158 of FIG. 13 may include fin etching through the quantum well stack 146, stopping when the semiconductor substrate 144 is reached.

In the base/fin arrangement 158 of FIG. 14, the quantum well stack 146 may be included in the fins 104, as well as in a portion of the base 102. A semiconductor substrate 144 may be included in the base 102 as well, but not in the fins 104. Manufacturing of the base/fin arrangement 158 of FIG. 14 may include fin etching that etches partially through the quantum well stack 146, and stops before the semiconductor substrate 144 is reached. FIG. 15 illustrates a particular embodiment of the base/fin arrangement 158 of FIG. 14. In the embodiment of FIG. 15, the quantum well stack 146 of FIG. 7 is used; the fins 104 include the barrier layer 154-1, the quantum well layer 152, and the barrier layer 154-2, while the base 102 includes the buffer layer 176 and the semiconductor substrate 144.

In the base/fin arrangement 158 of FIG. 16, the quantum well stack 146 may be included in the fins 104, but not the base 102. The semiconductor substrate 144 may be partially included in the fins 104, as well as in the base 102. Manufacturing the base/fin arrangement 158 of FIG. 16 may include fin etching that etches through the quantum well stack 146 and into the semiconductor substrate 144 before stopping. FIG. 17 illustrates a particular embodiment of the base/fin arrangement 158 of FIG. 16. In the embodiment of FIG. 17, the quantum well stack 146 of FIG. 7 is used; the fins 104 include the quantum well stack 146 and a portion of the semiconductor substrate 144, while the base 102 includes the remainder of the semiconductor substrate 144.

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 18, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 18. FIG. 19 illustrates a particular embodiment of the base/fin arrangement 158 of FIG. 18. In FIG. 19, the quantum well stack 146 is included in the tapered fins 104 while a portion of the semiconductor substrate 144 is included in the tapered fins and a portion of the semiconductor substrate 144 provides the base 102.

Example Gate Arrangements with Side and Center Screening Gates

Figure 20A:
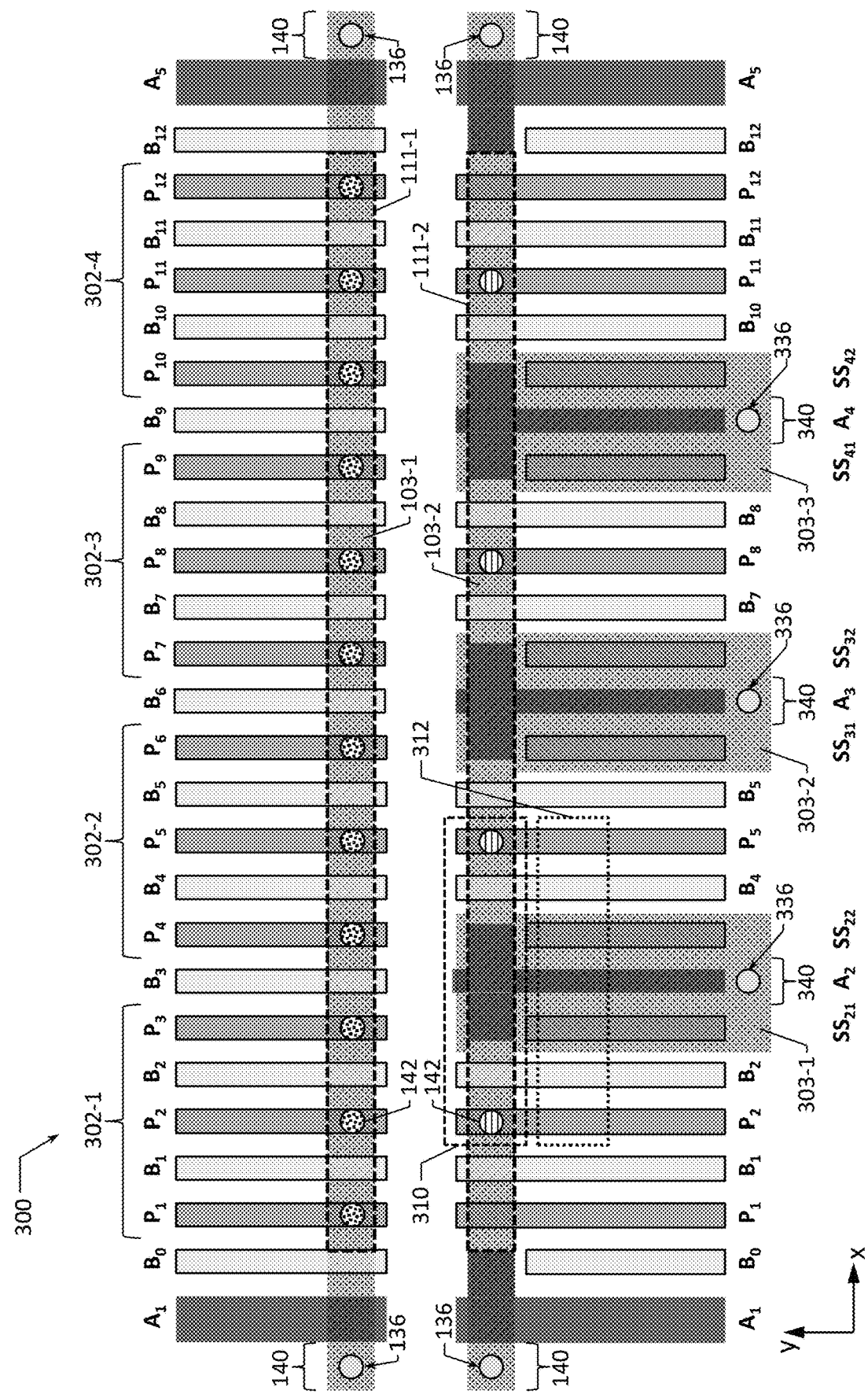
FIGS. 20A-20D are top-down views of a portion of different example quantum dot devices with side screening gates, in accordance with various embodiments.

FIGS. 20A-20D are top-down views of a portion of different example quantum dot devices 300 with side screening gates, in accordance with various embodiments. The views of FIGS. 20A-20D are similar to the top-down views of FIGS. 4 and 12, except that they are shown for examples of quantum dot devices with more gates than just the five gates for each of the two quantum dot formation regions 111 shown in the examples of FIGS. 4 and 12. Similar to FIGS. 4 and 12, the views of FIGS. 20A-20D illustrate two quantum dot formation regions 111—a quantum dot formation region 111-1 for the active gates and a quantum dot formation region 111-2 for the read gates. In order to not clutter the drawings, only FIG. 20A illustrates the labels 111-1 and 111-2 and also illustrates a horizontal rectangular contour enclosing the approximate boundaries of the quantum dot formation regions 111-1 and 111-2, but in all further illustrations showing gate arrangements of side and/or center screening gates the same holds—the quantum dot formation region 111-1 for the active gates is along a line of active quantum dots 142 shown in the illustrations (e.g., at the upper half of the page of the drawings of FIGS. 20A-20D) and the quantum dot formation region 111-2 for the read gates is along a line of read quantum dots 142 shown in the illustrations (e.g., at the lower half of the page of the drawings of FIGS. 20A-20D, the read quantum dots 142 shown in FIGS. 20A-20D with different patterns than active quantum dots 142).

In particular, FIGS. 20A-20D illustrate examples with the active gates including thirteen barrier gates, labeled as gates $B_0$ through $B_{12}$, twelve plunger gates, labeled as gates $P_1$ through $P_{12}$, and two accumulation gates, labeled as gates $A_1$ and $A_5$. In conventional implementations, barrier, plunger, and accumulation read gates have a one-to-one correspondence to the barrier, plunger, and accumulation active gates. Thus, in conventional implementations, for the active gates as shown in FIGS. 20A-20D, the read gates would also include thirteen barrier gates, twelve plunger gates, and two accumulation gates so that the active barrier gate $B_0$ would correspond to (e.g., be substantially opposite to) the read barrier gate $B_0$, the active plunger gate $P_1$ would correspond to (e.g., be substantially opposite to) the read plunger gate $P_1$, the active barrier gate $B_1$ would correspond to (e.g., be substantially opposite to) the read barrier gate $B_1$, the active plunger gate $P_2$ would correspond to (e.g., be substantially opposite to) the read plunger gate $P_2$, the active barrier gate $B_2$ would correspond to (e.g., be substantially opposite to) the read barrier gate $B_2$, and so on. In contrast to such conventional implementations, the read gates shown in the examples of FIGS. 20A-20D include less barrier and plunger gates than those of the active gates because some of the barrier and plunger read gates that would correspond to barrier and plunger active gates in conventional implementations have been replaced with additional accumulation gates (labeled with a letter "A" and corresponding digits) and side screening gates (labeled with letters "SS" and corresponding digits), as will be described in greater detail below.

Further regarding the notation used in FIGS. 20A-20D, alternating metal gate lines for barrier and plunger gates for the active gates are shown in different colors, which is done purely to ease the understanding by making the metal gate lines of the barrier gates stand out against the metal gate lines of the plunger gates. Metal gate lines for accumulation gates for the active gates are shown in yet another color. The same notation is used for the read gates, except that, although the barrier and plunger gates which are not replaced by accumulation and/or side screening gates are still labeled as corresponding barrier and plunger gates of the active gates, as will be explained above, some of them (e.g., the gates $B_0$ and $B_{12}$ of the read gates, or the gates $P_1$ and $P_{12}$ of the read gates) may not necessarily perform the same functionality as that of barrier and plunger gates. As is shown in FIGS. 20A-20D, during operation of the quantum dot device 300, the quantum dots 142 form under the active plunger gates within the quantum dot formation region 111-1 and under some of the read plunger gates within the quantum dot formation region 111-2.

A horizontal rectangular pattern over the active gates and extending along the quantum dot formation region 111-1 shown in FIGS. 20A-20D illustrates location of the trench 103-1 as described above, while a horizontal rectangular pattern over the read gates and extending along the quantum dot formation region 111-2 shown in FIGS. 20A-20D illustrates location of the trench 103-2 as described above (the trenches 103-1 and 103-2 only labeled in FIG. 20A in order to not clutter other drawings). Furthermore, using the same pattern in FIGS. 20A-20D but as vertical rectangular patterns for some of the read gates illustrates locations of trenches 303 similar to the trench 103-2 as described above but for the additional accumulation gates of the quantum dot device 300. For example, FIG. 20A illustrates a first additional trench 303-1 as a vertical rectangular pattern including the metal gate lines for the read gates $SS_{21}$, $A_2$, and $S_{22}$, a second additional trench 303-2 as a vertical rectangular pattern including the metal gate lines for the read gates $SS_{31}$, $A_3$, and $S_{32}$, and a third additional trench 303-3 as a vertical rectangular pattern including the metal gate lines for the read gates $SS_{41}$, $A_4$, and $S_{42}$. Although descriptions of the embodiments of additional accumulation gates as well as side and center screening gates are provided with respect to the trenches 103 and 303, these descriptions are equally applicable to embodiments where the trenches 103 and 303 are replaced by fins, with differences as explained with reference to FIGS. 1-4 (i.e., trench embodiments) and FIGS. 10-12 (i.e., fin embodiments).

Besides schematically illustrating the various gates and the two quantum dot formation regions 111, the views of FIGS. 20A-20D do not show various materials or other elements shown in the views of FIGS. 4 and 12 in order to not clutter the drawing. However, any of the quantum dot devices 300, shown in FIGS. 20A-20D may be implemented as the quantum dot device 100, shown in FIGS. 1-4, or the quantum dot device 200, shown in FIGS. 10-12, except for the differences described herein.

Turning to the details of the gate arrangement shown in FIG. 20A, for the active gates (i.e., the ones shown in the upper half of the page of the drawing), two accumulation gates may be the outermost gates of the plurality of gates provided in the active trench 103-1 (similar to the outermost gates 106-1 and 106-3 of the embodiment illustrated in FIG. 2), labeled as gates $A_1$ and $A_5$. Similar to how it was described above for the outermost gates 106-1 and 106-3 of the embodiment illustrated in FIG. 2, the active accumulation gates $A_1$ and $A_5$ may have a greater length (a dimension measured along the x-axis of FIG. 20A) than the inner active gates of the quantum dot device 300. The inner gates for the active trench 103-1 are all of the barrier and plunger gates between the accumulation gates $A_1$ and $A_5$. Similar to how it was described above for the outermost gates 106-1 and 106-3 of the embodiment illustrated in FIG. 2, the active accumulation gates $A_1$ and $A_5$ of the quantum dot device 300 may be adjacent to respective doped regions 140 which are shown in FIG. 20A on the left side and the right side of the active trench 103-1. In other words, the active accumulation gates $A_1$ and $A_5$ of the quantum dot device 300 may be over respective portions of the quantum well stack 146 adjacent to respective doped regions 140. The same applies to the read accumulation gates $A_1$ and $A_5$ provided in the read trench 103-2 of the quantum dot device 300—they are the outermost gates, and may be adjacent to respective doped regions 140, shown in FIG. 20A on the left side and the right side of the read trench 103-2, and may have a greater length than at least some of the inner read gates of the quantum dot device 300. FIG. 20A further illustrates conductive vias 136 as examples of conductive contacts to the doped regions 140, as described above. Although illustrates in the present drawings of FIGS. 20 and 23 as being adjacent to the outermost accumulation gates $A_1$ and $A_5$, in other embodiments, the doped regions 140 corresponding to the accumulation gates $A_1$ and $A_5$ may be not necessarily adjacent to these respective gates, as long as the doped regions 140 would be under respective portions of the trench 103.

In stark contrast to conventional implementations, FIG. 20A illustrates that the quantum dot device 300 may further include additional accumulation gates in the read trench 103-2, between the outermost read accumulation gates $A_1$ and $A_5$. Such additional read accumulation gates are shown in the example of FIG. 20A as read accumulation gates $A_2$, $A_3$, and $A_4$, although in other embodiments the number and the locations of the additional read accumulation gates may be different from what is shown in FIG. 20, as long as such additional read accumulation gates are provided within the read trench 103-2 between the outermost read accumulation gates.

As shown in FIG. 20A, similar to the outermost read accumulation gates $A_1$ and $A_5$, the additional read accumulation gates $A_2$, $A_3$, and $A_4$, may have a greater length (a dimension measured along the x-axis of FIG. 20A) than read gates which are not accumulation gates. The descriptions of the gates 106/108 provided with reference to FIGS. 1-4 are applicable to the additional read accumulation gates $A_2$, $A_3$, and $A_4$ (e.g., how these gates have portions of gate metal in the read trench 103-2) and, therefore, in the interest of brevity, are not repeated. Thus, each of the outermost read accumulation gates $A_1$ and $A_5$ and the additional read accumulation gates $A_2$, $A_3$, and $A_4$ may extend to the row of the quantum dot formation region 111-2, e.g., extend substantially perpendicular to the row, in the sense that they have gate metal portions extending substantially perpendicular to the row in an x-y plane of the example coordinate system shown. As also shown in FIG. 20A, similar to the outermost read accumulation gates $A_1$ and $A_5$, each of the additional read accumulation gates $A_2$, $A_3$, and $A_4$ is electrically coupled to a respective doped region 340, which are additional doped regions provided in the quantum well stack 146 of the quantum dot device 300. Locations of three such doped regions 340 are indicated at the bottom of FIG. 20A, with conductive vias 336 being examples of conductive contacts to the doped regions 140. The explanations of the doped regions 140 and the conductive vias 136, provided with reference to FIGS. 1-4 are applicable to, respectively, the doped regions 340 and the conductive vias 336 and, therefore, in the interest of brevity, are not repeated. Similar to the doped regions 140, the doped regions 340 may serve as reservoirs of charge carriers for the quantum dot device 300. In some embodiments, an interface material 141 may be disposed at a surface of a doped region 340 to facilitate electrical coupling between a conductive contact (e.g., a conductive via 336) and the doped region 340.

In order to route the metal gate of the additional read accumulation gates towards their respective doped regions 340, the read trench 103-2 is joined by additional trenches 303, as shown in FIG. 20A. Thus, each of the trenches 303 is continuous with a portion of the read trench 103-2. Each of the outermost read accumulation gates $A_1$ and $A_5$ and the additional read accumulation gates $A_2$, $A_3$, and $A_4$ may extend to the row of the quantum dot formation region 111-2, e.g., extend substantially perpendicular to the row, in the sense that they have gate metal portions extending substantially perpendicular to the row in an x-y plane of the example coordinate system shown. The outermost accumulation gates of the quantum dot device 300 may also have gate metal portions extending substantially perpendicular to the row of the quantum dot formation region 111-2 in an x-y plane of the example coordinate system shown. Thus, in some embodiments, projections of gate metals of individual ones of the read accumulation gates of the quantum dot device 300 (i.e., the outermost read accumulation gates and the additional read accumulation gates) on a plane that includes at least a portion of the row of the quantum dot formation region 111-2 (i.e., an x-y plane) may be substantially perpendicular to the row. What may be different for the outermost read accumulation gates and the additional read accumulation gates is that the gate metal of the additional read accumulation gates may extend down to the quantum well stack 146 along its length (extending along the y-direction of the example coordinate system shown), i.e., within the trench 103-2 and within the respective trenches 303, in order to reach the respective doped regions 340, whereas the gate metal of the outermost read accumulation gates may only include a portion that extends down to the quantum well stack 146 within the trench 103-2, but not outside of the trench 103-2, as described further below with reference to FIGS. 21A-21B.

Figure 21A:
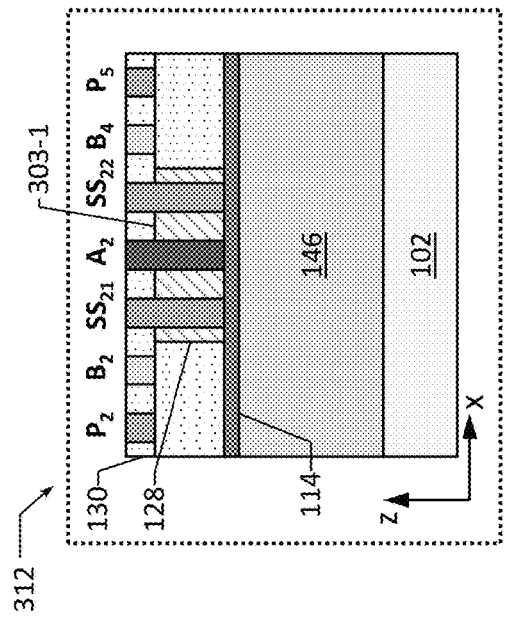
FIGS. 21A-21B are cross-sectional views of a portion of an example quantum dot device with trenches, with cross-sections taken along a trench defining a quantum dot formation region and a side screening gate, respectively, in accordance with various embodiments.
Figure 21B:
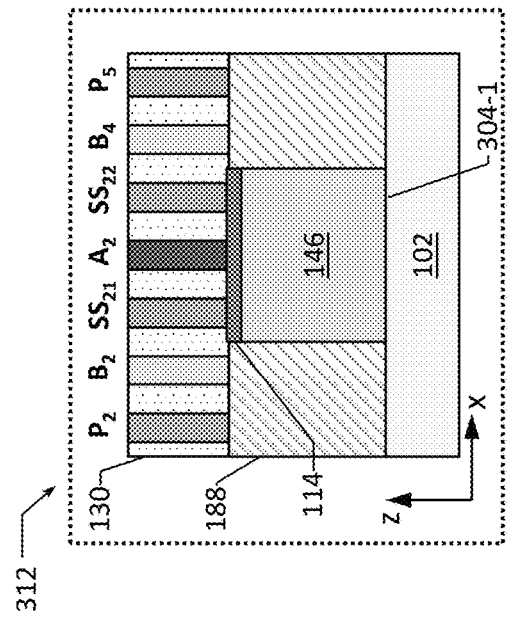

FIG. 20A further illustrates that one or more side screening gates may further be provided within a given trench 303, e.g., two side screening gates may be provided for a given additional read accumulation gate, one on each side of the additional read accumulation gate. For example, side screening gates $SS_{21}$ and $SS_{22}$ may be provided on the opposite sides of the additional read accumulation gate $A_2$ within the trench 303-1, side screening gates $SS_{31}$ and $SS_{32}$ may be provided on the opposite sides of the additional read accumulation gate $A_3$ within the trench 303-2, and side screening gates $SS_{41}$ and $SS_{42}$ may be provided on the opposite sides of the additional read accumulation gate $A_4$ within the trench 303-3, as shown in FIG. 20A. Such side screening gates may include gate metal material that extends down to the quantum well stack 146, similar to the additional read accumulation gates of the quantum dot device 300. Thus, gate metal of the side screening gates of the quantum dot device 300 may be at least partially within the respective trench 303. Further details of the additional read accumulation gates and side screening gates are provided by FIGS. 21A-21B, illustrating cross-sectional views of a portion of an example quantum dot device with trenches (e.g., the quantum dot device 300 with trenches 103 and 303), with cross-sections taken along a trench defining a quantum dot formation region and a side screening gate, respectively, in accordance with various embodiments. In particular, FIG. 21A illustrates a cross-sectional side view corresponding to the top-down view of a portion 310 (indicated in FIG. 20A within a dashed block) of the quantum dot device 300, while FIG. 21B illustrates a cross-sectional side view corresponding to the top-down view of a portion 312 (indicated in FIG. 20A within a dotted block) of the quantum dot device 300.

As shown in FIG. 21A, along the trench 103-2, the additional read accumulation gate $A_2$ may be wider than the adjacent barrier and plunger gates $P_2$, $B_2$, $B_4$, and $P_5$. As also shown in FIG. 21A, gate metals of each of the additional read accumulation gate and the adjacent barrier and plunger gates may extend down to the quantum well stack 146, possibly with a gate dielectric 114 between the bottoms of these gates in the trench 103-2 and the quantum well stack 146. Similar to the illustrations of the quantum dot device 100 shown in FIGS. 1-4, portions of the gate metals of the additional read accumulation gate and the adjacent barrier and plunger gates within the trench 103-2 may be at least partially enclosed with an insulating material 128 (i.e., the trench 103-2 is a trench within the insulating material 128), disposed above the quantum well stack 146. The intervening insulating material 130 may provide electrical isolation between various gates, e.g., between the additional read accumulation gate and the adjacent barrier and plunger gates, within the trench 103-2 (as described above with reference to FIGS. 1 and 3). Although not specifically shown in FIG. 21 in order to not clutter the drawings, spacers 134, described above, may also be present and help provide electrical isolation between various gates.

The cross-sectional side view of FIG. 21A does not show any side screening gates because they do not reach and do not extend into the read trench 103-2. Such side screening gates are, however, shown in the cross-sectional side view of FIG. 21B. As shown in FIG. 21B, outside of the trench 103-2, gate metals of various barrier and plunger gates do not extend down to the quantum well stack 146, but, rather, are isolated from the quantum well stack 146 by the intervening isolation material 130. In contrast, gate metals of the additional read accumulation gate $A_2$ and of the corresponding side screening gates $SS_{21}$ and $SS_{22}$ may extend down to the quantum well stack 146, enclosed by the insulating material 128 within the trench 303-1, as shown in FIG. 21B. The intervening isolation material 130 similarly provides electrical isolation between gate metals of various gates outside of the trench 103-2, e.g., between the additional read accumulation gate and the adjacent barrier and plunger gates.

Various side screening gates may be electrically isolated from their respective accumulation gates and other gates of the device 300, e.g., as shown in FIGS. 21A-21B. That can also be seen in FIG. 20A in that the side screening gates do not overlap with the additional read accumulation gates or other gates, or with the row of the quantum dot formation region 111-2. Various side screening gates of the quantum dot device 300 may be coupled to one or more DC sources (e.g., voltage sources). Applying DC signals (e.g., DC voltages) to the side screening gates may help with improving the electrostatics so that every accumulation region (i.e., a portion of the quantum well stack 146 under additional read accumulation gate within a respective the trench 103-2) is electrically isolated from other accumulation regions. In this manner, multiple SET detectors (or, simply, SETs) may be formed in the quantum dot device 300. For example, the read accumulation gate $A_1$ may be a first source or drain (S/D) terminal and the read accumulation gate $A_2$ may be a second S/D terminal of a first SET, the read accumulation gate $A_2$ may also serve as a first S/D terminal of a second SET, where a second S/D terminal of the second SET may be the read accumulation gate $A_3$. Continuing in this manner, the read accumulation gate $A_3$ may also serve as a first S/D terminal of a third SET, where a second S/D terminal of the third SET may be the read accumulation gate $A_4$, and the read accumulation gate $A_4$ may also serve as a first S/D terminal of a fourth SET, where a second S/D terminal of the fourth SET may be the read accumulation gate $A_5$. In this manner, some or all of the additional read accumulation gates of the quantum dot device 300 may be shared S/D terminals of different SETs. Employing multiple SETs for the quantum dots 142 formed along the quantum dot formation region 111-2 may increase flexibility for independent qubit readout in the quantum dot device 300.

The association between the read quantum dots (e.g., the quantum dots 142 under the trench 103-2) and the active quantum dots (e.g., the quantum dots 142 under the trench 103-1) in the quantum dot device 300 may be different than that in the quantum dot device 100. For example, the quantum dot 142 of the first SET of the quantum dot device 300 (i.e., the quantum dot 142 under the read plunger gate $P_2$ in the illustration of FIG. 20A) may be used as a read quantum dot not only for a single active quantum dot 142 closest to it (e.g., the quantum dot 142 under the active plunger gate $P_2$), but for a group 302-1 of a plurality of active quantum dots that may include, e.g., three quantum dots under, respectively, active plunger gates $P_1$, $P_2$, and $P_3$. Thus, the quantum dot 142 of the first SET of the quantum dot device 300 may be used as a read quantum dot in the sense that this quantum dot 142 may sense the quantum state of the quantum dots 142 under the active plunger gates $P_1$, $P_2$, and $P_3$ in the trench 103-1 by detecting the electric field generated by the charge(s) in the group 302-1 of the quantum dots 142 under the trench 103-1, and may convert the quantum state of the quantum dots 142 in the group 302-1 into electrical signals that may be detected by the first SET associated with the trench 103-2. Thus, each quantum dot 142 of the group 302-1, under the trench 103-1, may be read by its corresponding quantum dot 142 of the first SET under the trench 103-2. Analogous applies to reading of the states of other groups 302 of the quantum dots 142 under the active trench 103-1. For example, the quantum dot 142 of the second SET of the quantum dot device 300 (i.e., the quantum dot 142 under the read plunger gate $P_5$ in the illustration of FIG. 20A) may be used as a read quantum dot not only for a single active quantum dot 142 closest to it (e.g., the quantum dot 142 under the active plunger gate $P_5$), but for a group 302-2 of a plurality of active quantum dots that may include, e.g., three quantum dots under, respectively, active plunger gates $P_4$, $P_5$, and $P_6$. Thus, the quantum dot 142 of the second SET of the quantum dot device 300 may be used as a read quantum dot in the sense that this quantum dot 142 may sense the quantum state of the quantum dots 142 under the active plunger gates $P_4$, $P_5$, and $P_6$ in the trench 103-1 by detecting the electric field generated by the charge(s) in the group 302-2 of the quantum dots 142 under the trench 103-1, and may convert the quantum state of the quantum dots 142 in the group 302-2 into electrical signals that may be detected by the second SET associated with the trench 103-2. Thus, each quantum dot 142 of the group 302-2, under the trench 103-1, may be read by its corresponding quantum dot 142 of the second SET under the trench 103-2. The same applies to reading of the quantum dots 142 of the groups 302-3 and 302-4 of the example shown in FIG. 20A. In this manner, the quantum dot device 300 enables both quantum computation and the ability to read the results of a quantum computation.

Figure 20B:
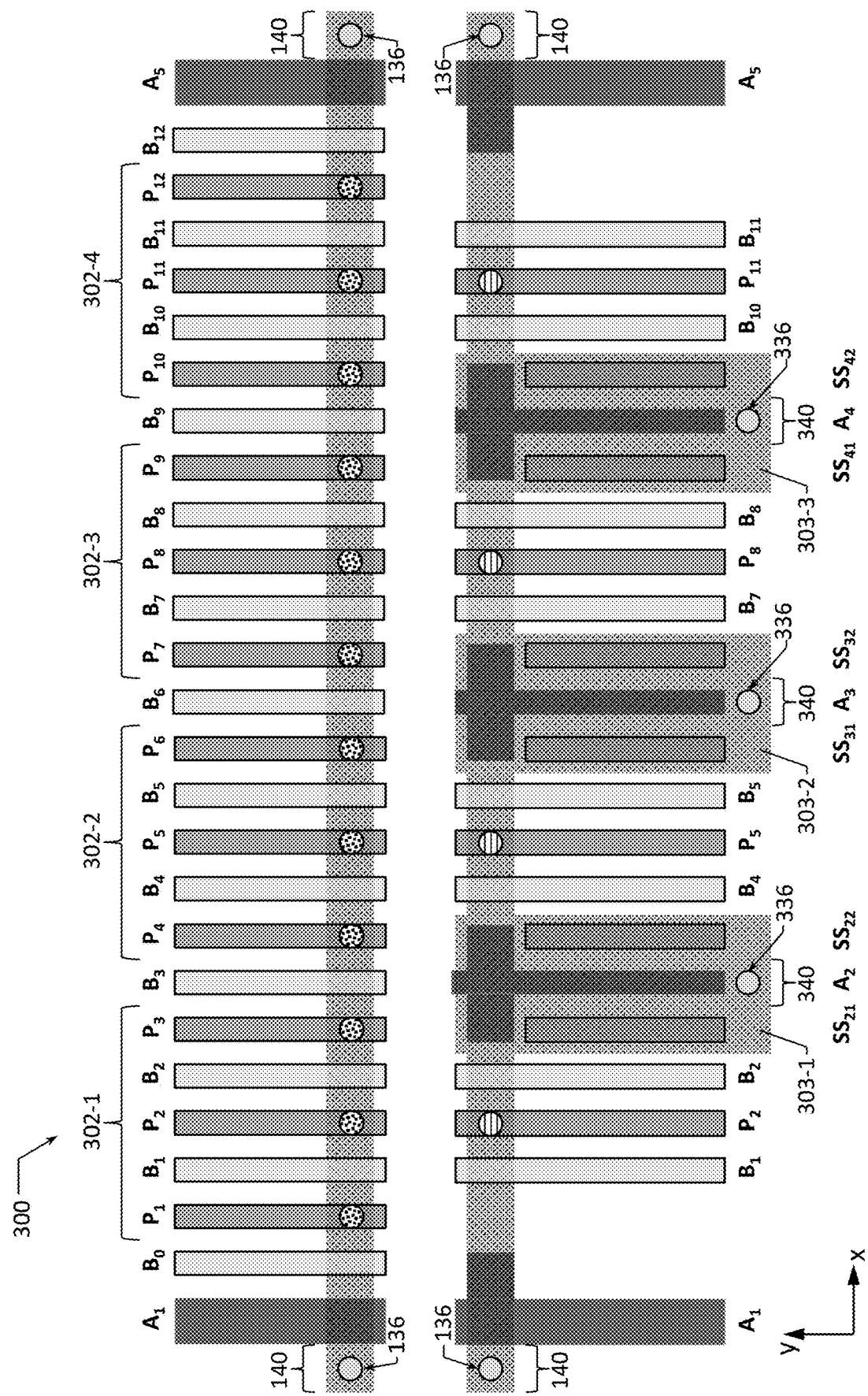
Figure 20C:
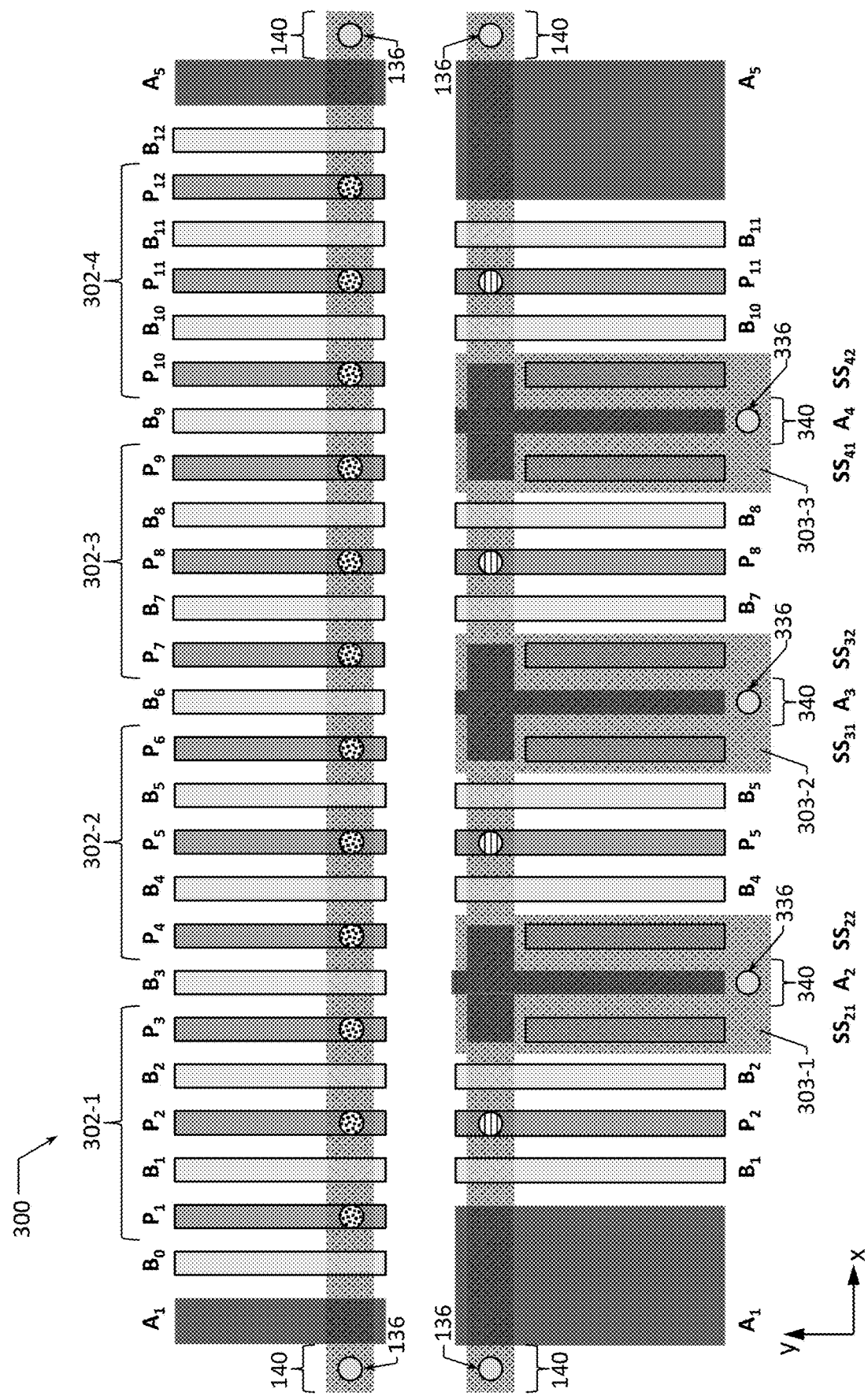
Figure 20D:
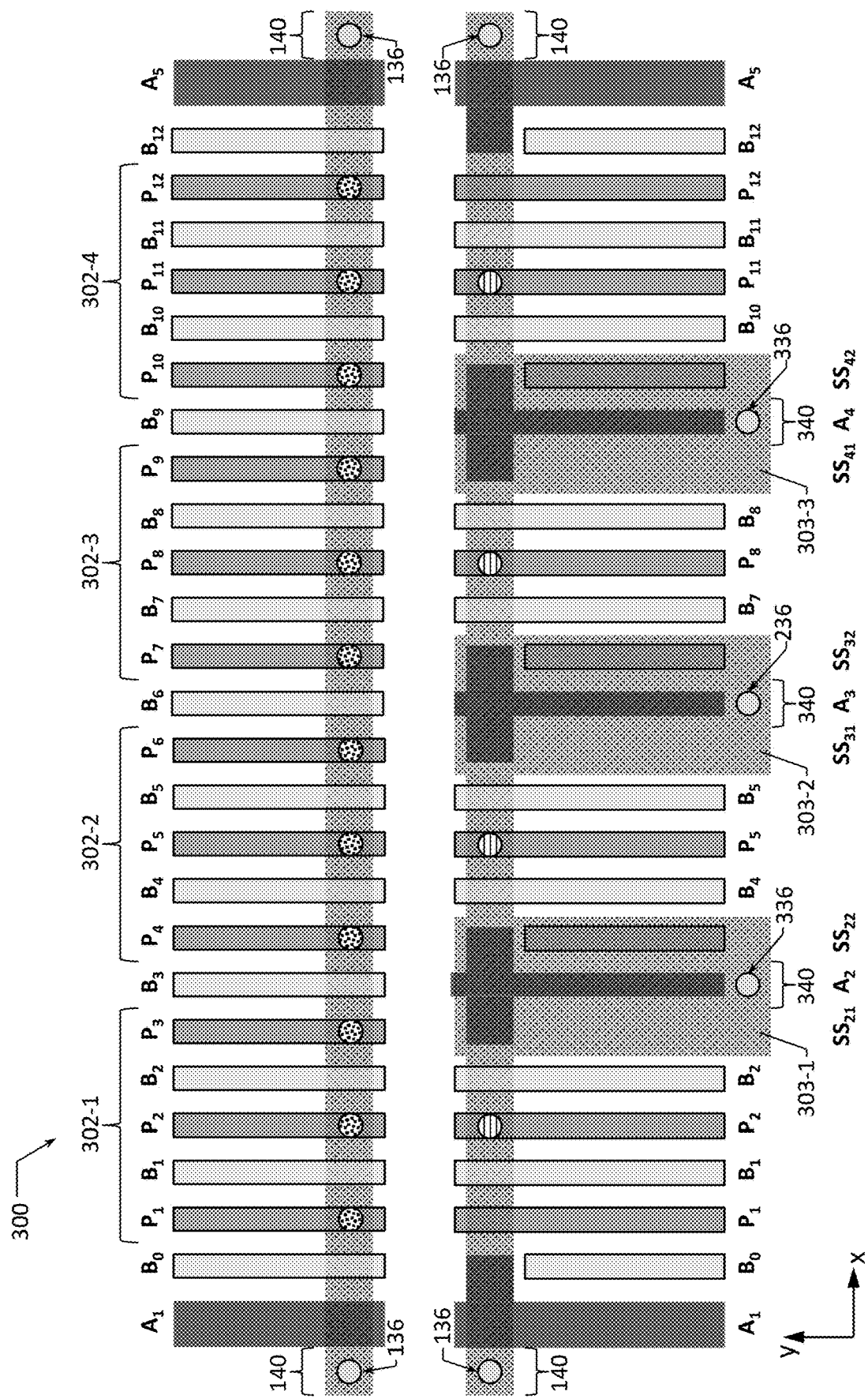

FIGS. 20B-20D illustrate further variations of the quantum dot device 300 as described above. Comparison of FIGS. 20A-20D reveals that they are similar to one another and, therefore, even though some elements labeled in FIG. 20A may not be labeled in FIGS. 20B-20D in order to not clutter the drawings, descriptions provided with reference to the quantum dot device 300 of FIG. 20A are applicable to FIGS. 20B-20D except for the differences described below.

FIG. 20B illustrates an embodiment of the quantum dot device 300 where the gates $B_0$, $P_1$, $P_{12}$, and $B_{12}$ shown in the quantum dot device 300 of FIG. 20A may be absent. In the most general case, just having one plunger gate between each pair of adjacent accumulation gates in the read trench 103-2 (e.g., a read plunger gate $P_2$ between read accumulation gates $A_1$ and $A_2$, or a read plunger gate $P_{11}$ between read accumulation gates $A_4$ and $A_5$) could be sufficient for the quantum dot 142 formed under that plunger gate to sense the states of the active quantum dots of the corresponding group 302 under the active trench 103-1. Therefore, although not specifically illustrated in the present drawings, such embodiments of the quantum dot device 300 are also within the scope of the present disclosure. However, one or more barrier gates provided next to such a plunger gate could improve localization of the read quantum dot 142. Therefore, even though FIG. 20B illustrates two read barrier gates per a read plunger gate (i.e., one barrier gate on each side), further embodiments of the quantum dot device 300 may include only one of the two read barrier gates per read plunger gate. By excluding from the illustration of FIG. 20B the outermost read barrier gates $B_0$ and $B_{12}$, FIG. 20B shows that, in some embodiments, the outermost read barrier gates $B_0$ and $B_{12}$ may not be needed if the side screening gates SS21 and SS42 can provide sufficient electrical isolation.

FIG. 20C illustrates an embodiment of the quantum dot device 300 similar to that of FIG. 20B (therefore, all of the descriptions provided with reference to FIG. 20B are applicable to FIG. 20C), except that the outermost read accumulation gates $A_1$ and $A_5$ are shown to be wider (in a direction of the x-axis of the example coordinate system shown). Although not specifically shown in the present drawings, in other variations of the embodiment of FIG. 20C, instead or in addition to the outermost read accumulation gates $A_1$ and $A_5$ being wider as shown in FIG. 20C, the outermost read accumulation gates $A_1$ and $A_5$ may be moved closer to the other gates, and/or their associated gate metal within the trench 103-2 may extend towards, respectively, the read barrier gates $B_1$ and $B_{11}$. Such an embodiment may be advantageous in terms of having less contact/gate structures, and therefore pads for interconnects to bias and control.

FIG. 20D illustrates an embodiment of the quantum dot device 300 where, within a given trench 303, an additional read accumulation gate only has one side screening gate associated therewith. In particular, FIG. 20D illustrates that only side screening gates $S_{22}$, $S_{32}$, and $S_{42}$ are included, and the side screening gates $S_{21}$, $S_{31}$, and $S_{41}$ shown in the quantum dot device 300 of FIG. 20A are absent. Although not specifically shown in the present drawings, in other embodiments of the quantum dot device 300, only the side screening gates $S_{21}$, $S_{31}$, and $S_{41}$ may be included and the side screening gates $S_{22}$, $S_{32}$, and $S_{42}$ may be absent, or, more generally, a given additional read accumulation gate of the quantum dot device 300 may include any number of one or more side screening gates as described herein, and different additional read accumulation gates provided over the read trench 103-2 may include different number and arrangements of the side screening gates as described herein. Furthermore, the embodiment shown in FIG. 20D may be combined with any of the embodiments described with reference to FIG. 20A, FIG. 20B, or FIG. 20C.

Figure 22A:
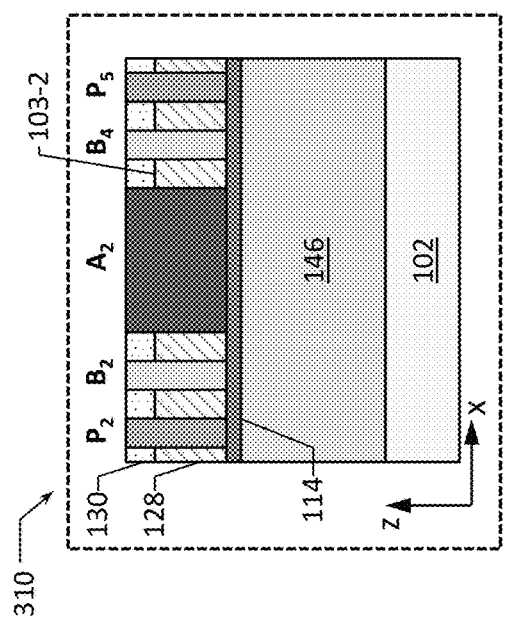
FIGS. 22A-22B are cross-sectional views of a portion of an example quantum dot device with fins, with cross-sections taken along a fin defining a quantum dot formation region and a side screening gate, respectively, in accordance with various embodiments.
Figure 22B:
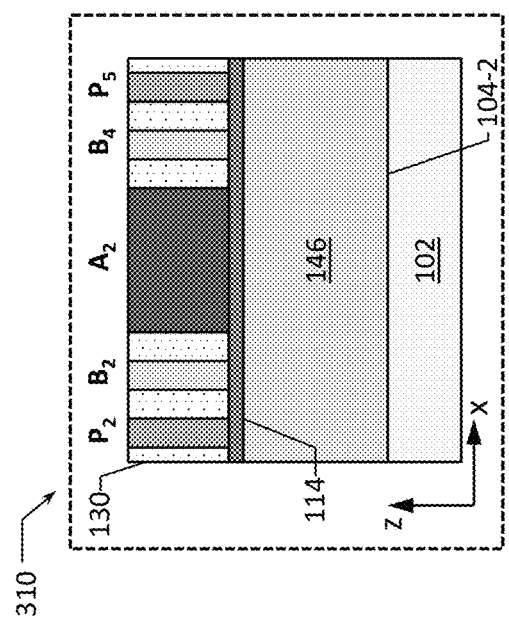

Various embodiments of the quantum dot device 300 were described above with reference to the trench embodiments as those described with reference to the quantum dot device 100 of FIGS. 1-4. However, descriptions provided with respect to the quantum dot device 300 are equally applicable to the fin embodiments as those described with reference to the quantum dot device 200 of FIGS. 10-12. FIGS. 22A-22B are cross-sectional views of a portion of an example quantum dot device 300 with fins, with cross-sections taken along a fin defining a quantum dot formation region and a side screening gate, respectively, in accordance with various embodiments. In particular, FIG. 22A illustrates a cross-sectional side view corresponding to the top-down view of a portion 310 of the quantum dot device 300 if the label of the trench 103-1 was replaced with a label of the fin 104-1, and the label of the trench 103-2 was replaced with a label of the fin 104-2, while FIG. 21B illustrates a cross-sectional side view corresponding to the top-down view of a portion 312 of such a quantum dot device 300 with fins 104 instead of trenches 103. In such a quantum dot device 300, the trenches 303 would also be replaced by corresponding fins 304.

The illustration of FIG. 22A is similar to that of FIG. 21A except that there is no insulating material 128 because there is no trench 103-2. Instead, the fin 104-2 is labeled. As shown in FIG. 22A, along the fin 104-2, the additional read accumulation gate $A_2$ may be wider than the adjacent barrier and plunger gates $P_2$, $B_2$, $B_4$, and $P_4$. As also shown in FIG. 22A, gate metals of each of the additional read accumulation gate and the adjacent barrier and plunger gates may extend down to the quantum well stack 146 formed into the fin 104-2, possibly with a gate dielectric 114 between the bottoms of these gates and the quantum well stack 146 in the fin 104-2. Similar to the illustrations of the quantum dot device 200 shown in FIGS. 10-12, the intervening insulating material 130 may provide electrical isolation between various gates, e.g., between the additional read accumulation gate and the adjacent barrier and plunger gates, over the fin 104-2 (as described above with reference to FIGS. 10 and 12).

The cross-sectional side view of FIG. 22A does not show any side screening gates because they do not reach the read fin 104-2. Such side screening gates are, however, shown in the cross-sectional side view of FIG. 22B. As shown in FIG. 22B, gate metals of the additional read accumulation gate $A_2$ and of the corresponding side screening gates $SS_{21}$ and $SS_{22}$ may extend down to the quantum well stack 146 extending into the fin 304-1. As further shown in FIG. 22B, the fin 304-1 may be enclosed on the sides by the isolation material 188, as described above (see, e.g., 10), the read plunger and barrier gates may extend down to the isolation material 188 (i.e., be aligned with the top of the fin 304-1), and, above the fin 304-1, various gates may be enclosed by the insulating material 130, described above. The intervening isolation material 130 provides electrical isolation between gate metals of various gates, e.g., between the additional read accumulation gate and the adjacent barrier and plunger gates. Thus, for the embodiments of the quantum dot device 300 with fins, various side screening gates may be electrically isolated from their respective accumulation gates and other gates of the device 300, e.g., as shown in FIGS. 22A-22B.

In further embodiments, any of the embodiments of the quantum dot device 300, described above, may be combined with any embodiment of one or more central screening gates as described with reference to FIGS. 23A-23K.

FIGS. 23A-23K illustrate further variations of the quantum dot device 300 as described above. Comparison of FIGS. 23A-23K and FIG. 20A reveals that FIGS. 23A-23K are similar to FIG. 20A and, therefore, even though some elements labeled in FIG. 20A may not be labeled in FIGS. 23A-23K in order to not clutter the drawings, descriptions provided with reference to the quantum dot device 300 of FIG. 20A are applicable to FIGS. 23A-23K except for the differences described below.

Figure 23A:
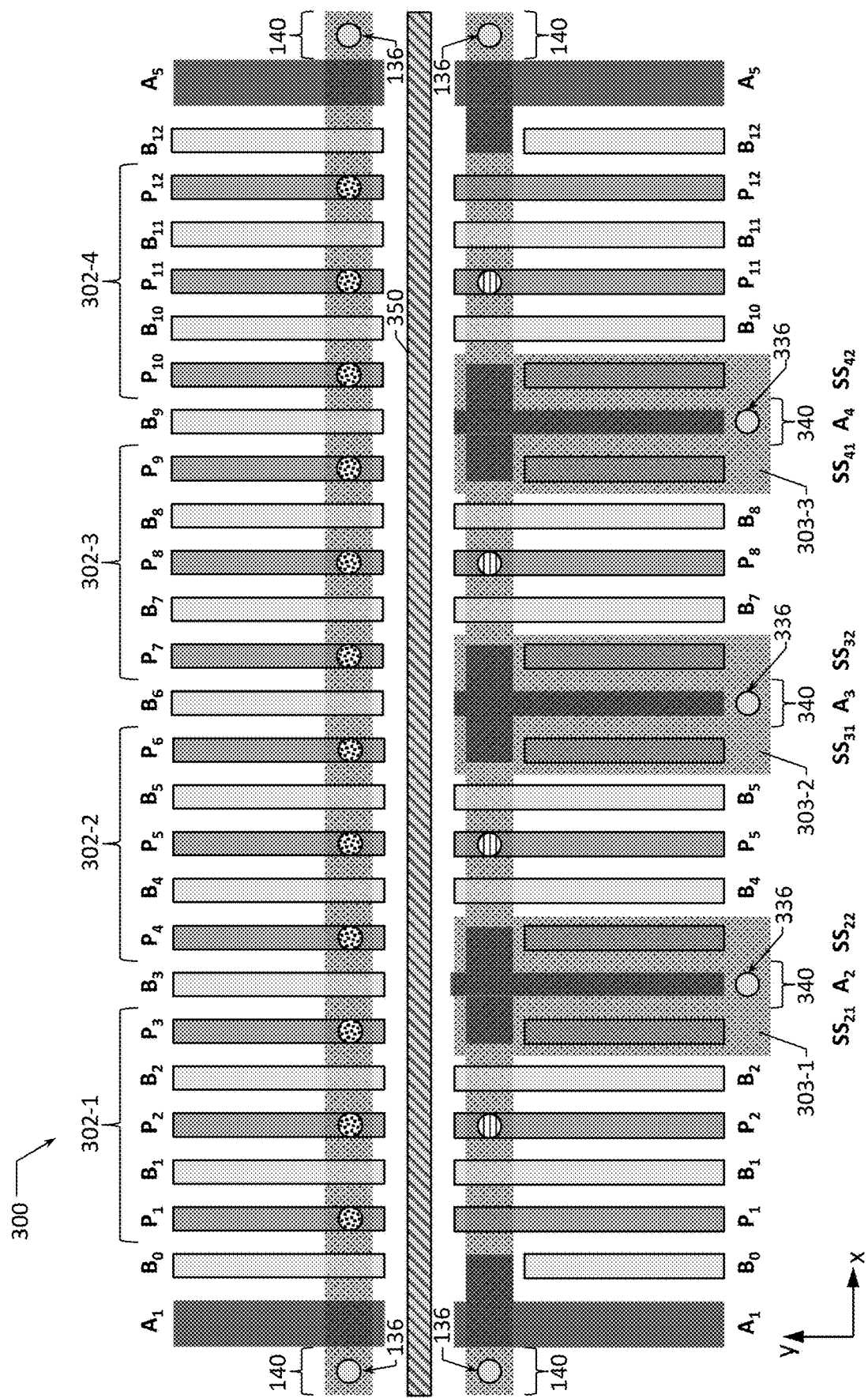
FIGS. 23A-23K are top-down views of a portion of different example quantum dot devices with side and center screening gates, in accordance with various embodiments.

FIG. 23A illustrates an embodiment of the quantum dot device 300 where a center screening gate 350 between the active quantum dot formation region 111-1 and the read quantum dot formation regions 111-2. The center screening gate 350 may be coupled to a signal source so that, e.g., an appropriate DC voltage, or a microwave pulse, may be applied to the center screening gate 350 to control the electrostatics of the array of active and/or read quantum dots 142.

Figure 23B:
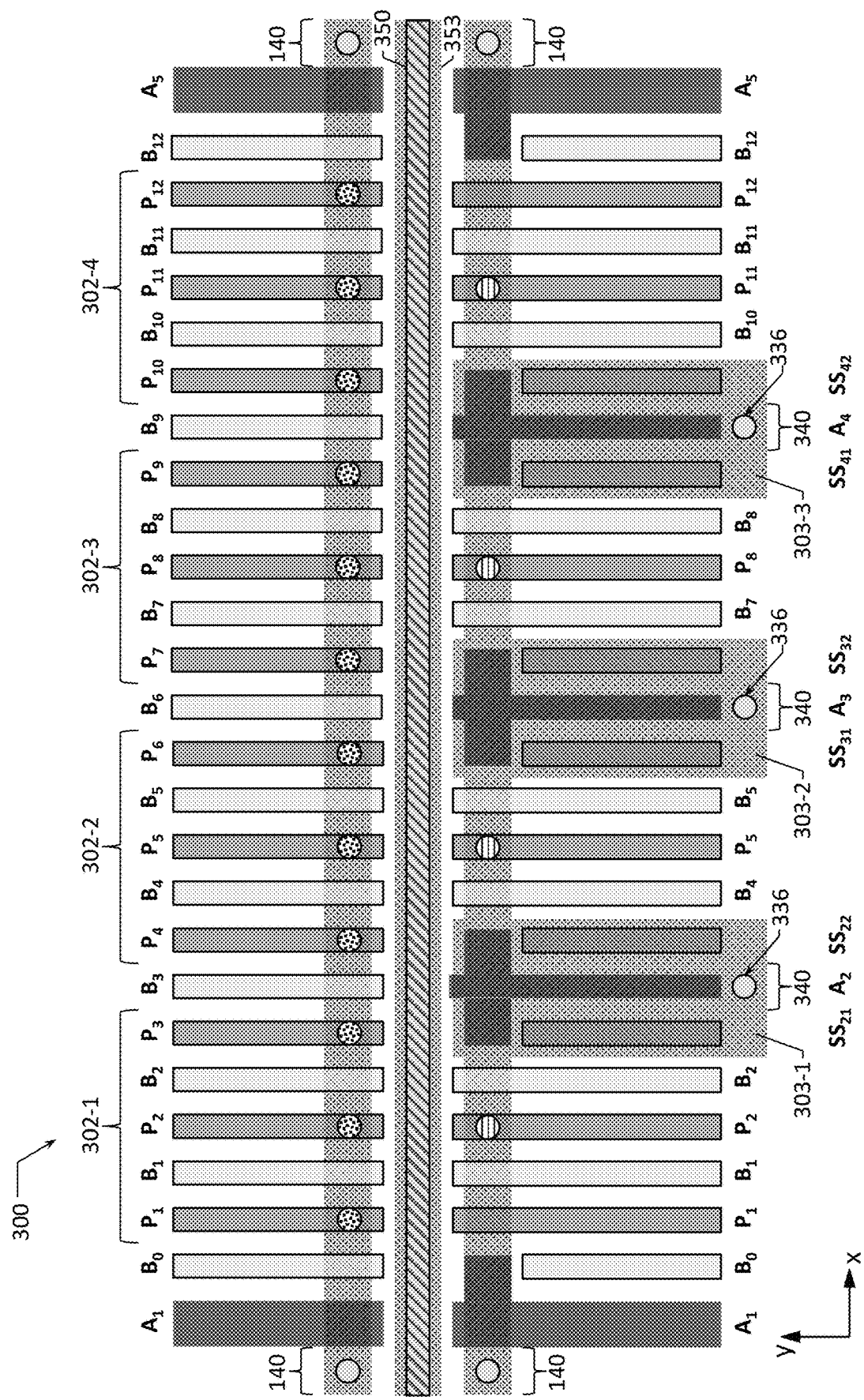
Figure 23C:
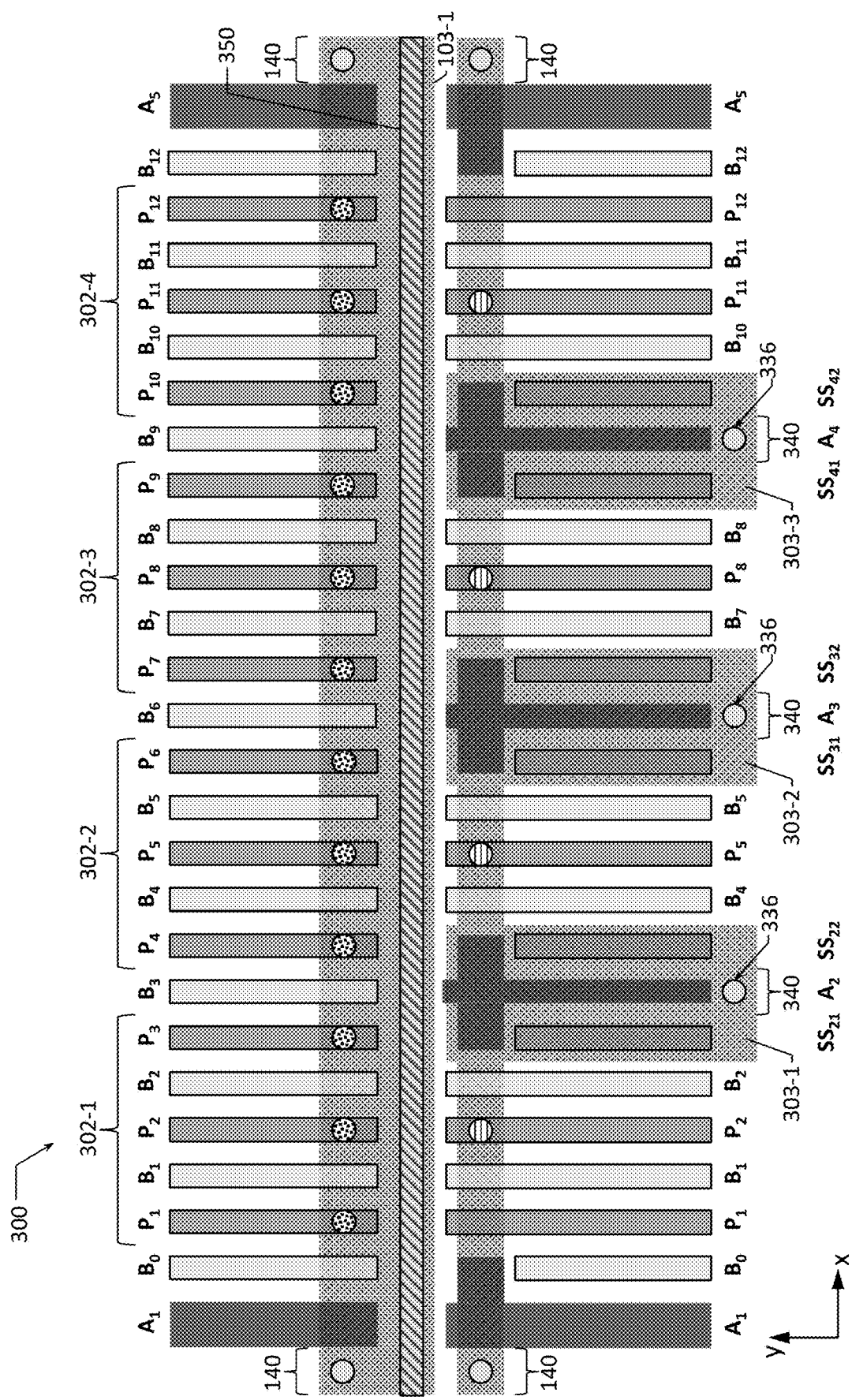
Figure 23D:
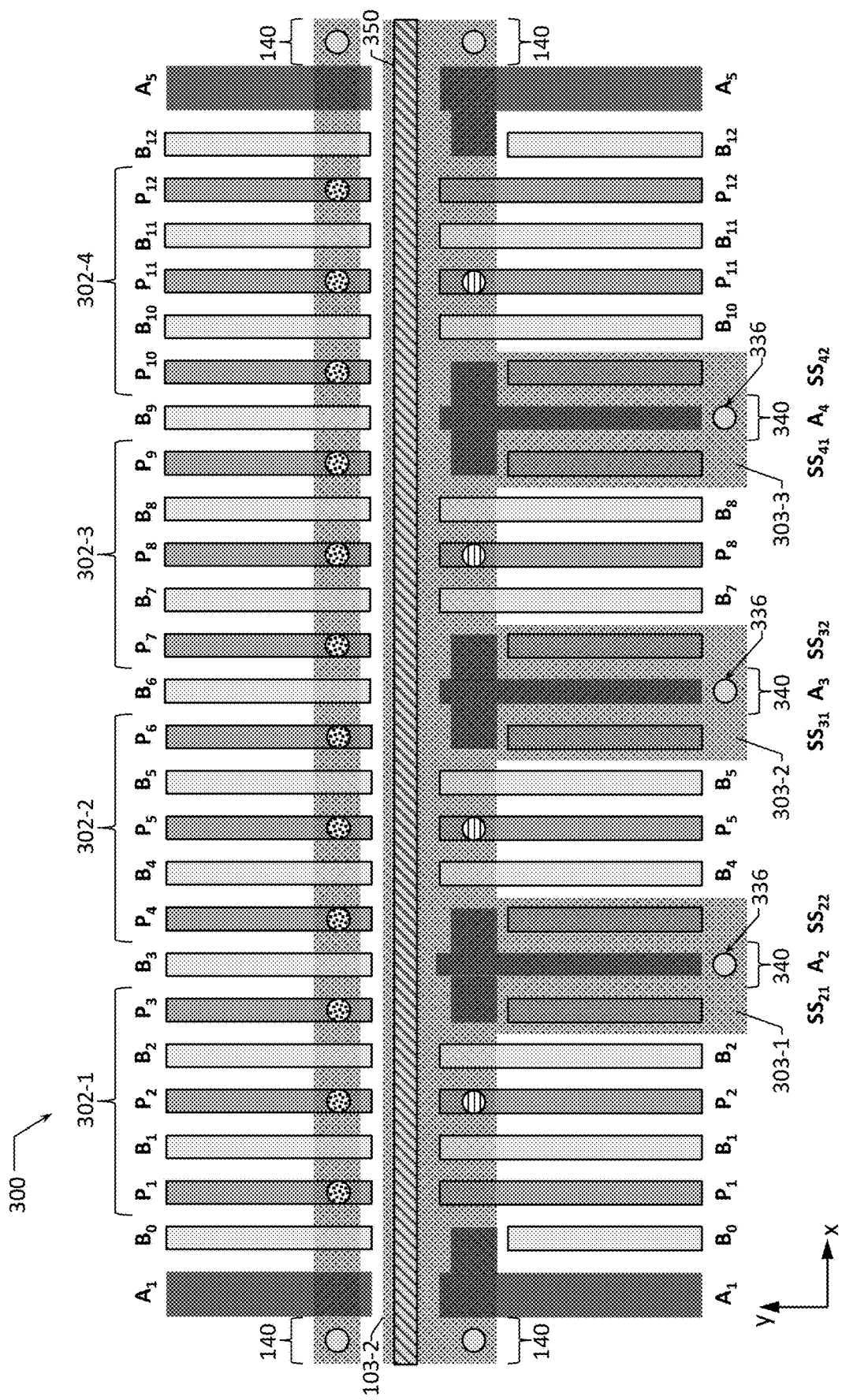
Figure 23E:
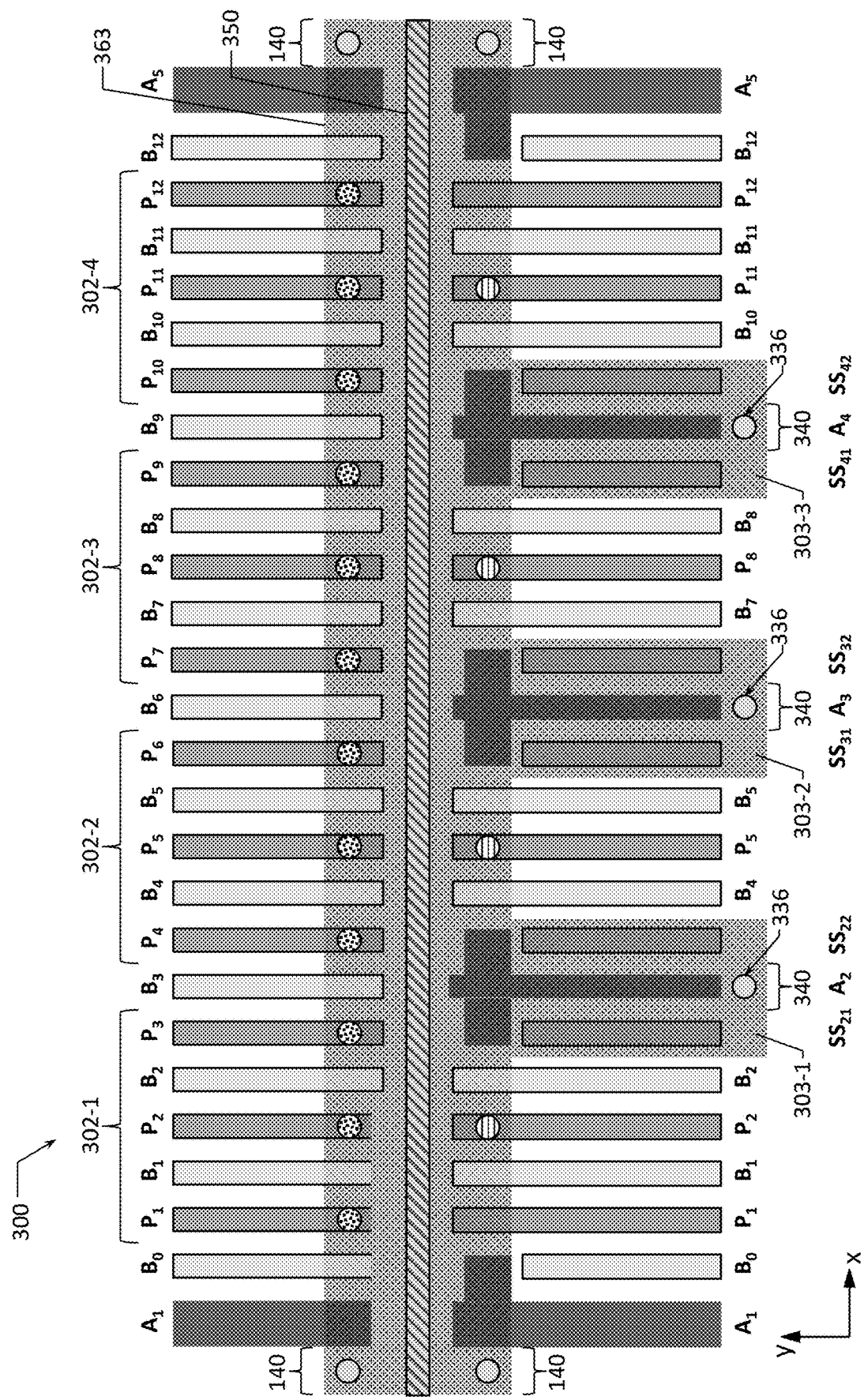

When the quantum dot device 300 is implemented with trenches as described with reference to FIGS. 1-4, there are several ways in how the center screening gate 350 may be implemented. In some embodiments, the center screening gate 350 may be implemented as a metal gate line above the level of the trenches 103-1 and 103-2, e.g., similar to the gate metal portions of the plunger and barrier gates shown in FIG. 21B. This may be advantageous in terms of easier manufacturing at the cost of less control/effect in the center screening gate 350 controlling the electrostatics of the array of active and/or read quantum dots 142. In other embodiments, the center screening gate 350 may be implemented in a trench that extends down to the quantum well stack 146 (similar to how the additional read accumulation gates extend to the quantum well stack 146, e.g., as is shown in FIG. 21B). Such an embodiment is shown in FIG. 23B, providing an illustration substantially the same as that of FIG. 23A, but further illustrating a trench 353. Descriptions of the additional read accumulation gates provided in additional trenches 303 are applicable to the center screening gate 350 provided in the trench 353 and, therefore, in the interests of brevity, are not repeated. Providing the center screening gate 350 within the trench 353 may be advantageous in terms of improved control of the electrostatics of the array of active and/or read quantum dots 142. In further embodiments, the active trench 103-1 may be extended (widened) so that the center screening gate 350 is implemented in the trench 103-1 that extends down to the quantum well stack 146. Such an embodiment is shown in FIG. 23C, providing an illustration substantially the same as that of FIG. 23A, but further illustrating that the active trench 103-1 may be widened to include the center screening gate 350. Providing the center screening gate 350 within the active trench 103-1 may be advantageous in terms of improved control of the electrostatics of the array of active quantum dots 142. In other embodiments, the read trench 103-2 may be extended (widened) so that the center screening gate 350 is implemented in the trench 103-2 that extends down to the quantum well stack 146. Such an embodiment is shown in FIG. 23D, providing an illustration substantially the same as that of FIG. 23A, but further illustrating that the read trench 103-2 may be widened to include the center screening gate 350. Providing the center screening gate 350 within the read trench 103-2 may be advantageous in terms of improved control of the electrostatics of the array of read quantum dots 142. In further embodiments, both the active trench 103-1 and the read trench 103-2 may be widened to merge into a single trench so that the center screening gate 350 is implemented in such a single trench that extends down to the quantum well stack 146. Such an embodiment is shown in FIG. 23E, providing an illustration substantially the same as that of FIG. 23A, but further illustrating that the active trench 103-1 and the read trench 103-2 are widened until they merge, thus forming a single wide trench 363, with the center screening gate 350 included in the trench 363. Providing the center screening gate 350 within the trench 363 that includes the active trench 103-1 and the read trench 103-2 as described herein may be advantageous in terms of improved control of the electrostatics of the array of active and read quantum dots 142. Descriptions analogous to the ones provided with respect to FIGS. 23A-23E, in particular descriptions of the central screening gates with respect to the trenches as described herein, are also applicable to the central screening gates of the other embodiments of FIG. 23, e.g., to the central screening gates of each of FIGS. 23F-23K. Furthermore, although FIGS. 23A-23E described the central screening gate 350 in context of the trench-based quantum dot devices, analogous descriptions are applicable to fin-based quantum dot devices, with modifications that would be apparent to a person of ordinary skill in the art based on the descriptions of the fin-based embodiments provided above.

Figure 23F:
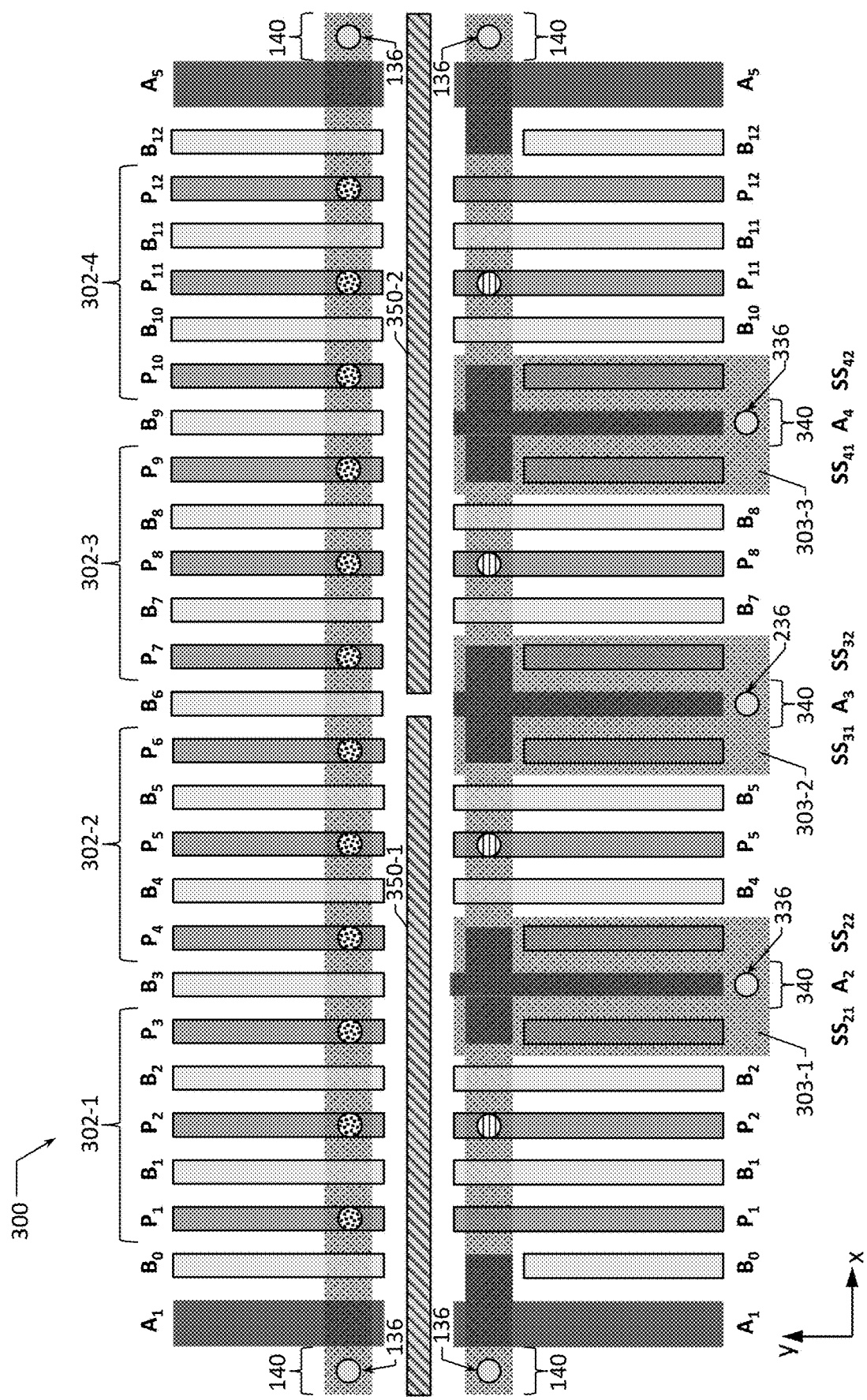

FIG. 23F illustrates an embodiment of the quantum dot device 300 similar to that shown in FIG. 23A, except that it illustrates that multiple center screening gates may be implemented in some embodiments, shown in FIG. 23F as a first central screening gate 350-1 and a second central screening gate 350-1. In other embodiments, more than two central screening gates 350 may be implemented in a similar manner. Increasing the number of central screening gates 350, where each may be coupled to a respective signal source, may further increase control of the electrostatics of the array of active and/or read quantum dots 142.

Figure 23G:
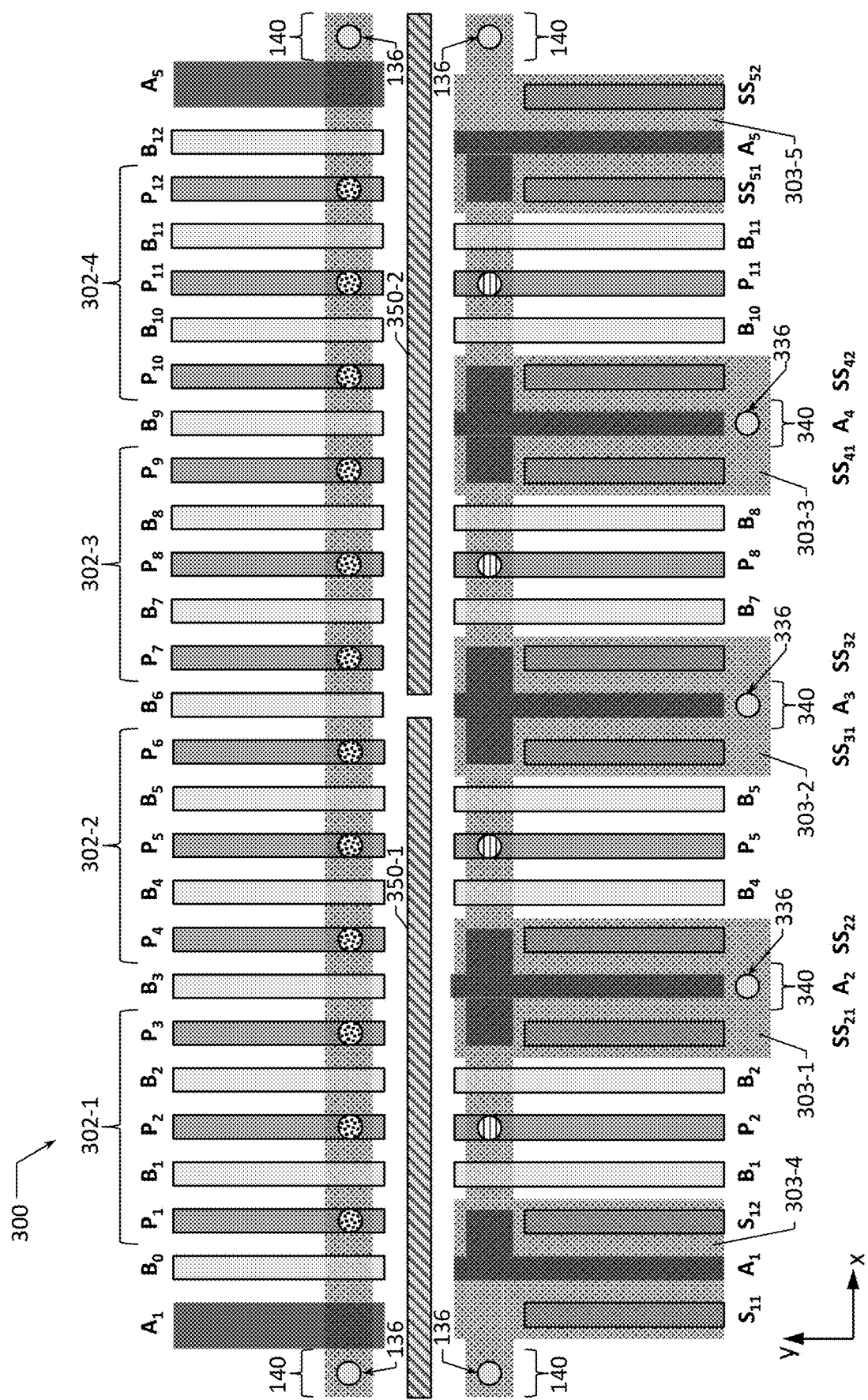

FIG. 23G illustrates an embodiment of the quantum dot device 300 similar to that shown in FIG. 23F, except that it illustrates a different arrangement of the outermost read accumulation gates $A_1$ and $A_5$. In particular, FIG. 23G illustrates that a pair of side screening gates may be provided for each of the two outermost read accumulation gates $A_1$ and $A_5$. Such additional side screening gates are shown in FIG. 23G as first and second side screening gates $S_{11}$ and $S_{12}$ provided on different sides of the read accumulation gate $A_1$, and as first and second side screening gates $S_{51}$ and $S_{52}$ provided on different sides of the read accumulation gate $A_5$. In some further embodiments, only one side screening gate may be implemented for any of the outermost read accumulation gates $A_1$ and $A_5$. In some embodiments, the read accumulation gate $A_1$ may be provided in a single trench 303-4 together with its associated first and/or second side screening gates $S_{11}$ and $S_{12}$, as shown in FIG. 23G. Similarly, in some embodiments, the read accumulation gate $A_5$ may be provided in a single trench 303-5 together with its associated first and/or second side screening gates $S_{51}$ and $S_{52}$, as also shown in FIG. 23G. The trenches 303-4 and 303-5 may be implemented similar to the other trenches 303, described above. Providing first and/or second side screening gates for one or both of the outermost read accumulation gates of the quantum dot device 300 may be particularly advantageous in terms of improved isolation of these read accumulation gates. Other descriptions provided with reference to FIG. 23F are applicable to the embodiment of FIG. 23G and, therefore, in the interest of brevity, are not repeated.

Figure 23H:
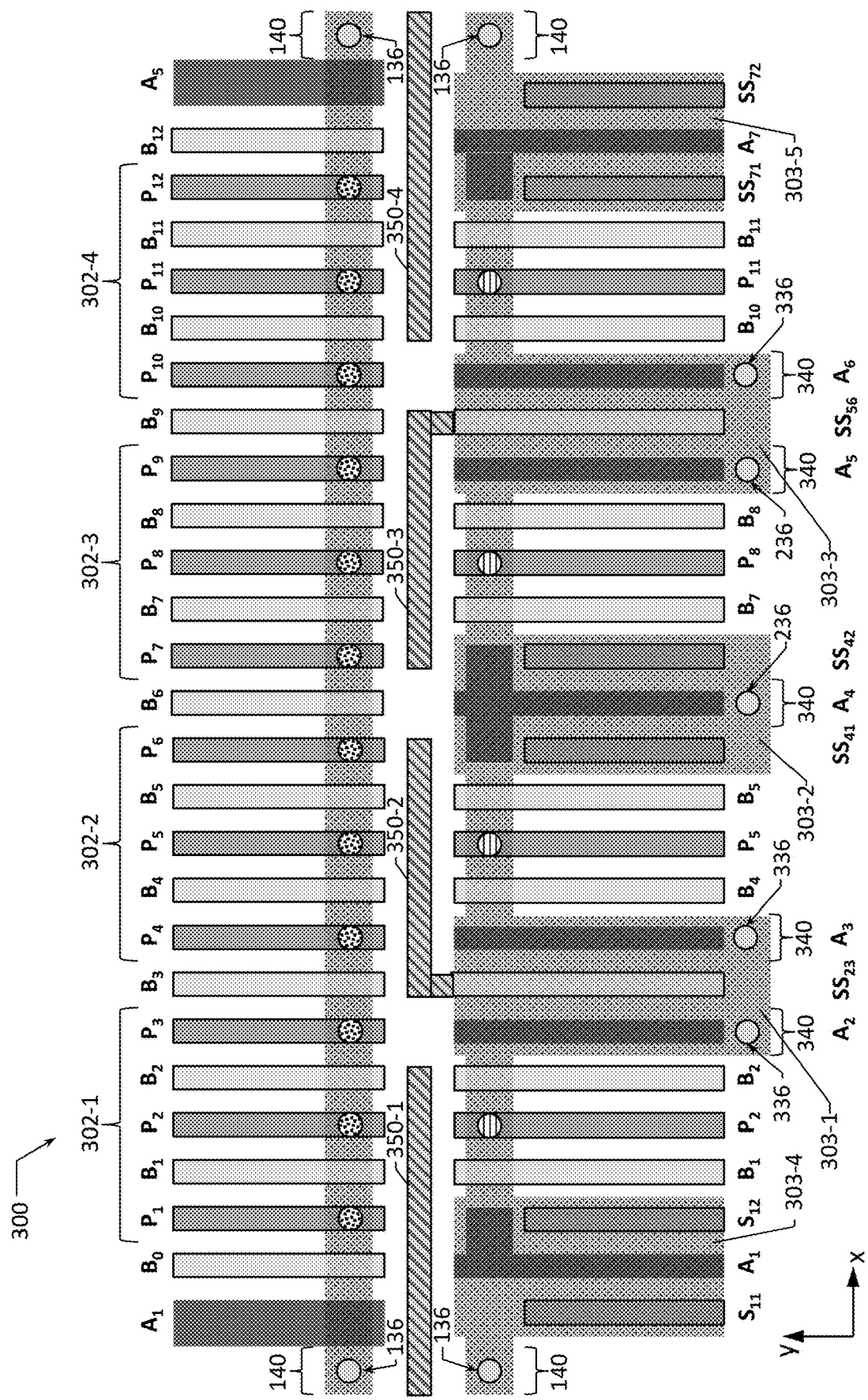

FIG. 23H illustrates an embodiment of the quantum dot device 300 similar to that shown in FIG. 23G, except that it illustrates more central screening gates 350 (four, in the example shown), where some of the central screening gates 350 are coupled to one of the side screening gates and where more additional read accumulation gates are provided. In particular, FIG. 23H illustrates a first SET with a first S/D terminal provided by the read accumulation gate $A_1$ and a second S/D terminal provided by the read accumulation gate $A_2$, and a second SET with a first S/D terminal provided by the read accumulation gate $A_3$ and a second S/D terminal provided by the read accumulation gate $A_4$. The first and second SETs may be electrically isolated from one another by the side screening gate $SS_{23}$, which may be coupled to (e.g., by being continuous with) one of the central screening gates, e.g., the central screening gate 350-2. Because the side screening gate $SS_{23}$ is coupled to the central screening gate 350-2, it may be used primarily for DC/microwave qubit control, whereas the side screening gate $SS_{12}$ may be used for electrical isolation (instead or in addition to the side screening gate $SS_{23}$). In this embodiment, two read accumulation gates, $A_2$ and $A_3$, may be implemented within a single trench 303-1, isolated from one another by the insulator material within the trench 303-1 and further decoupled from one another by the side screening gate $SS_{23}$. FIG. 23H further illustrates a third SET with a first S/D terminal provided by the read accumulation gate $A_4$ and a second S/D terminal provided by the read accumulation gate $A_5$. Thus, the read accumulation gate $A_4$ is a S/D terminal shared between the second and third SETs, similar to how it was described above, e.g., with reference to any one of the read accumulation gates $A_7$, $A_3$, or $A_4$ shown in FIG. 20A. FIG. 23H further illustrates a fourth SET with a first S/D terminal provided by the read accumulation gate $A_6$ and a second S/D terminal provided by the read accumulation gate $A_7$. The third and fourth SETs may be electrically isolated from one another by the side screening gate $SS_{56}$, which may be coupled to (e.g., by being continuous with) one of the central screening gates, e.g., the central screening gate 350-3. Because the side screening gate $SS_{56}$ is coupled to the central screening gate 350-3, it may be used primarily for DC/microwave qubit control, whereas the side screening gate $SS_{71}$ may be used for electrical isolation (instead or in addition to the side screening gate $SS_{56}$). In this embodiment, two read accumulation gates, $A_5$ and $A_6$, may be implemented within a single trench 303-3, isolated from one another by the insulator material within the trench 303-3 and further decoupled from one another by the side screening gate $SS_{56}$. Thus, similar to the designs illustrated in the previous drawings (e.g., in FIG. 20A or in FIG. 23G), the quantum dot device 300 of FIG. 23H illustrates an example with four separate SETs (e.g., with the read quantum dots 142 being under the read plunger gates $P_1$, $P_5$, $P_8$, and Pui, respectively, for each SET), but in contrast to the designs illustrated in the previous drawings, the quantum dot device 300 of FIG. 23H includes more read accumulation gates (a total of seven, as opposed to a total of five in the designs illustrated in the previous drawings), so that less read accumulation gates are shared between different SETs, thus enabling independent control of such gates. In some further embodiments of the quantum dot device 300, each of the multiple SETs as described herein may include its own pair of the read accumulation gates, not having any read accumulation gates shared with any other SETs. Other descriptions provided with reference to FIG. 23G are applicable to the embodiment of FIG. 23H and, therefore, in the interest of brevity, are not repeated.

Figure 23I:
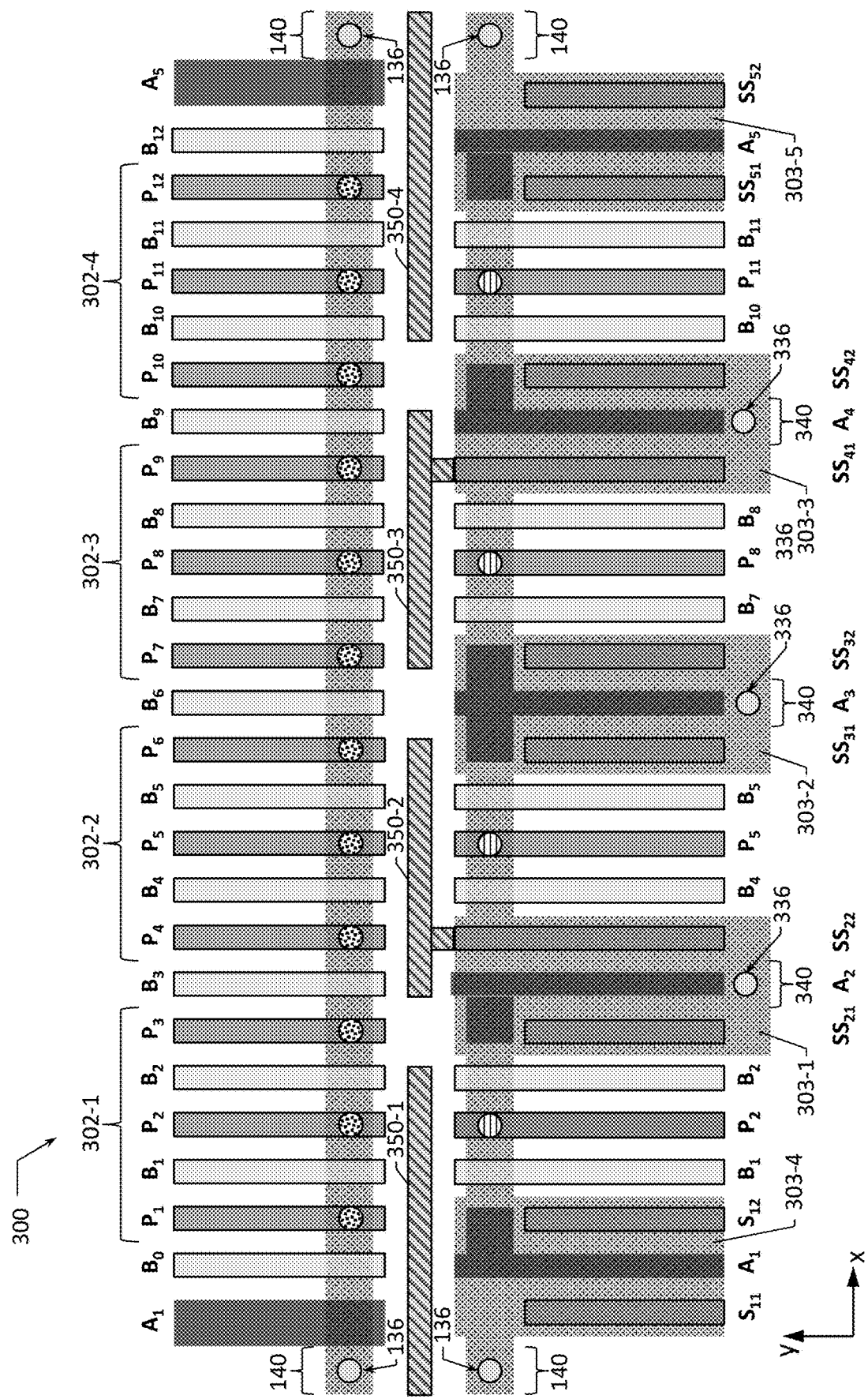

FIG. 23I illustrates an embodiment of the quantum dot device 300 that is also (like the device of FIG. 23H) similar to that shown in FIG. 23G, except that it illustrates more central screening gates 350 (four, in the example shown), where some of the central screening gates 350 are coupled to one of the side screening gates. In particular, FIG. 23I illustrates an embodiment where the central screening gate 350-2 is coupled to the side screening gate $S_{22}$, and the central screening gate 350-3 is coupled to the side screening gate $S_{41}$. Thus, compared to the embodiment of FIG. 23H, in the embodiment of FIG. 23I there are less read accumulation gates and more isolation side screening gates.

Figure 23J:
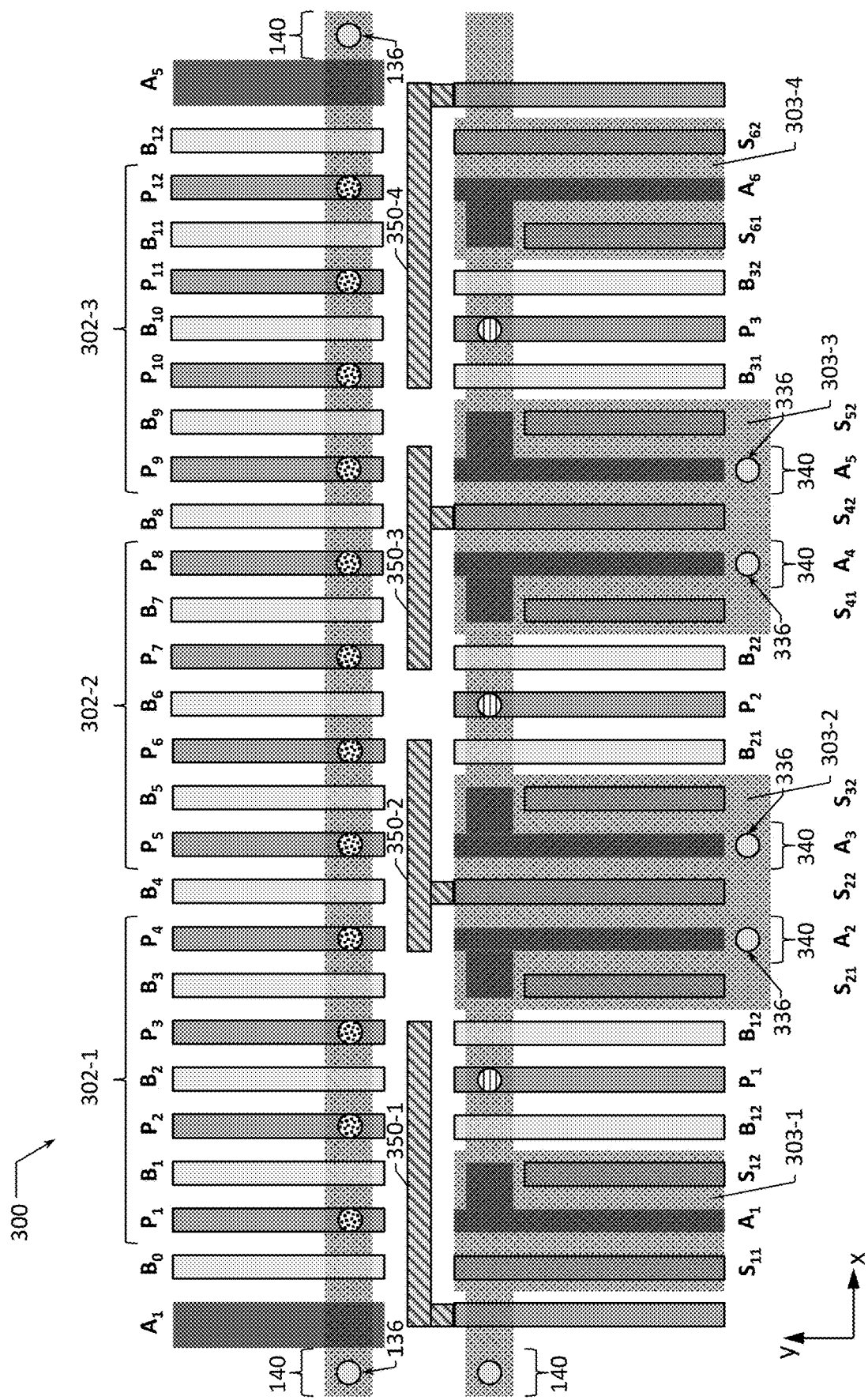

FIG. 23J illustrates an embodiment of the quantum dot device 300 where the read plunger gates are arranged not directly opposite corresponding active plunger gates, but with an offset. As a result, each read plunger gate may be configured to sense the states of more active quantum dots 142, e.g., of four active qubits as shown in the example of FIG. 23J. This means that, compared to other designs of the present drawings, the quantum dot device 300 includes less separate SETs, but each SET is arranged to read the states of more active quantum dots 142. In particular, FIG. 23J illustrates a first SET with a first S/D terminal provided by the read accumulation gate $A_1$ and a second S/D terminal provided by the read accumulation gate $A_2$, a second SET with a first S/D terminal provided by the read accumulation gate $A_3$ and a second S/D terminal provided by the read accumulation gate $A_4$, and a third SET with a first S/D terminal provided by the read accumulation gate $A_5$ and a second S/D terminal provided by the read accumulation gate $A_6$. Each of the different adjacent SETs of the embodiment shown in FIG. 23J may be electrically isolated from one another by a respective side screening gate coupled to a corresponding central screening gate. For example, the first and second SETs are electrically isolated from one another by the side screening gate $SS_{22}$, which may be coupled to (e.g., by being continuous with) one of the central screening gates, e.g., the central screening gate 350-2, the second and third SETs are electrically isolated from one another by the side screening gate $SS_{42}$, which may be coupled to (e.g., by being continuous with) one of the central screening gates, e.g., the central screening gate 350-3, and so on. In some embodiments, each of the side screening gate $SS_{22}$ and $SS_{42}$ may be used primarily for DC/microwave qubit control, whereas the gates used for independent electrical isolation between the first and second SETs may be the side screening gates $SS_{21}$ and $SS_{32}$ and the gates used for independent electrical isolation between the second and third SETs may be the side screening gates $SS_{41}$ and $SS_{52}$. In the embodiment of FIG. 23J, the quantum dot 142 of the first SET (i.e., the quantum dot 142 under the read plunger gate $P_1$ in the illustration of FIG. 23J) may be used as a read quantum dot for a group 302-1 of a plurality of active quantum dots that may include, e.g., four quantum dots under, respectively, active plunger gates $P_1$, $P_2$, $P_3$, and $P_4$. Similarly, the quantum dot 142 of the second SET (i.e., the quantum dot 142 under the read plunger gate $P_2$ in the illustration of FIG. 23J) may be used as a read quantum dot for a group 302-2 of a plurality of active quantum dots that may include, e.g., four quantum dots under, respectively, active plunger gates $P_5$, $P_6$, $P_7$, and $P_8$. The quantum dot 142 of the third SET (i.e., the quantum dot 142 under the read plunger gate $P_3$ in the illustration of FIG. 23J) may be used as a read quantum dot for a group 302-3 of a plurality of active quantum dots that may include, e.g., four quantum dots under, respectively, active plunger gates $P_9$, $P_{10}$, $P_{11}$, and $P_{12}$. Other components shown in FIG. 23J are self-explanatory as they are illustrated in the same manner as analogous components in other drawings (e.g., various trenches 303).

Figure 23K:
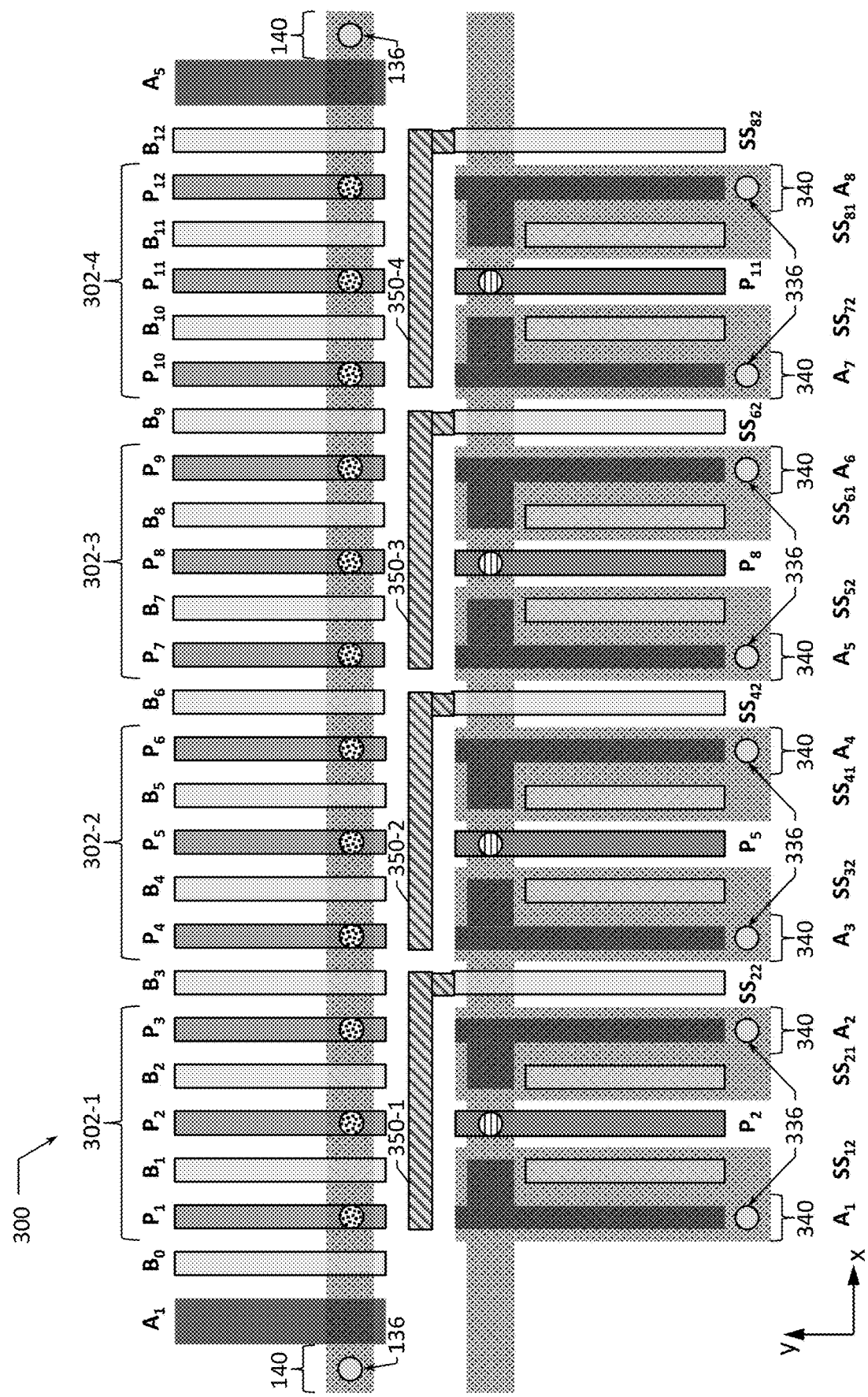

FIG. 23K illustrates an embodiment of the quantum dot device 300 that is also (like the device of FIG. 23H) similar to that shown in FIG. 23G, except that it illustrates more central screening gates 350 (four, in the example shown), where each of the central screening gates 350 is coupled to a different one of the side screening gates. In particular, FIG. 23K illustrates a first SET with a read quantum dot 142 to be formed under the read plunger gate $P_2$ and with a first S/D terminal provided by the read accumulation gate $A_1$ and a second S/D terminal provided by the read accumulation gate $A_2$, a second SET with a read quantum dot 142 to be formed under the read plunger gate $P_5$ and with a first S/D terminal provided by the read accumulation gate $A_3$ and a second S/D terminal provided by the read accumulation gate $A_4$, a third SET with a read quantum dot 142 to be formed under the read plunger gate $P_8$ and with a first S/D terminal provided by the read accumulation gate $A_5$ and a second S/D terminal provided by the read accumulation gate $A_6$, and a fourth SET with a read quantum dot 142 to be formed under the read plunger gate $P_{11}$ and with a first S/D terminal provided by the read accumulation gate $A_7$ and a second S/D terminal provided by the read accumulation gate $A_8$. The first and second SETs may be electrically isolated from one another by the side screening gate $SS_{22}$, which may be coupled to (e.g., by being continuous with) one of the central screening gates, e.g., the central screening gate 350-1. The second and third SETs may be electrically isolated from one another by the side screening gate $SS_{42}$, which may be coupled to (e.g., by being continuous with) one of the central screening gates, e.g., the central screening gate 350-2. The third and fourth SETs may be electrically isolated from one another by the side screening gate $SS_{62}$, which may be coupled to (e.g., by being continuous with) one of the central screening gates, e.g., the central screening gate 350-3. The fourth SET may be electrically isolated from further SETs (not shown in FIG. 23K) by the side screening gate $SS_{82}$, which may be coupled to (e.g., by being continuous with) one of the central screening gates, e.g., the central screening gate 350-4. In the embodiments where no further SETs are included, the side screening gate $SS_{82}$ may be absent. In the embodiment of FIG. 23K, the side screening gates $SS_{22}$, $SS_{42}$, $SS_{62}$, and $SS_{82}$ may be used primarily for DC/microwave qubit control. On the other hand, one or both of the side screening gates $SS_{12}$ and $SS_{21}$ may be used for electrical isolation of the first SET (instead or in addition to the side screening gate $SS_{22}$), one or both of the side screening gates $SS_{32}$ and $SS_{41}$ may be used for electrical isolation of the second SET (instead or in addition to the side screening gates $SS_{22}$ and $SS_{42}$), one or both of the side screening gates $SS_{52}$ and $SS_{61}$ may be used for electrical isolation of the third SET (instead or in addition to the side screening gates $SS_{42}$ and $SS_{62}$), and one or both of the side screening gates $SS_{22}$ and $SS_{81}$ may be used for electrical isolation of the fourth SET (instead or in addition to the side screening gates $SS_{62}$ and $SS_{82}$). Trenches 303 are indicated in FIG. 23K with the patterns used to show these trenches in other drawings. In such a manner, four independently controlled central screening gates 350 may be used with four respective SETs. Read barrier gates may be absent (replaced by additional read accumulation gates and side screening gates as described).

Other embodiments of the quantum dot device 300 with different arrangements of additional read accumulation gates and side and center screening gates in accordance with considerations described herein are possible and are within the scope of the present disclosure. The exact arrangement of additional read accumulation gates and side and center screening gates may be selected for a particular design of a quantum dot device 300 based on considerations such as fabrication processes required to fabricate the device, the desired isolation between various gates, the desired control of the electrostatics in the device, complexity of routing signals to various gates, the desired accuracy of reading the states of different active quantum dots 142, etc.

Example Devices and Systems

Quantum dot devices with additional read accumulation gates and with side and center screening gates as described above may be implemented using any kind of qubit devices or be included in any kind of quantum processing devices/structures. Some examples of such devices/structures are illustrated in FIGS. 24A-24B, 25, and 26.

Figure 24B:
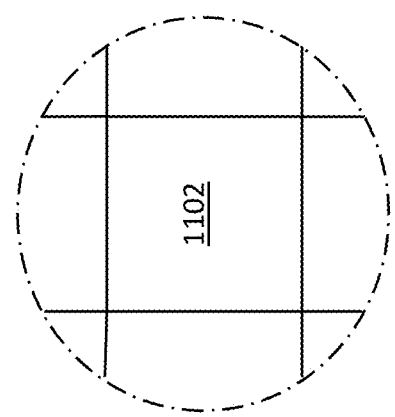
FIGS. 24A and 24B are top-down views of a wafer and dies that may include one or more of quantum dot devices disclosed herein.
Figure 24A:
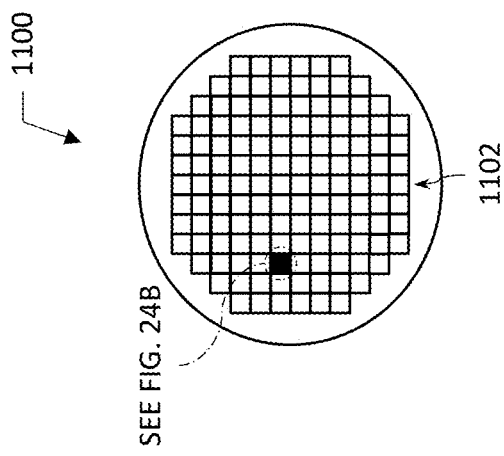

FIGS. 24A-24B are top views of a wafer 1100 and dies 1102 that may be formed from the wafer 1100, according to some embodiments of the present disclosure. Dies 1102 may include any of the quantum dot devices with additional read accumulation gates and with side and center screening gates disclosed herein, e.g., the quantum dot devices 300 with additional read accumulation gates and with side and center screening gates, any further embodiments of such quantum dot devices as described herein, or any combinations of such quantum dot devices. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component. In some embodiments, the wafer 1100 or the die 1102 may include a memory device (e.g., a static random-access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 26) or other logic that is configured to store information in the memory devices or execute instructions stored in the memory array.

Figure 25:
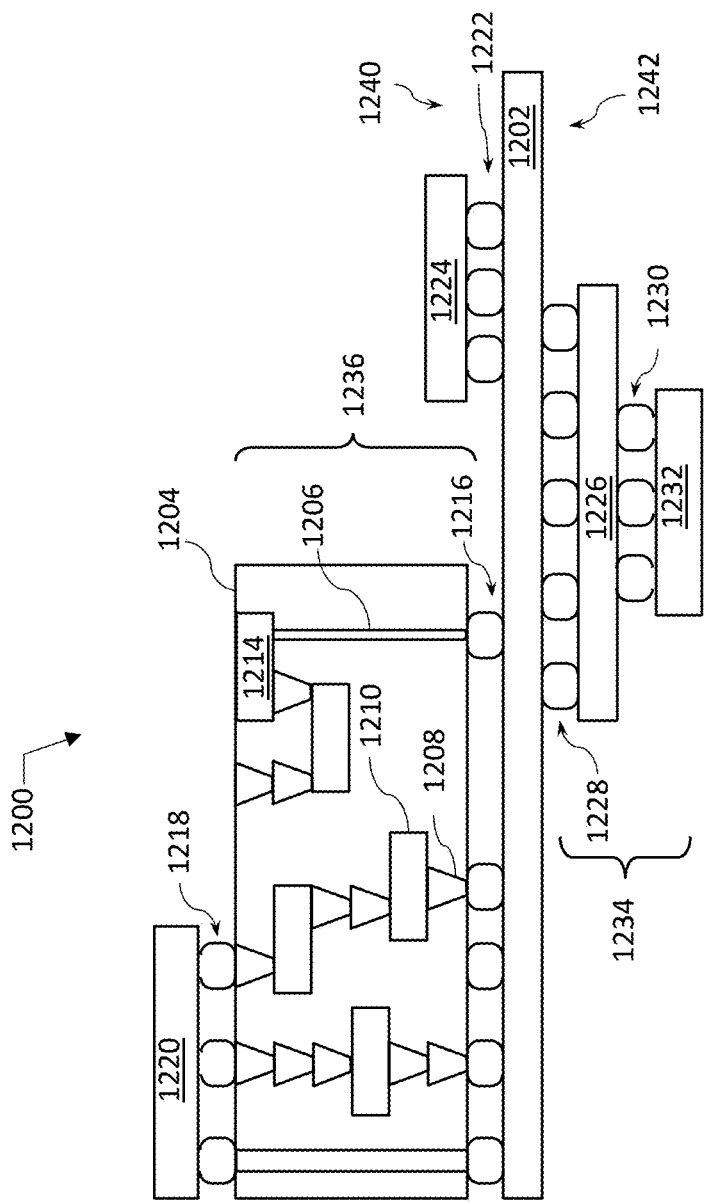
FIG. 25 is a cross-sectional side view of a device assembly that may include one or more of quantum dot devices disclosed herein.

FIG. 25 is a cross-sectional side view of a device assembly 1200 that may include any of the embodiments of the quantum dot devices with side and center screening gates as disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 25 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 25), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 25, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g., a package including any of the quantum dot devices with additional read accumulation gates and with side and center screening gates as described herein; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 25, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any quantum dot devices with additional read accumulation gates and with side and center screening gates disclosed herein; or may be a conventional IC package, for example.

The device assembly 1200 illustrated in FIG. 25 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

Figure 26:
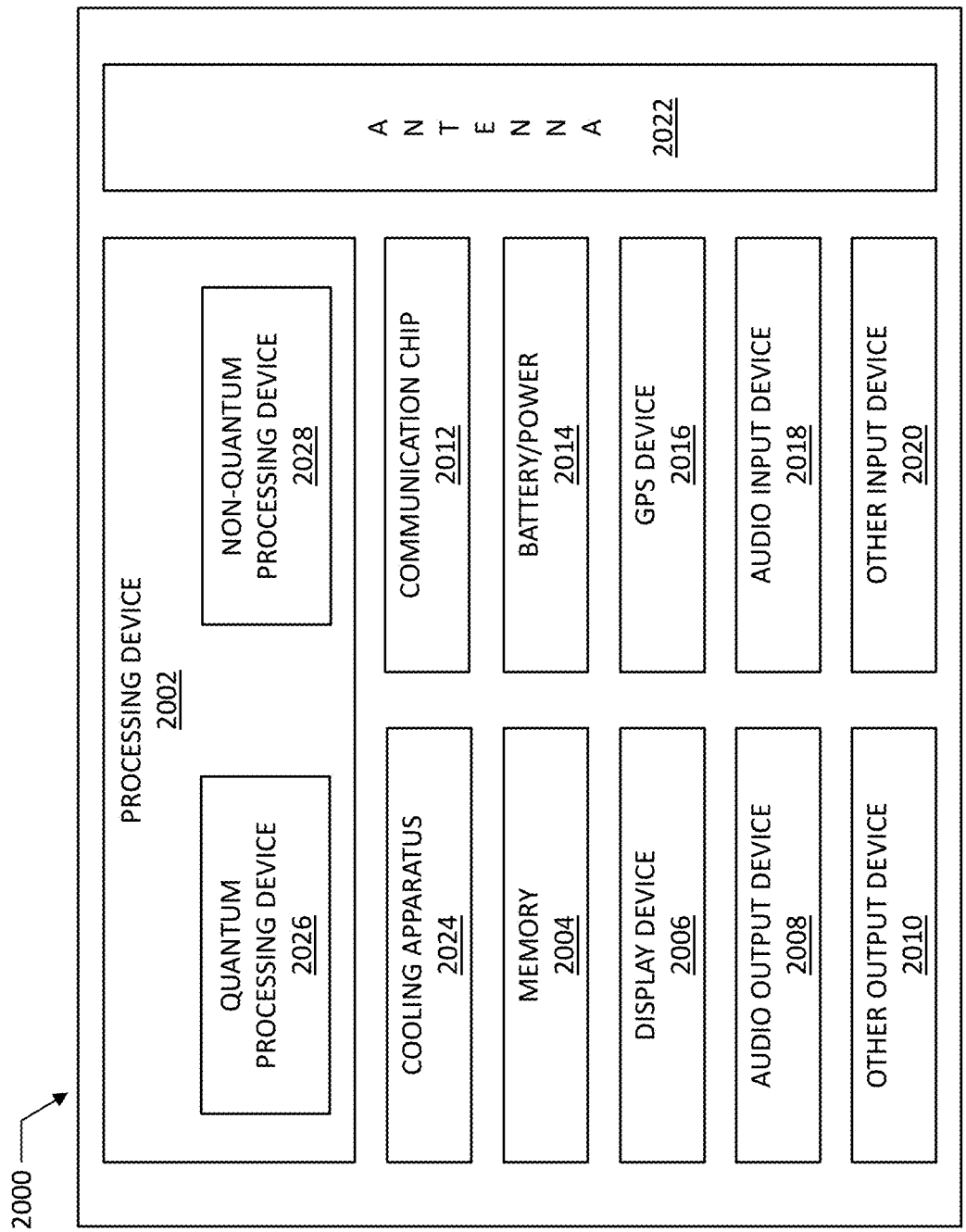
FIG. 26 is a block diagram of an example quantum computing device that may include one or more of quantum dot devices disclosed herein, in accordance with various embodiments.

FIG. 26 is a block diagram of an example quantum computing device 2000 that may include any of the quantum dot devices with additional read accumulation gates and with side and center screening gates as disclosed herein, or any combinations of such quantum dot devices. Several components are illustrated in FIG. 26 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum dot devices with additional read accumulation gates and with side and center screening gates as described herein. In some embodiments, various ones of these components may be fabricated onto a single system-on-a-chip (SoC) die. Additionally, in various embodiments, the quantum computing device 2000 may not include one or more of the components illustrated in FIG. 26, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030 and may instead operate at room temperature.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the quantum dot devices with additional read accumulation gates and with side and center screening gates as disclosed herein, and may perform data processing by performing operations on the qubits that may be generated in the quantum dot devices 300, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random-access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random-access memory (eDRAM) or spin transfer torque magnetic random-access memory (STT-M RAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide examples of various ones of the embodiments disclosed herein.

Example A1 provides a quantum dot device that includes a quantum well stack structure, including a row of a quantum dot formation region; and a plurality of gates extending to the row (e.g., extending substantially perpendicular to the row), where the plurality of gates include a first gate electrically coupled to (e.g., adjacent to) a first doped region (e.g., a gate $A_1$ adjacent to a first doped region 140), a second gate electrically coupled to (e.g., adjacent to) a second doped region (e.g., a gate $A_5$ adjacent to a second doped region 140), and a third gate electrically coupled to (e.g., adjacent to) a third doped region (e.g., a gate $A_2$ adjacent to a doped region 340), the third gate being between the first gate and the second gate.

Example A2 provides the quantum dot device according to example A1, where individual gates of the plurality of gates are electrically insulated from one another.

Example A3 provides the quantum dot device according to any one of the preceding examples, where a projection of a gate metal of an individual one (e.g., each) of the plurality of gates on a plane that includes at least a portion of the row is substantially perpendicular to the portion of the row.

Example A4 provides the quantum dot device according to any one of examples $A_1$-3, where the quantum well stack structure includes a continuous quantum well stack that includes the row of the quantum dot formation region, the quantum dot device further includes an insulating material over the continuous quantum well stack, the insulating material includes a trench corresponding to the row, and the trench extends toward the continuous quantum well stack.

Example A5 provides the quantum dot device according to example A4, where a portion of a gate metal of individual ones of the plurality of gates is at least partially in the trench.

Example A6 provides the quantum dot device according to example A5, where a gate dielectric is at a bottom of the trench between the gate metal and the continuous quantum well stack.

Example A7 provides the quantum dot device according to any one of examples A4-6, where the trench is a first trench, the insulating material further includes a second trench, the second trench extends toward the continuous quantum well stack, the second trench intersects the first trench, and a gate metal of the third gate has a first portion that is at least partially in the first trench and has a second portion that is at least partially in the second trench.

Example A8 provides the quantum dot device according to example A7, where a gate dielectric is at a bottom of the second trench between the gate metal of the third gate and the continuous quantum well stack.

Example A9 provides the quantum dot device according to any one of examples A7-8, where the gate metal of the first portion is continuous with the gate metal of the second portion where the second trench intersects the first trench.

Example A10 provides the quantum dot device according to any one of examples A7-9, where, in a cross-section of the quantum dot device along the first trench, a portion of the continuous quantum well stack under the first gate is in contact with the first doped region, and a portion of the continuous quantum well stack under the second gate is in contact with the second doped region, and, in a cross-section of the quantum dot device along the second trench, a portion of the continuous quantum well stack under the third gate is in contact with the third doped region.

Example A11 provides the quantum dot device according to any one of examples A7-10, where the second trench is substantially perpendicular to the first trench, and each of the first trench and the second trench is substantially parallel to a support structure (e.g., a substrate or a die), where the continuous quantum well stack is provided over the support structure.

Example A12 provides the quantum dot device according to any one of examples A7-11, where the quantum dot device further includes a side screening gate in the second trench, and the side screening gate extends along a side of the gate metal of the third gate in the second trench and is electrically insulated from the plurality of gates.

Example A13 provides the quantum dot device according to example A12, where a distance between the side screening gate and the gate metal of the third gate in the second trench is between about 5 and 100 nanometers, including all values and ranges therein, e.g., between about 5 and 50 nm, or between about 10 and 30 nm.

Example A14 provides the quantum dot device according to any one of examples A12-13, further including a further insulating material in the second trench between the gate metal of the third gate and an electrically conductive material of the side screening gate.

Example A15 provides the quantum dot device according to any one of examples A12-14, where the side screening gate is a first side screening gate, the side of the gate metal of the third gate in the second trench is a first side of the gate metal of the third gate in the second trench, the quantum dot device further includes a second side screening gate in the second trench, and the second side screening gate extends along a second side of the gate metal of the third gate in the second trench and is electrically insulated from the plurality of gates and from the first side screening gate.

Example A16 provides the quantum dot device according to example A15, where a distance between the second side screening gate and the gate metal of the third gate in the second trench is between about 5 and 100 nanometers, including all values and ranges therein, e.g., between about 5 and 50 nm, or between about 10 and 30 nm.

Example A17 provides the quantum dot device according to any one of examples A15-16, further including a further insulating material in the second trench between the gate metal of the third gate and an electrically conductive material of the second side screening gate.

Example A18 provides the quantum dot device according to any one of examples A4-17, where the trench has a tapered profile that is narrowest proximate to the quantum well stack.

Example A19 provides the quantum dot device according to any one of examples A4-17, where the quantum dot device further includes a center screening gate extending over a portion of the quantum dot device, and projections of the row and the center screening gate onto a plane parallel to a support structure are substantially parallel, where the continuous quantum well stack structure is provided over the support structure.

Example A20 provides the quantum dot device according to example A19, where the center screening gate is one of a plurality of center screening gates, and projections of the row and the plurality of the center screening gates onto the plane parallel to the support structure are substantially parallel.

Example A21 provides the quantum dot device according to any one of examples A19-20, where the trench is a first trench, the insulating material further includes a second trench, the second trench extends toward the continuous quantum well stack, and at least a portion of a gate metal of the center screening gate is at least partially in the second trench.

Example A22 provides the quantum dot device according to example A21, where a second gate dielectric is at a bottom of the second trench between the gate metal of the center screening gate and the continuous quantum well stack.

Example A23 provides the quantum dot device according to any one of examples A1-3, where the quantum well stack structure includes a first fin corresponding to the row, and a second fin corresponding to the third gate, each of the first fin and the second fin includes a quantum well stack, the second fin intersects the first fin, a gate metal of the third gate has a first portion that is over a portion of the first fin and has a second portion that is over a portion of the second fin, and the quantum dot device further includes an insulating material at least partially enclosing sidewalls of the first fin and the second fin.

Example A24 provides the quantum dot device according to example A23, where a gate dielectric is between the first portion of the gate metal of the third gate and the first fin and between the second portion of the gate metal of the third gate and the second fin.

Example A25 provides the quantum dot device according to any one of examples A23-24, where the gate metal of the first portion is continuous with the gate metal of the second portion where the second fin intersects the first fin.

Example A26 provides the quantum dot device according to any one of examples A23-25, where, in a cross-section of the quantum dot device along the first fin, a portion of the quantum well stack under the first gate is in contact with the first doped region, and a portion of the quantum well stack under the second gate is in contact with the second doped region, and, in a cross-section of the quantum dot device along the second fin, a portion of the quantum well stack under the third gate is in contact with the third doped region.

Example A27 provides the quantum dot device according to any one of examples A23-26, where the second fin is substantially perpendicular to the first fin, and each of the first fin and the second fin is substantially parallel to a support structure (e.g., a substrate or a die), where the quantum well stack is provided over the support structure.

Example A28 provides the quantum dot device according to any one of examples A23-27, where the quantum dot device further includes a side screening gate over the second fin, and the side screening gate extends along a side of the gate metal of the third gate over the second fin and is electrically insulated from the plurality of gates.

Example A29 provides the quantum dot device according to example A28, further including a further insulating material over the second fin between the gate metal of the third gate and an electrically conductive material of the side screening gate.

Example A30 provides the quantum dot device according to any one of examples A28-29, where the side screening gate is a first side screening gate, the side of the gate metal of the third gate over the second fin is a first side of the gate metal of the third gate over the second fin, the quantum dot device further includes a second side screening gate over the second fin, and the second side screening gate extends along a second side of the gate metal of the third gate over the second fin and is electrically insulated from the plurality of gates and from the first side screening gate.

Example A31 provides the quantum dot device according to example A30, further including a further insulating material over the second fin between the gate metal of the third gate and an electrically conductive material of the second side screening gate.

Example B1 provides a quantum dot device that includes a quantum well stack structure, including a first row and a second row of quantum dot formation regions, the second row being substantially parallel to the first row; a first plurality of gates extending over the first row (e.g., extending substantially perpendicular to the first row); a second plurality of gates extending over the second row (e.g., extending substantially perpendicular to the second row); and a center screening gate extending over a portion of the quantum dot device between the first row and the second row.

Example B2 provides the quantum dot device according to example B1, where individual gates of the first plurality of gates are electrically insulated from one another, individual gates of the second plurality of gates are electrically insulated from one another, the individual gates of the first plurality of gates are electrically insulated from the individual gates of the second plurality of gates, and the center screening gate is electrically insulated from the individual gates of the first plurality of gates.

Example B3 provides the quantum dot device according to example B2, where the center screening gate is electrically insulated from the individual gates of the second plurality of gates.

Example B4 provides the quantum dot device according to example B2, where the center screening gate is electrically continuous with (i.e., not electrically insulated from) one gate of the second plurality of gates.

Example B5 provides the quantum dot device according to any one of the preceding examples B, where projections of the first row, the second row, and the center screening gate onto a plane parallel to a support structure are substantially parallel, where the quantum well stack structure is provided over the support structure.

Example B6 provides the quantum dot device according to any one of the preceding examples B, where the center screening gate is one of a plurality of center screening gates extending over portions of the quantum dot device between the first row and the second row.

Example B7 provides the quantum dot device according to any one of examples B1-6, where the quantum well stack structure includes a continuous quantum well stack that includes the row of the quantum dot formation region, the quantum dot device further includes an insulating material over the continuous quantum well stack, the insulating material includes a first trench corresponding to the first row and a second trench corresponding to the second row, and individual ones of the first trench and the second trench extend toward the continuous quantum well stack.

Example B8 provides the quantum dot device according to example B7, where a portion of a first gate metal of individual ones of the first plurality of gates is at least partially in the first trench, and a portion of a second gate metal of individual ones of the second plurality of gates is at least partially in the second trench.

Example B9 provides the quantum dot device according to example B8, where a first gate dielectric is at a bottom of the first trench between the first gate metal and the continuous quantum well stack, and a second gate dielectric is at a bottom of the second trench between the second gate metal and the continuous quantum well stack.

Example B10 provides the quantum dot device according to any one of examples B7-9, where the insulating material further includes a third trench, the third trench extends toward the continuous quantum well stack, and at least a portion of a gate metal of the center screening gate is at least partially in the third trench.

Example B11 provides the quantum dot device according to example B10, where a third gate dielectric is at a bottom of the third trench between the gate metal of the center screening gate and the continuous quantum well stack.

Example B12 provides the quantum dot device according to any one of examples B10-11, where the third trench is between the first trench and the second trench.

Example B13 provides the quantum dot device according to any one of examples B10-12, where the third trench is substantially parallel to the first trench and the second trench.

Example C1 provides a quantum computing device that includes a quantum processing device, where the quantum processing device includes a quantum dot device according to any one of the preceding examples; a non-quantum processing device, coupled to the quantum processing device, to control voltages applied to a plurality of gates of the quantum processing device; and a memory device to store data generated during operation of the quantum processing device.

Example C2 provides the quantum computing device according to example C1, further including a cooling apparatus configured to maintain the temperature of the quantum processing device below 5 degrees Kelvin.

Example C3 provides the quantum computing device according to examples C1 or C2, where the memory device is configured to store instructions for a quantum computing algorithm to be executed by the quantum processing device.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum dot device, comprising:
   a quantum well stack structure comprising a quantum well stack that includes a quantum dot formation region;
   a plurality of gates extending to the quantum dot formation region, wherein the plurality of gates includes a first gate coupled to a first doped region, a second gate coupled to a second doped region, and a third gate coupled to a third doped region, the third gate being between the first gate and the second gate; and
   an insulating material over the quantum well stack, the insulating material comprising a first trench extending toward the quantum well stack and a second trench extending toward the quantum well stack, wherein the second trench intersects the first trench, and wherein a gate metal of the third gate has a first portion that is at least partially in the first trench and has a second portion that is at least partially in the second trench.

2. The quantum dot device according to claim 1, wherein individual gates of the plurality of gates are electrically insulated from one another.

3. The quantum dot device according to claim 1, wherein the quantum dot formation region is a row, and wherein a projection of a gate metal of an individual one of the plurality of gates on a plane that includes at least a portion of the row is substantially perpendicular to the portion of the row.

4. The quantum dot device according to claim 1, wherein the first portion of the gate metal of the third gate is continuous with the second portion of the gate metal of the third gate.

5. The quantum dot device according to claim 1, wherein:
   in a cross-section of the quantum dot device along the first trench, a portion of the quantum well stack under the first gate is in contact with the first doped region, and a portion of the continuous quantum well stack under the second gate is in contact with the second doped region, and
   in a cross-section of the quantum dot device along the second trench, a portion of the quantum well stack under the third gate is in contact with the third doped region.

6. The quantum dot device according to claim 1, wherein the quantum well stack is over a support structure, the second trench is substantially perpendicular to the first trench, and the second trench is substantially parallel to the support structure.

7. The quantum dot device according to claim 1, wherein:
   the quantum dot device further includes a side screening gate in the second trench, and the side screening gate extends along a side of the gate metal of the third gate in the second trench and is electrically insulated from the plurality of gates.

8. The quantum dot device according to claim 7, wherein:
   the side screening gate is a first side screening gate,
   the side of the gate metal of the third gate in the second trench is a first side of the gate metal of the third gate in the second trench,
   the quantum dot device further includes a second side screening gate in the second trench, and
   the second side screening gate extends along a second side of the gate metal of the third gate in the second trench and is electrically insulated from the plurality of gates and from the first side screening gate.

9. The quantum dot device according to claim 1, wherein:
the quantum dot device further includes a center screening gate extending over a portion of the quantum dot device,
the quantum dot formation region is a row, and
projections of the row and the center screening gate onto a plane parallel to a support structure are substantially parallel, wherein the quantum well stack is over the support structure.

10. The quantum dot device according to claim 9, wherein:
the center screening gate is one of a plurality of center screening gates, and
projections of the row and the plurality of the center screening gates onto the plane parallel to the support structure are substantially parallel.

11. The quantum dot device according to claim 1, comprising:
a quantum processing device, wherein the quantum processing device includes the quantum well stack structure, the plurality of gates, and the insulating material;
a non-quantum processing device, coupled to the quantum processing device, to control voltages applied to the plurality of gates of the quantum processing device; and
a memory device to store data generated during operation of the quantum processing device.

12. The quantum dot device according to claim 11, further comprising a cooling apparatus to maintain a temperature of the quantum processing device below 5 degrees Kelvin.

13. A method of fabricating a quantum dot device, the method comprising:
providing a quantum well stack structure comprising a quantum well stack that includes a quantum dot formation region;
providing a plurality of gates extending to the quantum dot formation region, wherein the plurality of gates includes a first gate coupled to a first doped region, a second gate coupled to a second doped region, and a third gate coupled to a third doped region, the third gate being between the first gate and the second gate; and
providing an insulating material over the quantum well stack, the insulating material comprising a first trench extending toward the quantum well stack and a second trench extending toward the quantum well stack, wherein the second trench intersects the first trench, and wherein a gate metal of the third gate has a first portion that is at least partially in the first trench and has a second portion that is at least partially in the second trench.

14. The method according to claim 13, wherein individual gates of the plurality of gates are electrically insulated from one another.

15. The method according to claim 13, wherein the quantum dot formation region is a row, and wherein a projection of a gate metal of an individual one of the plurality of gates on a plane that includes at least a portion of the row is substantially perpendicular to the portion of the row.

16. The method according to claim 13, wherein the first portion of the gate metal of the third gate is continuous with the second portion of the gate metal of the third gate.

17. The method according to claim 13, wherein:
in a cross-section of the quantum dot device along the first trench, a portion of the quantum well stack under the first gate is in contact with the first doped region, and a portion of the continuous quantum well stack under the second gate is in contact with the second doped region, and
in a cross-section of the quantum dot device along the second trench, a portion of the quantum well stack under the third gate is in contact with the third doped region.

18. The method according to claim 13, wherein the quantum well stack is over a support structure, the second trench is substantially perpendicular to the first trench, and the second trench is substantially parallel to the support structure.

19. The method according to claim 13, further comprising:
providing a side screening gate in the second trench,
wherein the side screening gate extends along a side of the gate metal of the third gate in the second trench and is electrically insulated from the plurality of gates.

20. The method according to claim 13, further comprising:
providing a center screening gate extending over a portion of the quantum dot device,
wherein the quantum dot formation region is a row, projections of the row and the center screening gate onto a plane parallel to a support structure are substantially parallel, and the quantum well stack is over the support structure.

* * * * *

UNITED STATES PATENT AND TRADEMARK OFFICE
CERTIFICATE OF CORRECTION

PATENT NO. : 11,922,274 B1  
APPLICATION NO. : 17/323487  
DATED : March 5, 2024  
INVENTOR(S) : Hubert C. George et al.

Page 1 of 1

It is certified that error appears in the above-identified patent and that said Letters Patent is hereby corrected as shown below:

On the Title Page

In Item (57), under "ABSTRACT", in Column 2, Line 1, delete "three of" and insert -- three or --, therefor.

On Page 2, in Item (56), under "Other Publications", in Column 2, Line 13, delete ""Ultafast"" and insert -- "Ultrafast" --, therefor.

On Page 2, in Item (56), under "Other Publications", in Column 2, Line 25, delete "Warwich," and insert -- Warwick, --, therefor.

Signed and Sealed this  
Twenty-fourth Day of September, 2024

Katherine Kelly Vidal  
*Director of the United States Patent and Trademark Office*